US009123751B2

(12) United States Patent
Ito et al.

(10) Patent No.: US 9,123,751 B2
(45) Date of Patent: Sep. 1, 2015

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Shunichi Ito, Atsugi (JP); Miyuki Hosoba, Isehara (JP); Hideomi Suzawa, Atsugi (JP); Shinya Sasagawa, Chigasaki (JP); Taiga Muraoka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/287,494

(22) Filed: May 27, 2014

(65) Prior Publication Data
US 2014/0273343 A1    Sep. 18, 2014

Related U.S. Application Data

(62) Division of application No. 12/582,079, filed on Oct. 20, 2009, now Pat. No. 8,741,702.

(30) Foreign Application Priority Data

Oct. 24, 2008  (JP) ................... 2008-274520

(51) Int. Cl.
*H01L 21/00* (2006.01)
*H01L 21/84* (2006.01)
(Continued)

(52) U.S. Cl.
CPC ...... *H01L 29/66969* (2013.01); *H01L 27/1214* (2013.01); *H01L 27/1225* (2013.01); *H01L 27/1288* (2013.01); *H01L 29/7869* (2013.01)

(58) Field of Classification Search
CPC .................. H01L 21/02126; H01L 21/31683; H01L 21/02252; H01L 21/048; H01L 21/0262; H01L 21/67063; H01L 21/67069; H01L 27/3248; H01L 29/6603

USPC ............. 438/149, 159, 187, 9, 474, 267, 513, 438/680, 706, 745, 733, 257, 507, 602, 438/608; 257/E21.006, E21.051, E21.053, 257/E21.077, E21.17, E21.227, E21.245, 257/E21.267, E21.311, E21.352
See application file for complete search history.

(56) References Cited

U.S. PATENT DOCUMENTS 5,256,897 A   10/1993  Hasegawa et al.
5,338,959 A    8/1994  Kim et al.
(Continued)

FOREIGN PATENT DOCUMENTS

CN   101246909 A    8/2008
CN   101283388 A   10/2008
(Continued)

OTHER PUBLICATIONS

Chinese Office Action (Application No. 201210332037.5) Dated Oct. 20, 2014.
(Continued)

*Primary Examiner* — David Nhu Dn
(74) *Attorney, Agent, or Firm* — Eric J. Robinson; Robinson Intellectual Property Law Office, P.C.

(57) ABSTRACT

An object is to manufacture a semiconductor device including an oxide semiconductor at low cost with high productivity in such a manner that a photolithography process is simplified by reducing the number of light-exposure masks. In a method for manufacturing a semiconductor device including a channel-etched inverted-staggered thin film transistor, an oxide semiconductor film and a conductive film are etched using a mask layer formed with the use of a multi-tone mask which is a light-exposure mask through which light is transmitted so as to have a plurality of intensities. In etching steps, a first etching step is performed by dry etching in which an etching gas is used, and a second etching step is performed by wet etching in which an etchant is used.

14 Claims, 30 Drawing Sheets

(51) Int. Cl.
  *H01L 29/66* (2006.01)
  *H01L 27/12* (2006.01)
  *H01L 29/786* (2006.01)

(56) References Cited

U.S. PATENT DOCUMENTS

| | | |
|---|---|---|
| 5,608,251 A | 3/1997 | Konuma et al. |
| 5,620,905 A | 4/1997 | Konuma et al. |
| 5,731,856 A | 3/1998 | Kim et al. |
| 5,744,864 A | 4/1998 | Cillessen et al. |
| 5,755,938 A | 5/1998 | Fukui et al. |
| 5,847,410 A | 12/1998 | Nakajima |
| 6,117,735 A | 9/2000 | Ueno |
| 6,124,606 A | 9/2000 | Boer et al. |
| 6,294,274 B1 | 9/2001 | Kawazoe et al. |
| 6,359,672 B2 | 3/2002 | Gu et al. |
| 6,558,987 B2 | 5/2003 | Lee |
| 6,563,174 B2 | 5/2003 | Kawasaki et al. |
| 6,586,346 B1 | 7/2003 | Yamazaki et al. |
| 6,623,653 B2 | 9/2003 | Furuta et al. |
| 6,727,522 B1 | 4/2004 | Kawasaki et al. |
| 6,762,802 B2 | 7/2004 | Ono et al. |
| 6,767,847 B1 | 7/2004 | Hu et al. |
| 6,838,308 B2 | 1/2005 | Haga |
| 6,900,872 B2 | 5/2005 | Kang |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,071,037 B2 | 7/2006 | Suzawa et al. |
| 7,105,868 B2 | 9/2006 | Nause et al. |
| 7,199,846 B2 | 4/2007 | Lim |
| 7,211,825 B2 | 5/2007 | Shih et al. |
| 7,279,371 B2 | 10/2007 | Kim |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,358,592 B2 | 4/2008 | Ueno |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,714,329 B2 | 5/2010 | Suzawa et al. |
| 7,732,819 B2 | 6/2010 | Akimoto et al. |
| 7,767,505 B2 | 8/2010 | Son et al. |
| 7,772,021 B2 | 8/2010 | Lee et al. |
| 7,910,920 B2 | 3/2011 | Park et al. |
| 7,935,964 B2 | 5/2011 | Kim et al. |
| 7,960,730 B2 | 6/2011 | Lee et al. |
| 7,982,215 B2 | 7/2011 | Inoue et al. |
| 7,998,372 B2 | 8/2011 | Yano et al. |
| 8,030,195 B2 | 10/2011 | Inoue et al. |
| 8,168,544 B2 | 5/2012 | Chang |
| 8,207,756 B2 | 6/2012 | Shionoiri et al. |
| 8,236,635 B2 | 8/2012 | Suzawa et al. |
| 8,242,494 B2 | 8/2012 | Suzawa et al. |
| 8,304,765 B2 | 11/2012 | Yamazaki et al. |
| 8,309,961 B2 | 11/2012 | Yamazaki et al. |
| 8,319,215 B2 | 11/2012 | Yamazaki et al. |
| 8,343,799 B2 * | 1/2013 | Ito et al. ............ 438/104 |
| 8,614,442 B2 | 12/2013 | Park et al. |
| 8,741,702 B2 * | 6/2014 | Ito et al. ............ 438/149 |
| 2001/0030323 A1 | 10/2001 | Ikeda |
| 2001/0046027 A1 | 11/2001 | Tai et al. |
| 2002/0044111 A1 | 4/2002 | Yamazaki et al. |
| 2002/0056838 A1 | 5/2002 | Ogawa |
| 2002/0132454 A1 | 9/2002 | Ohtsu et al. |
| 2002/0185466 A1 | 12/2002 | Furuta et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0080700 A1 | 4/2004 | Kang |
| 2004/0127038 A1 | 7/2004 | Carcia et al. |
| 2004/0263757 A1 | 12/2004 | Kwon |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0267141 A1 | 11/2006 | Saito |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0096816 A1 | 5/2007 | Paul et al. |
| 2007/0108446 A1 | 5/2007 | Akimoto |
| 2007/0152217 A1 | 7/2007 | Lai et al. |
| 2007/0170434 A1 | 7/2007 | Inoue et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0249104 A1 | 10/2007 | Lin |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0143653 A1 | 6/2008 | Shishido |
| 2008/0166834 A1 | 7/2008 | Kim et al. |
| 2008/0176364 A1 | 7/2008 | Yang et al. |
| 2008/0182358 A1 | 7/2008 | Cowdery-Corvan et al. |
| 2008/0197350 A1 | 8/2008 | Park et al. |
| 2008/0203387 A1 | 8/2008 | Kang et al. |
| 2008/0224133 A1 | 9/2008 | Park et al. |
| 2008/0225061 A1 | 9/2008 | Kimura et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008638 A1 | 1/2009 | Kang et al. |
| 2009/0008639 A1 | 1/2009 | Akimoto et al. |
| 2009/0009677 A1 | 1/2009 | Yamazaki et al. |
| 2009/0033818 A1 | 2/2009 | Nakajima et al. |

(56) References Cited

U.S. PATENT DOCUMENTS

| | | |
|---|---|---|
| 2009/0057683 A1 | 3/2009 | Nakajima et al. |
| 2009/0061574 A1 | 3/2009 | Nakajima et al. |
| 2009/0065771 A1 | 3/2009 | Iwasaki et al. |
| 2009/0068773 A1 | 3/2009 | Lai et al. |
| 2009/0072232 A1 | 3/2009 | Hayashi et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140438 A1 | 6/2009 | Yamazaki et al. |
| 2009/0142887 A1 | 6/2009 | Son et al. |
| 2009/0148970 A1 | 6/2009 | Hosoya et al. |
| 2009/0152506 A1 | 6/2009 | Umeda et al. |
| 2009/0152541 A1 | 6/2009 | Maekawa et al. |
| 2009/0186437 A1 | 7/2009 | Akimoto |
| 2009/0186445 A1 | 7/2009 | Akimoto |
| 2009/0189155 A1 | 7/2009 | Akimoto |
| 2009/0189156 A1 | 7/2009 | Akimoto |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0051934 A1 | 3/2010 | Choung et al. |
| 2010/0051949 A1 | 3/2010 | Yamazaki et al. |
| 2010/0059742 A1 | 3/2010 | Shieh et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0072467 A1 | 3/2010 | Yamazaki et al. |
| 2010/0084650 A1 | 4/2010 | Yamazaki et al. |
| 2010/0092800 A1 | 4/2010 | Itagaki et al. |
| 2010/0102312 A1 | 4/2010 | Yamazaki et al. |
| 2010/0102315 A1 | 4/2010 | Suzawa et al. |
| 2010/0105162 A1 | 4/2010 | Suzawa et al. |
| 2010/0105164 A1 | 4/2010 | Ito et al. |
| 2010/0109002 A1 | 5/2010 | Itagaki et al. |
| 2010/0117075 A1 | 5/2010 | Akimoto et al. |
| 2010/0123136 A1 | 5/2010 | Lee et al. |
| 2010/0163862 A1 | 7/2010 | Yang et al. |
| 2010/0283055 A1 | 11/2010 | Inoue et al. |
| 2010/0301329 A1 | 12/2010 | Asano et al. |
| 2011/0062433 A1 | 3/2011 | Yamazaki |
| 2011/0062436 A1 | 3/2011 | Yamazaki et al. |
| 2011/0117698 A1 | 5/2011 | Suzawa et al. |
| 2012/0286266 A1 | 11/2012 | Suzawa et al. |
| 2012/0286267 A1 | 11/2012 | Suzawa et al. |
| 2013/0105793 A1 | 5/2013 | Ito et al. |

FOREIGN PATENT DOCUMENTS

| | | | |
|---|---|---|---|
| EP | 0520713 A | | 12/1992 |
| EP | 0650197 A | | 4/1995 |
| EP | 1538676 A | | 6/2005 |
| EP | 1737044 A | | 12/2006 |
| EP | 1770788 A | | 4/2007 |
| EP | 1918904 A | | 5/2008 |
| EP | 1933293 A | | 6/2008 |
| EP | 1983499 A | | 10/2008 |
| EP | 1995787 A | | 11/2008 |
| EP | 1998373 A | | 12/2008 |
| EP | 1998374 A | | 12/2008 |
| EP | 1998375 A | | 12/2008 |
| EP | 2226847 A | | 9/2010 |
| JP | 60-198861 A | | 10/1985 |
| JP | 63-210022 A | | 8/1988 |
| JP | 63-210023 A | | 8/1988 |
| JP | 63-210024 A | | 8/1988 |
| JP | 63-215519 A | | 9/1988 |
| JP | 63-239117 A | | 10/1988 |
| JP | 63-265818 A | | 11/1988 |
| JP | 03-231472 A | | 10/1991 |
| JP | 05-190571 A | | 7/1993 |
| JP | 05-251705 A | | 9/1993 |
| JP | 08-264794 A | | 10/1996 |
| JP | 11-505377 | | 5/1999 |
| JP | 2000-044236 A | | 2/2000 |
| JP | 2000-150900 A | | 5/2000 |
| JP | 2002-076356 A | | 3/2002 |
| JP | 2002-258324 A | | 9/2002 |
| JP | 2002-289859 A | | 10/2002 |
| JP | 2003-086000 A | | 3/2003 |
| JP | 2003-086808 A | | 3/2003 |
| JP | 2004-103957 A | | 4/2004 |
| JP | 2004-273614 A | | 9/2004 |
| JP | 2004-273732 A | | 9/2004 |
| JP | 2005-173606 A | | 6/2005 |
| JP | 2005-285890 A | | 10/2005 |
| JP | 2006-080172 A | | 3/2006 |
| JP | 2007-096055 A | | 4/2007 |
| JP | 2007-123700 A | | 5/2007 |
| JP | 2007-123861 A | | 5/2007 |
| JP | 2007-214319 A | | 8/2007 |
| JP | 2007-250983 A | | 9/2007 |
| KR | 2006-0133834 A | | 12/2006 |
| KR | 2008-0048936 A | | 6/2008 |
| TW | 280010 | | 7/1996 |
| TW | 200834517 | | 8/2008 |
| WO | WO-2004/114391 | | 12/2004 |
| WO | WO-2007/119386 | | 10/2007 |

OTHER PUBLICATIONS

Taiwanese Office Action (Application No. 101132732) Dated Jun. 16, 2014.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda. T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350°C", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO Systems", Journal of Solid State Chemistry , Apr. 1, 1965, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

(56) References Cited

OTHER PUBLICATIONS

Tsuda.K et al., "Ultra Low Power Consumption Technologies for Mobile TFT-LCDs", IDW '02 : Proceedings of the 9th International Displays Workshops, Dec. 4, 2002, pp. 295-298.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-in. AMOLED Display With Driver Circuit Using Amorphous In—Ga—Zn—Oxide TFTs", IDW '09 : Proceedings of the 16th International Display Workshops, 2009, pp. 689-692.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Osada.T et al., "Development of Driver-Integrated Panel Using Amorphous In—Ga—Zn—Oxide TFT", AM-FPD '09 Degest of Technical Papers, Jul. 1, 2009, pp. 33-36.
Hirao.T et al., "Novel Top-Gate Zinc Oxide Thin-Film Transistors (ZnO TFTs) for AMLCDs", Journal of the SID, 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Ohara.H et al., "21.3:4.0 in. QVGA AMOLED Display Using In—Ga—Zn—Oxide TFTs With a Novel Passication Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 SID Interanational Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic NANO-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology"SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phase for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kimizuka.N. et al., "Spinel,YBFE2O4, and YB2FE3O7 Types of Structures for Compounds in the IN2O3 and SC2O3-A2O3-BO Systems [A; FE, GA, OR AL; B: MG, MN, FE, NI, CU,OR ZN] at Temperatures Over 1000°C", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-918.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Nakamura.M, "Synthesis of Homologous Compound with New Long-Period Structure", Nirim Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B. (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

(56) References Cited

OTHER PUBLICATIONS

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshop, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Kim.C et al., "A Novel Four-Mask-Count Process Architecture for TFT-LCDs", SID Digest '00 : SID International Symposium Digest of Technical Papers, 2000, vol. 31, pp. 1006-1009.

Song.J et al., "34.1: Advanced Four-Mask Process Architecture for the A-Si TFT Array Manufactoring Method", SID Digest '02 : SID International Symposium Digest of Technical Papers, 2002, vol. 33, pp. 1038-1041.

Choi.S et al., "P-16: Novel Four-Mask Process in the FFS TFT-LCD With Optimum Multiple-Slit Design Applied by the Use of a Gray-Tone Mask", SID Digest '05 : SID International Symposium Digest of Technical Papers, 2005, vol. 36, pp. 284-287.

Chinese Office Action (Application No. 200910207025.8) Dated Feb. 16, 2013.

Park.J et al., "High-performance amorphous gallium indium zinc oxide thin-film transistors through N2O plasma passivation", Appl. Phys. Lett. (Applied Physics Letters), Aug. 7, 2008, vol. 93, pp. 053505-1-053505-3.

Park.J et al., "High performance amorphous oxide thin film transistors with self-aligned top-gate structure", IEDM 09: Technical Digest of Internationl Electron Devices Meeting, Dec. 7, 2009, pp. 191-194.

Taiwanese Office Action (Application No. 098135598) Dated Jan. 19, 2015.

\* cited by examiner

FIG. 2A1
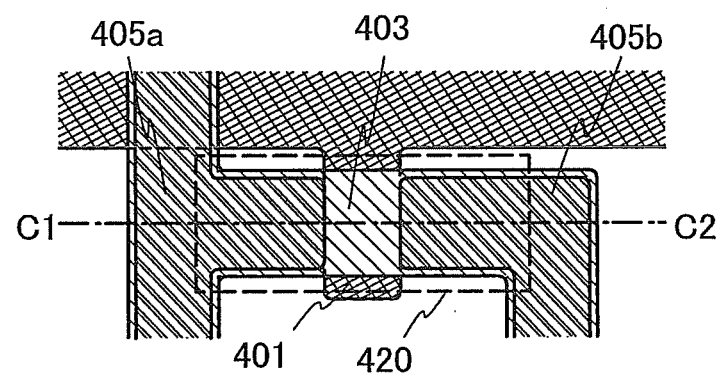
FIG. 2A2
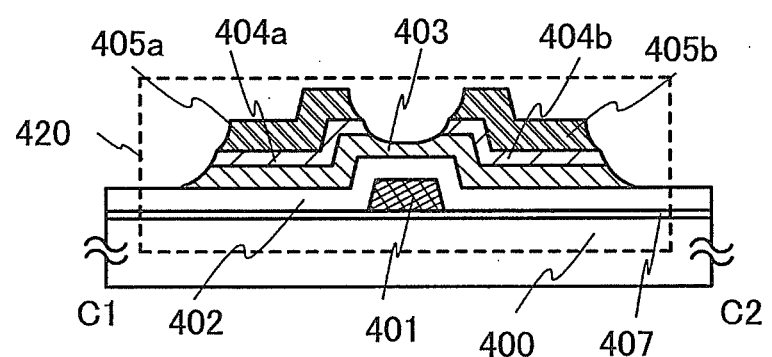

FIG. 4A1
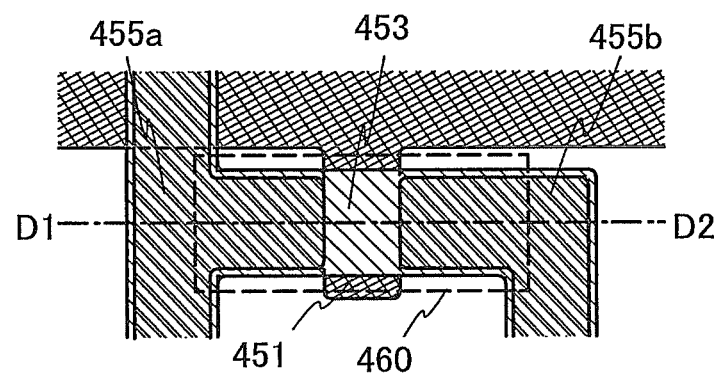
FIG. 4A2
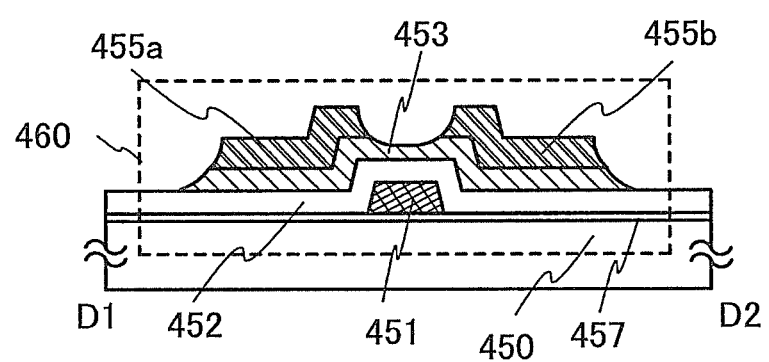

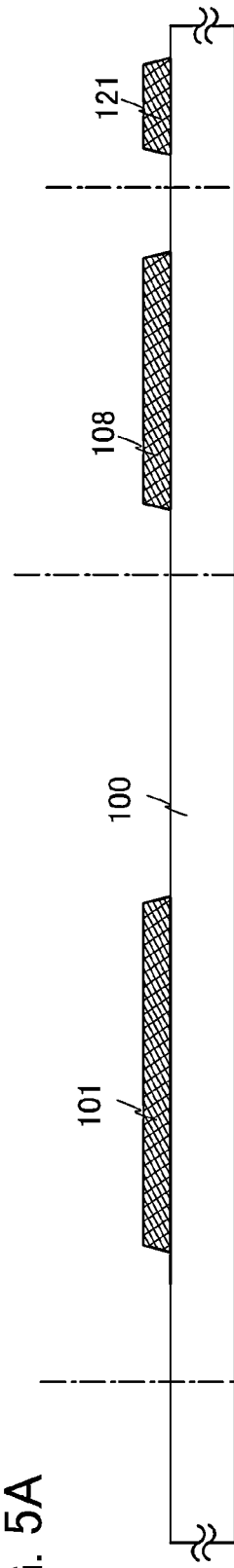
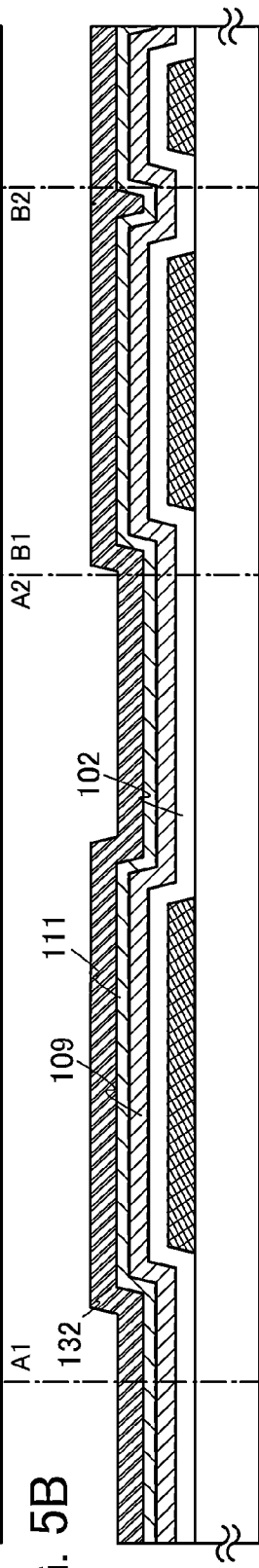
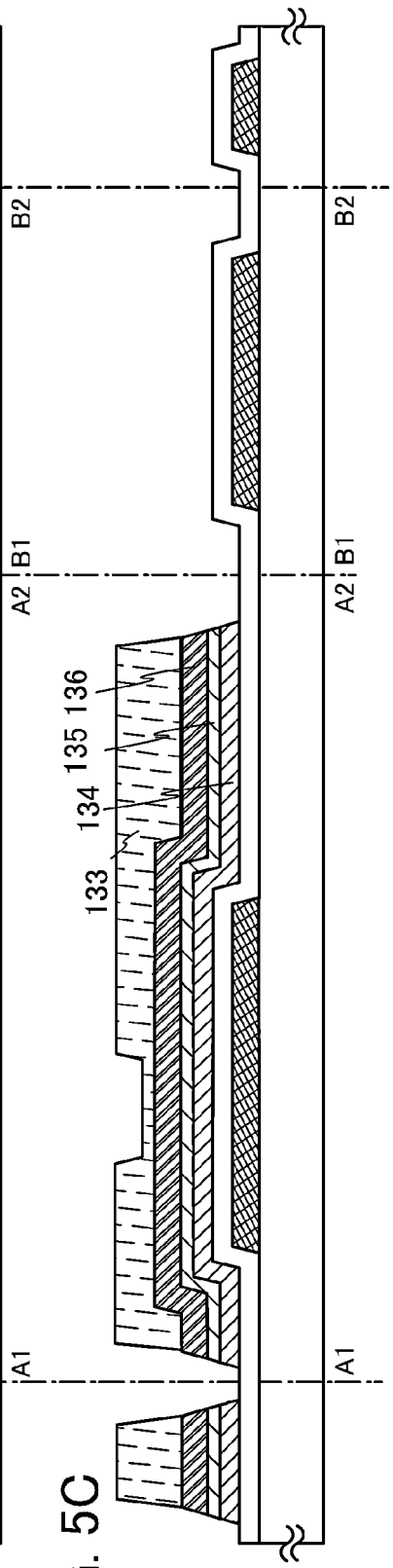

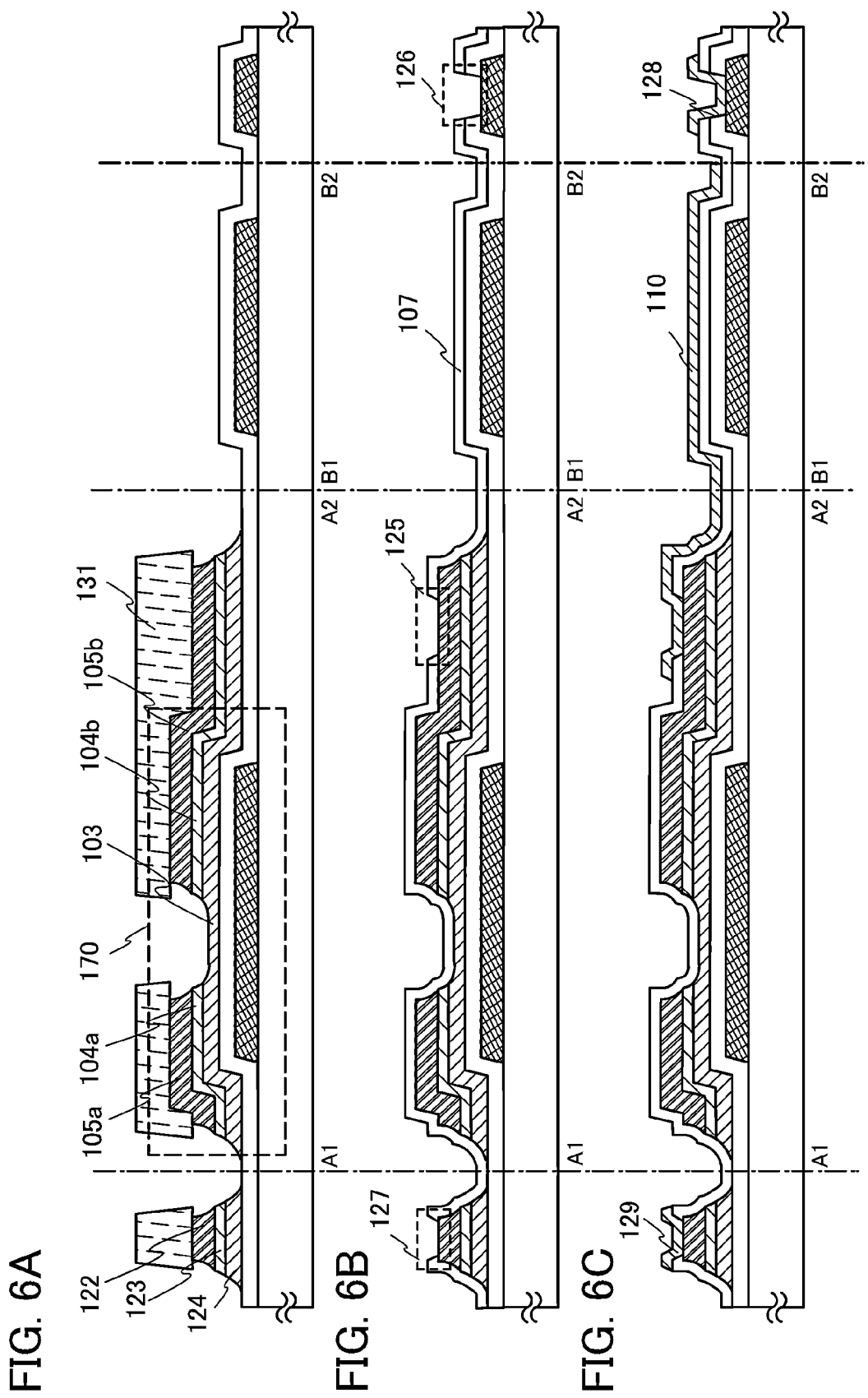

FIG. 11A1
FIG. 11A2
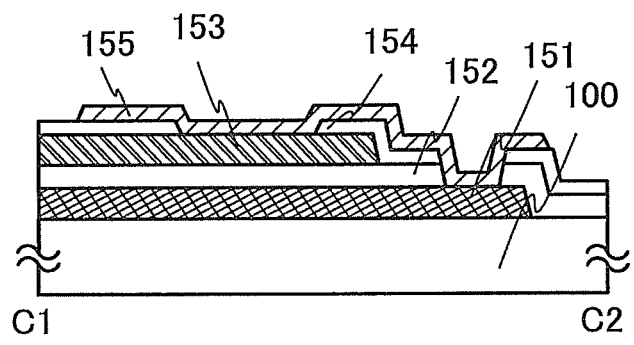
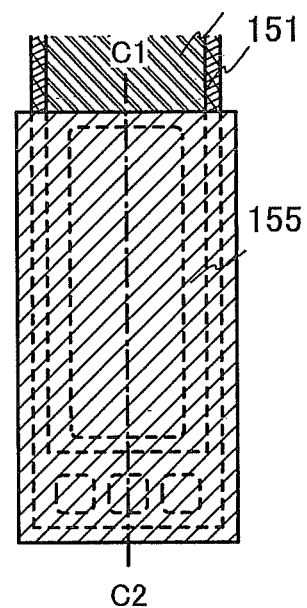
FIG. 11B1
FIG. 11B2
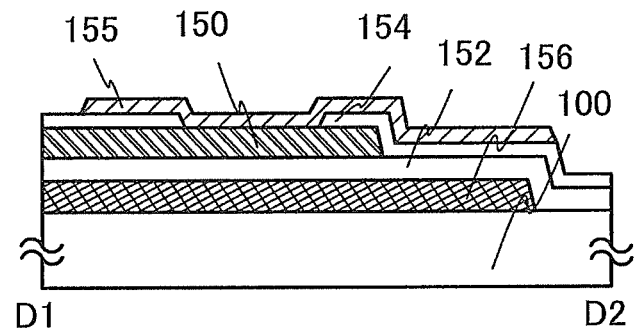
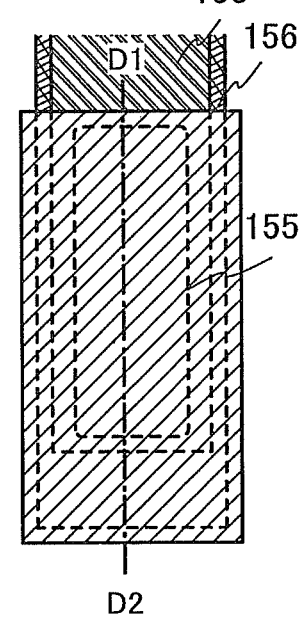

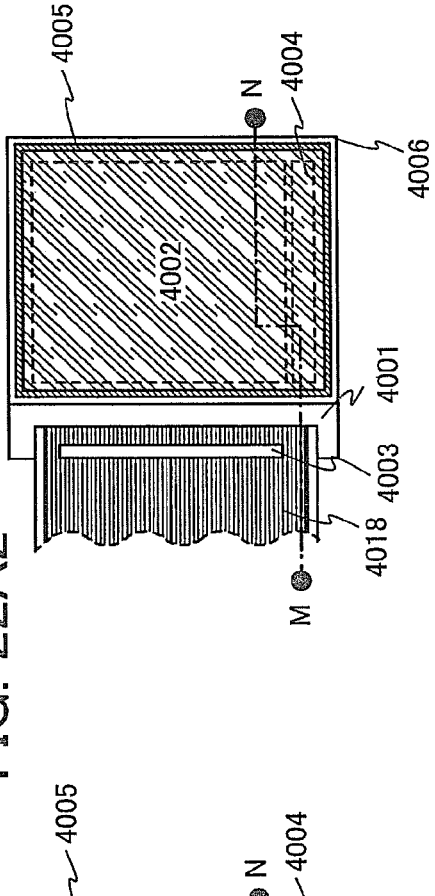
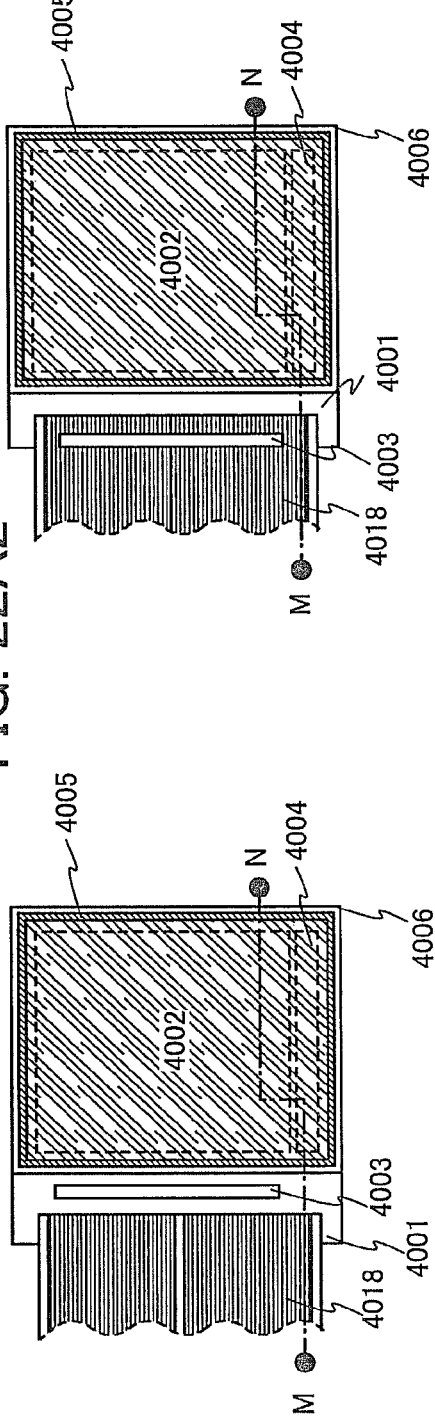
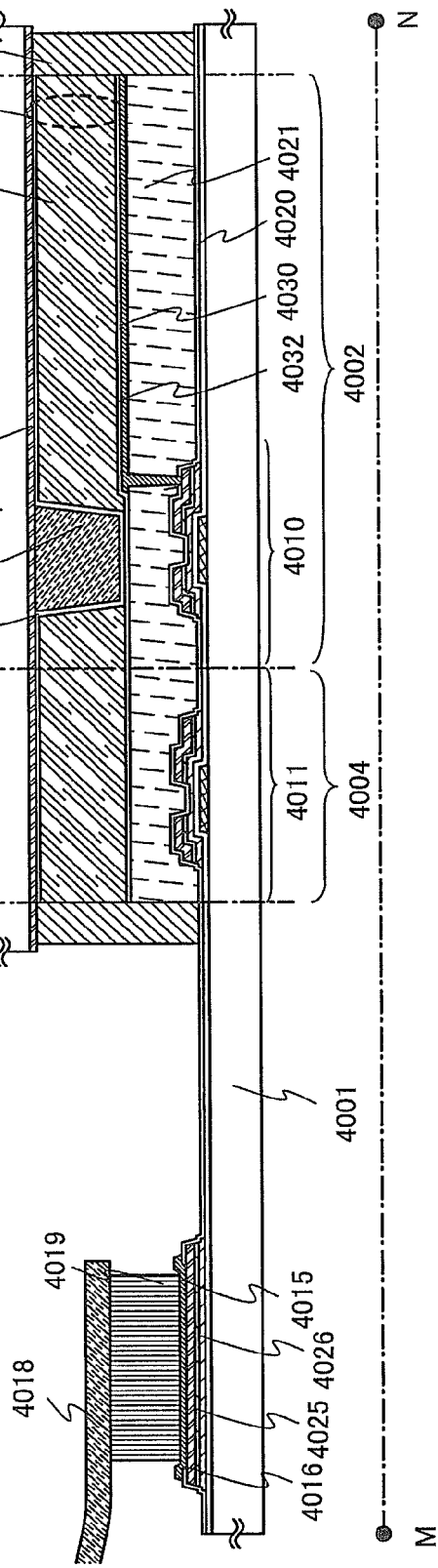

METHOD FOR MANUFACTURING SEMICONDUCTOR DEVICE

This application is a Divisional of application Ser. No. 12/582,079 filed Oct. 20, 2009, now U.S. Pat. No. 8,741,702, which is based on JP 2008-274520 filed Oct. 24, 2008.

BACKGROUND OF THE INVENTION

1. Field of the Invention

The present invention relates to a semiconductor device including an oxide semiconductor, and a manufacturing method thereof.

2. Description of the Related Art

A thin film transistor formed over a flat plate such as a glass substrate is manufactured using amorphous silicon or polycrystalline silicon, as typically seen in a liquid crystal display device. A thin film transistor manufactured using amorphous silicon has low field-effect mobility, but such a transistor can be formed over a glass substrate with a larger area. On the other hand, a thin film transistor manufactured using a crystalline silicon has high field-effect mobility, but a crystallization step such as laser annealing is necessary and such a transistor is not always suitable for a larger glass substrate.

In contrast, attention has been drawn on a technique by which a thin film transistor is manufactured using an oxide semiconductor and applied to an electronic device or an optical device. For example, Patent Document 1 and Patent Document 2 each disclose a technique by which a thin film transistor is manufactured using zinc oxide or an In—Ga—Zn—O-based oxide semiconductor, which is formed into an oxide semiconductor film, and which is used for a switching element or the like of an image display device.

REFERENCES

[Patent Document 1] Japanese Published Patent Application No. 2007-123861
[Patent Document 2] Japanese Published Patent Application No. 2007-96055

SUMMARY OF THE INVENTION

A thin film transistor including an oxide semiconductor in a channel formation region has higher field-effect mobility than a thin film transistor including amorphous silicon. An oxide semiconductor film can be formed at temperatures of 300° C. or less by a sputtering method or the like, and a manufacturing process of a thin film transistor including an oxide semiconductor film is simpler than that of a thin film transistor including polycrystalline silicon.

There is an expectation for application of such an oxide semiconductor to liquid crystal displays, electroluminescent displays, electronic paper, and the like by forming a thin film transistor including the oxide semiconductor over a glass substrate, a plastic substrate, or the like.

As a method for manufacturing a thin film transistor, a method by which a stacked structure is formed by a photolithography process using a number of light-exposure masks (also referred to as photomasks) is employed. However, a photolithography process includes a number of steps and is one factor of largely affecting the manufacturing cost, yield, productivity, and the like. In particular, reducing the number of light-exposure masks whose design and manufacturing costs are high is a significant object.

In view of the above problems, it is an object to manufacture a semiconductor device at low cost with high productivity in such a manner that a photolithography process is simplified by reducing the number of light-exposure masks.

In a method for manufacturing a semiconductor device including an inverted staggered thin film transistor, an etching step is performed with the use of a mask layer formed using a multi-tone mask which is a light-exposure mask through which light is transmitted so as to have a plurality of intensities.

Since a mask layer formed using a multi-tone mask has a plurality of thicknesses and can be further changed in shape by performing etching, the mask layer can be used in a plurality of etching steps to provide different patterns. Therefore, a mask layer corresponding at least two kinds of different patterns can be formed by one multi-tone mask. Thus, the number of light-exposure masks can be reduced and the number of corresponding photolithography processes can also be reduced, whereby simplification of a manufacturing process can be realized.

A process for manufacturing an inverted staggered thin film transistor includes an etching step (a first etching step) of processing a semiconductor film and a conductive film into island shapes and an etching step (a second etching step) of etching the conductive film and the semiconductor film into a source electrode layer, a drain electrode layer, and a semiconductor layer having a depression. The first etching step is performed by dry etching in which an etching gas is used, and the second etching step is performed by wet etching in which an etchant is used.

As the etching gas, a gas including chlorine (a chlorine-based gas such as $Cl_2$, $BCl_3$, or $SiCl_4$) is preferable. Alternatively, a gas obtained by adding oxygen or a rare gas (such as Ar) to the above gas may be used as the etching gas.

As the etchant, a mixed solution of phosphoric acid, acetic acid, and nitric acid or an ammonia hydrogen peroxide mixture can be used.

An oxide semiconductor used in this specification is formed into a thin film represented by $InMO_3(ZnO)_m$ (m>0), and a thin film transistor is manufactured using this thin film as a semiconductor layer. Note that M denotes one or more of metal elements selected from gallium (Ga), iron (Fe), nickel (Ni), manganese (Mn), or cobalt (Co). For example, in some cases, M denotes Ga and any of the above metal elements other than Ga, such as Ga and Ni, or Ga and Fe. The above oxide semiconductor includes, in some cases, a transition metal element such as Fe or Ni or an oxide of the transition metal as an impurity element, in addition to the metal element included as M. In this specification, this thin film is also called an In—Ga—Zn—O-based non-single-crystal film.

Since an In—Ga—Zn—O-based non-single-crystal film is formed by a sputtering method and then subjected to thermal treatment at 200° C. to 500° C., typically 300° C. to 400° C. for 10 minutes to 100 minutes, an amorphous structure is observed as its crystal structure in an XRD (X-ray diffraction) analysis. Moreover, as for the electrical characteristics of the thin film transistor, an on/off ratio of $10^9$ or more and a mobility of 10 or more at a gate voltage of ±20 V can be achieved.

According to one embodiment of the present invention disclosed in this specification, a gate electrode layer is formed over a substrate having an insulating surface, a gate insulating layer, an oxide semiconductor film, and a conductive film are stacked over the gate electrode layer, a first mask layer is formed over the gate insulating layer, the oxide semiconductor film, and the conductive film, an oxide semiconductor layer and a conductive layer are formed by etching the oxide semiconductor film and the conductive film with the use of the first mask layer in a first etching step, a second mask layer is formed by etching the first mask layer, and an oxide semiconductor layer having a depression, a source electrode layer, and a drain electrode layer are formed by etching the oxide semiconductor layer and the conductive layer with the use of the second mask layer in a second etching step, wherein the first mask layer is formed using a light-exposure mask through which light is transmitted so as to have a plurality of intensities, wherein dry etching in which an etching gas is used is employed in the first etching step, wherein wet etching in which an etchant is used is employed in the second etching step, and wherein the oxide semiconductor layer having a depression includes a region with a smaller thickness than a region overlapping with the source electrode layer or the drain electrode layer.

According to another embodiment of the present invention disclosed in this specification, a gate electrode layer is formed over a substrate having an insulating surface, a gate insulating layer, a first oxide semiconductor film, a second oxide semiconductor film, and a conductive film are stacked over the gate electrode layer, a first mask layer is formed over the gate insulating layer, the first oxide semiconductor film, the second oxide semiconductor film, and the conductive film, a first oxide semiconductor layer, a second oxide semiconductor layer, and a conductive layer are formed by etching the first oxide semiconductor film, the second oxide semiconductor film, and the conductive film with the use of the first mask layer in a first etching step, a second mask layer is formed by etching the first mask layer, and an oxide semiconductor layer having a depression, a source region, a drain region, a source electrode layer, and a drain electrode layer are formed by etching the first oxide semiconductor layer, the second oxide semiconductor layer, and the conductive layer with the use of the second mask layer in a second etching step, wherein the first mask layer is formed using a light-exposure mask through which light is transmitted so as to have a plurality of intensities, wherein dry etching in which an etching gas is used is employed in the first etching step, wherein wet etching in which an etchant is used is employed in the second etching step, and wherein the oxide semiconductor layer having a depression includes a region with a smaller thickness than a region overlapping with the source region or the drain region.

The method for manufacturing a semiconductor device disclosed in this specification achieves at least one of the above objects.

Moreover, the second oxide semiconductor film used for the source region and the drain region of the thin film transistor is preferably thinner than the first oxide semiconductor film used for a channel formation region and preferably has higher conductivity (electrical conductivity) than the first oxide semiconductor film.

The second oxide semiconductor film has n-type conductivity and serves as the source region and the drain region.

Moreover, the first oxide semiconductor film has an amorphous structure and the second oxide semiconductor film includes a crystal grain (nanocrystal) in an amorphous structure in some cases. The crystal grain (nanocrystal) in the second oxide semiconductor film has a diameter of 1 nm to 10 nm, typically approximately 2 nm to 4 nm.

As the second oxide semiconductor film used for the source region and the drain region ($n^+$ layer), an In—Ga—Zn—O-based non-single-crystal film can be used.

An insulating film may be formed so as to cover the thin film transistor and be in contact with the oxide semiconductor layer including the channel formation region.

Moreover, since the thin film transistor is easily destroyed by static electricity or the like, a protective circuit for protecting a driver circuit is preferably provided over the same substrate as a gate wiring or a source wiring. The protective circuit is preferably formed using a non-linear element including an oxide semiconductor.

Note that the ordinal numbers such as "first" and "second" are used for convenience and do not define the order of steps and the stacking order of layers. In addition, the ordinal numbers in this specification do not denote particular names which specify the invention.

As a display device including a driver circuit, there are a light-emitting display device including a light-emitting element and a display device including an electrophoretic display element, which is also referred to as electronic paper, in addition to a liquid crystal display device.

A light-emitting display device including a light-emitting element includes a pixel portion having a plurality of thin film transistors. The pixel portion includes a region where a gate electrode of one thin film transistor is connected to a source or drain wiring of another thin film transistor. A driver circuit of the light-emitting display device including a light-emitting element includes a region where a gate electrode of a thin film transistor is connected to a source or drain wiring of the thin film transistor.

Note that the semiconductor devices in this specification indicate all the devices which can operate by using semiconductor characteristics, and an electro-optical device, a semiconductor circuit, and an electronic appliance are all included in the category of the semiconductor devices.

Further, by reducing the number of light-exposure masks, a photolithography process is simplified, whereby a reliable semiconductor device can be manufactured at low cost with high productivity.

BRIEF DESCRIPTION OF THE DRAWINGS

FIGS. 2A1 and 2A2 show a semiconductor device.

FIGS. 4A1 and 4A2 show a semiconductor device.

FIGS. 5A to 5C show a method for manufacturing a semiconductor device.

FIGS. 6A to 6C show a method for manufacturing a semiconductor device.

FIGS. 11A1, 11A2, 11B1, and 11B2 show semiconductor devices.

FIGS. 22A1, 22A2, and 22B show semiconductor devices.

DETAILED DESCRIPTION OF THE INVENTION

Figure 1A:
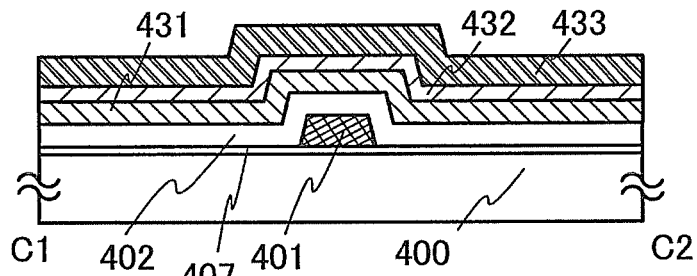
FIGS. 1A to 1E show a method for manufacturing a semiconductor device.

Embodiments are described in detail with reference to the drawings. However, it is easily understood by those skilled in the art that the modes and details herein disclosed can be modified in a variety of ways without departing from the scope and the spirit of the present invention. Therefore, the present invention should not be interpreted as being limited to the description of Embodiments given below. In the structures of the present invention described below, the same portions or portions having similar functions are denoted by the same reference numerals in different drawings, and the description thereof will not be repeated.

Embodiment 1

A method for manufacturing a semiconductor device of this embodiment is described with reference to FIGS. 1A to 1E and FIGS. 2A1 and 2A2.

FIG. 2A1 is a plan view of a thin film transistor 420 of a semiconductor device of this embodiment, and FIG. 2A2 is a cross-sectional view taken along C1-C2 of FIG. 2A1. The thin film transistor 420 is an inverted staggered thin film transistor and includes a gate electrode layer 401, a gate insulating layer 402, a semiconductor layer 403, $n^+$ layers 404a and 404b serving as a source region and a drain region, and source and drain electrode layers 405a and 405b.

FIGS. 1A to 1E correspond to cross-sectional views showing steps of manufacturing the thin film transistor 420.

In FIG. 1A, an insulating film 407 serving as a base film is provided over a substrate 400 and the gate electrode layer 401 is provided over the insulating film 407. The insulating film 407 has a function of preventing diffusion of an impurity element from the substrate 400, and can be formed to have a single-layer or stacked-layer structure using one or more of a silicon nitride film, a silicon oxide film, a silicon nitride oxide film, and a silicon oxynitride film. In this embodiment, a silicon oxide film (with a thickness of 100 nm) is used. The gate electrode layer 401 can be formed to have a single-layer or stacked-layer structure using a metal material such as molybdenum, titanium, chromium, tantalum, tungsten, aluminum, copper, neodymium, or scandium, or an alloy material which contains any of these materials as a main component.

For example, as a two-layer structure of the gate electrode layer 401, the following structures are preferable: a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, and a two-layer structure in which a titanium nitride layer and a molybdenum layer are stacked. As a three-layer structure, it is preferable to stack a tungsten layer or a tungsten nitride layer, an alloy of aluminum and silicon or an alloy of aluminum and titanium, and a titanium nitride layer or a titanium layer.

The gate insulating layer 402, a first oxide semiconductor film 431, a second oxide semiconductor film 432, and a conductive film 433 are stacked in that order over the gate electrode layer 401.

The gate insulating layer 402 can be formed to have a single-layer or stacked-layer structure by a plasma CVD method, a sputtering method, or the like using a silicon oxide layer, a silicon nitride layer, a silicon oxynitride layer, or a silicon nitride oxide layer. Alternatively, the gate insulating layer 402 can be formed using a silicon oxide layer by a CVD method in which an organosilane gas is used. As the organosilane gas, a silicon-containing compound such as tetraethoxysilane (TEOS: chemical formula, $Si(OC_2H_5)_4$), tetramethylsilane (TMS: chemical formula, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

Note that before the first oxide semiconductor film 431 is formed by a sputtering method, dust on a surface of the gate insulating layer 402 is preferably removed by reverse sputtering in which an argon gas is introduced and plasma is generated. The reverse sputtering is a method by which voltage is applied to a substrate side using an RF power to generate plasma on the substrate side in an argon atmosphere without applying voltage to a target side, so that a surface is modified. Nitrogen, helium, or the like may be used instead of the argon atmosphere. Alternatively, oxygen, hydrogen, $N_2O$, or the like may be added to the argon atmosphere. Further alternatively, $Cl_2$, $CF_4$, or the like may be added to the argon atmosphere.

A region where the second oxide semiconductor film 432 and the conductive film 433 are in contact with each other is preferably modified through plasma treatment. In this embodiment, the plasma treatment is performed on the second oxide semiconductor film 432 (in this embodiment, an In—Ga—Zn—O-based non-single-crystal film) in an argon atmosphere before the conductive film 433 is formed.

The plasma treatment may be performed using nitrogen, helium, or the like instead of the argon atmosphere. Alternatively, oxygen, hydrogen, $N_2O$, or the like may be added to the argon atmosphere. Further alternatively, $Cl_2$, $CF_4$, or the like may be added to the argon atmosphere.

In this embodiment, an In—Ga—Zn—O-based non-single-crystal film is used as each of the first oxide semiconductor film 431 and the second oxide semiconductor film 432. The first oxide semiconductor film 431 and the second oxide semiconductor film 432 are formed under different conditions, and the second oxide semiconductor film 432 has higher conductivity and lower resistance than the first oxide semiconductor film 431. For example, the second oxide semiconductor film 432 is formed using an oxide semiconductor film obtained by a sputtering method in which the argon gas flow rate is set to 40 sccm. The second oxide semiconductor film 432 has n-type conductivity and has an activation energy ($\Delta E$) of from 0.01 eV to 0.1 eV. Note that in this embodiment, the second oxide semiconductor film 432 is an In—Ga—Zn—O-based non-single-crystal film and includes at least an amorphous component. In some cases, the second oxide semiconductor film 432 has a crystal grain (nanocrystal) in an amorphous structure. The crystal grain (nanocrystal) in this second oxide semiconductor film 432 has a diameter of 1 nm to 10 nm, typically approximately 2 nm to 4 nm.

By the provision of the second oxide semiconductor film 432 serving as an n$^+$ layer, the conductive film 433 formed using a metal layer and the first oxide semiconductor film 431 serving as a channel formation region have a favorable junction, which allows more thermally-stable operation than a Schottky junction. In addition, willing provision of the n$^+$ layer is effective in supplying carriers to the channel (on the source side), stably absorbing carriers from the channel (on the drain side), or preventing a resistance component from being formed at an interface with the wiring. Further, by the decrease in resistance, high mobility can be maintained even at high drain voltage.

The gate insulating layer 402, the first oxide semiconductor film 431, the second oxide semiconductor film 432, and the conductive film 433 can be formed successively without exposure to air. By the successive formation without exposure to air, the films can be stacked without the interface therebetween contaminated by an atmospheric component or a contaminant impurity element floating in air; therefore, variation in characteristics of a thin film transistor can be decreased.

A mask 434 is formed over the gate insulating layer 402, the first oxide semiconductor film 431, the second oxide semiconductor film 432, and the conductive film 433.

In this embodiment, an example is shown in which the mask 434 is formed in such a manner that light-exposure is performed using a high-tone mask. A resist is formed in order to form the mask 434. As the resist, a positive type resist or a negative type resist can be used. Here, a positive resist is used.

Next, the resist is irradiated with light with the use of a multi-tone mask 59 as a light-exposure mask, so that the resist is exposed to light.

Here, light exposure with the multi-tone mask 59 is described with reference to FIGS. 30A to 30D.

A multi-tone mask can achieve three levels of light exposure, so that an exposed portion, a semi-exposed portion, and an unexposed portion can be formed. In other words, a multi-tone mask is a mask through which light is transmitted so as to have a plurality of intensities. One-time light exposure and development process allows a resist mask having regions with plural thicknesses (typically, two kinds of thicknesses) to be formed. Thus, the number of light-exposure masks can be reduced by using a multi-tone mask.

Figure 30A:
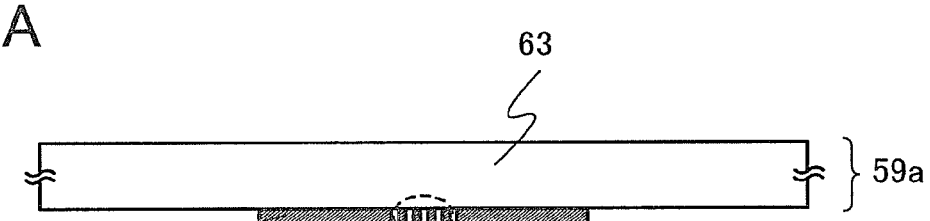
FIGS. 30A to 30D show multi-tone masks.
Figure 30B:
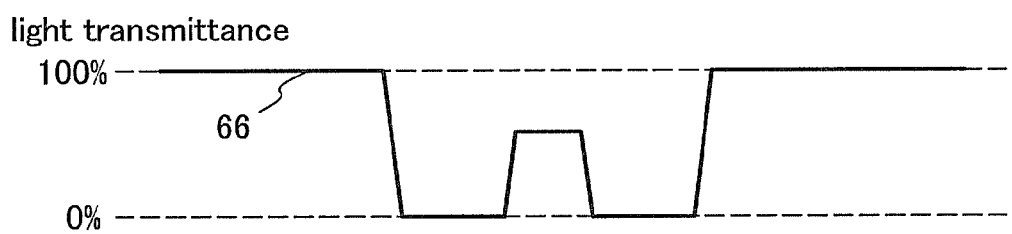
Figure 30C:
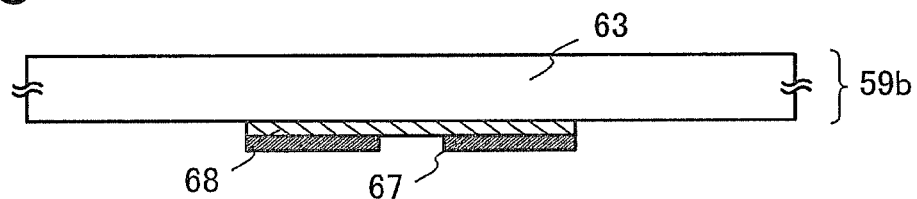

Typical examples of a multi-tone mask include a gray-tone mask 59a as shown in FIG. 30A and a half-tone mask 59b as shown in FIG. 30C.

As shown in FIG. 30A, the gray-tone mask 59a includes a light-transmitting substrate 63, and a light-blocking portion 64 and a diffraction grating 65 which are formed on the light-transmitting substrate 63. The light transmittance of the light-blocking portion 64 is 0%. The diffraction grating 65 has light-transmitting portions in a slit form, a dot form, a mesh form, or the like with intervals which are less than or equal to the resolution limit of light used for the light exposure, whereby the light transmittance can be controlled. The diffraction grating 65 can be either in a slit form, a dot form, or a mesh form with regular intervals; or in a slit form, a dot form, or a mesh form with irregular intervals.

As the light-transmitting substrate 63, a light-transmitting substrate such as a quartz substrate can be used. The light-blocking portion 64 and the diffraction grating 65 can be each formed of a light-blocking material which absorbs light, such as chromium or chromium oxide.

When the gray-tone mask 59a is irradiated with light for exposure, light transmittance 66 of the light-blocking portion 64 is 0% and the light transmittance 66 of a region where the light-blocking portion 64 and the diffraction grating 65 are not provided is 100%, as shown in FIG. 30B. The light transmittance 66 of the diffraction grating 65 can be controlled in the range of 10% to 70%. The light transmittance of the diffraction grating 65 can be controlled by controlling the interval and pitch of slits, dots, or meshes of the diffraction grating.

As shown in FIG. 30C, the half-tone mask 59b includes the light-transmitting substrate 63, and a semi-transmissive portion 68 and a light-blocking portion 67 which are formed on the light-transmitting substrate 63. The semi-transmissive portion 68 can be formed using MoSiN, MoSi, MoSiO, MoSiON, CrSi, or the like. The light-blocking portion 67 can be formed using a light-blocking material which absorbs light, such as chromium or chromium oxide.

Figure 30D:
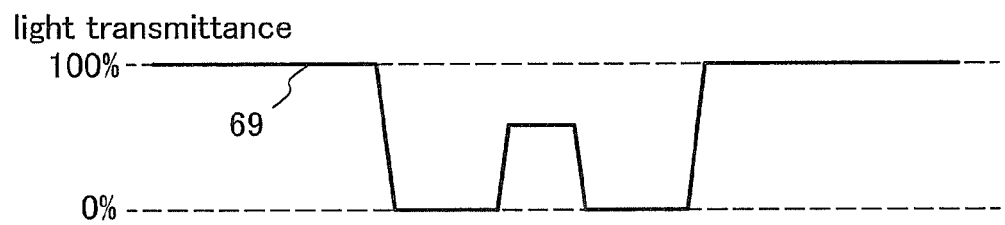

In the case where the half-tone mask 59b is irradiated with light for exposure, as shown in FIG. 30D, light transmittance 69 of the light-blocking portion 67 is 0% and that of a region where the light-blocking portion 67 and the semi-transmissive portion 68 are not provided is 100%. Further, the light transmittance 69 of the semi-transmissive portion 68 can be controlled in the range of 10% to 70%. The light transmittance of the semi-transmissive portion 68 can be controlled by choosing the material of the semi-transmissive portion 68.

Figure 1B:
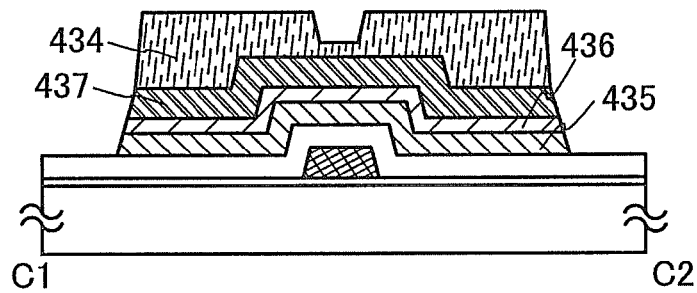
Figure 1C:
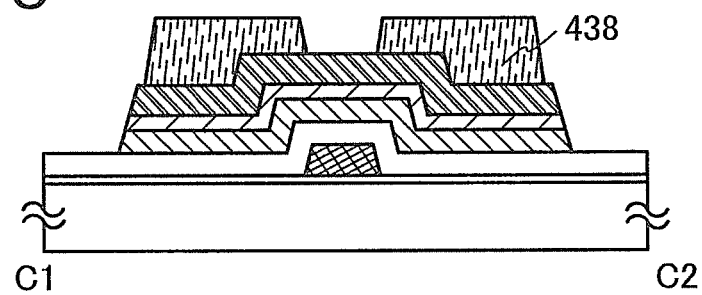

The light exposure is performed using the multi-tone mask, and then development is performed; accordingly, the mask 434 having regions with different thicknesses can be formed as shown in FIG. 1B.

Next, a first etching step is performed using the mask 434; accordingly, the first oxide semiconductor film 431, the second oxide semiconductor film 432, and the conductive film 433 are etched into island shapes. As a result, a first oxide semiconductor layer 435, a second oxide semiconductor layer 436, and a conductive layer 437 can be formed (see FIG. 1B).

In this embodiment, the first etching step is performed by dry etching in which an etching gas is used.

As the etching gas, a gas including chlorine (chlorine-based gas such as chlorine ($Cl_2$), boron chloride ($BCl_3$), silicon chloride ($SiCl_4$), or carbon tetrachloride ($CCl_4$)) is preferably used. With the use of the gas including chlorine in etching, in-plane variation in etching can be reduced as compared to the case of using a gas without chlorine.

Alternatively, a gas including fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. The etching condition (the amount of electric power applied to a coil-shaped electrode, the amount of electric power applied to an electrode on a substrate side, the temperature of the electrode on the substrate side, or the like) is adjusted as appropriate so that the films can be etched into desired shapes.

In this embodiment, an ICP etching method is employed and the etching condition is as follows: $Cl_2$ and $O_2$ are used; the amount of electric power applied to the coil-shaped electrode is 1500 W; the amount of electric power applied to the electrode on the substrate side is 200 W; a pressure is 1.5 Pa; and a substrate temperature is −10° C.

Alternatively, the ICP etching method may be performed under the following etching condition: $Cl_2$ (with a flow rate of 100 sccm) is used as an etching gas; the amount of electric power applied to the coil-shaped electrode is 2000 W; the amount of electric power applied to the electrode on the substrate side is 600 W; a pressure is 1.5 Pa; and a substrate temperature is −10° C.

When the first oxide semiconductor film 431 and the second oxide semiconductor film 432, which are formed using the In—Ga—Zn—O-based non-single-crystal film, are etched under the above condition, the end portion of the semiconductor layer 403 can have a small tapered angle of 5 degrees or less. In this case, the coverage of the film which is stacked over the semiconductor layer 403 can be improved. In addition, in the etching process, the end of the etching (also referred to as an end point) is preferably determined by monitoring the wavelength corresponding to each atom in the oxide semiconductor films while plasma emission intensity is measured. This method makes it possible to control the etching so that the decrease in thickness of the gate insulating layer under the semiconductor layer can be suppressed and the etching residue of the oxide semiconductor films can be reduced.

When the etching is performed using a chlorine-based gas ($Cl_2$) to which an oxygen gas ($O_2$) is added (preferably, the content of oxygen in the etching gas is set to be 15 vol % or more), in the case of using a silicon oxynitride film as the gate insulating layer 402, the selectivity ratio of the In—Ga—Zn—O-based non-single-crystal film used for the first oxide semiconductor film 431 and the second oxide semiconductor film 432 with respect to the gate insulating layer 402 can be increased. Therefore, the first oxide semiconductor film 431 and the second oxide semiconductor film 432 can be etched more than the gate insulating layer 402, and the damage on the gate insulating layer 402 can be sufficiently decreased.

Through the first etching step in which the first oxide semiconductor film 431, the second oxide semiconductor film 432, and the conductive film 433 are dry-etched, the first oxide semiconductor film 431, the second oxide semiconductor film 432, and the conductive film 433 are etched anisotropically. In this manner, the end portion of the mask 434 is aligned with end portions of the first oxide semiconductor layer 435, the second oxide semiconductor layer 436, and the conductive layer 437, and these end portions become continuous.

In addition, since the etching rates of the end portions of the first oxide semiconductor layer 435, the second oxide semiconductor layer 436, and the conductive layer 437 are different depending on the etching conditions or oxide semiconductor materials and conductive materials, the tapered angles are different and the end portions are not continuous in some cases.

Next, the mask 434 is subjected to ashing. As a result, the mask is reduced in size and thickness. Through the ashing, a region of the resist mask, which has small thickness (a region overlapping with part of the gate electrode layer 401), is removed, so that divided masks 438 can be formed (see FIG. 1C).

Figure 1D:
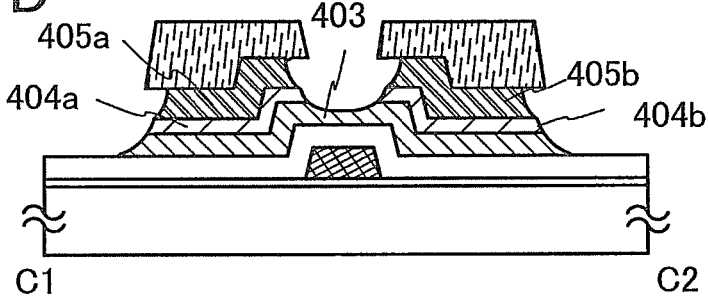

A second etching step is performed using the masks 438; accordingly, the first oxide semiconductor layer 435, the second oxide semiconductor layer 436, and the conductive layer 437 are etched into a semiconductor layer 403, n⁺ layers 404a and 404b, and source and drain electrode layers 405a and 405b (see FIG. 1D). Note that the semiconductor layer 403 is partly etched to become a semiconductor layer having a groove (a depression) and also having an end portion which is partly etched and exposed.

In this embodiment, the second etching step is performed by wet etching in which an etchant is used.

As the etchant, a mixed solution of phosphoric acid, acetic acid, and nitric acid, an ammonia hydrogen peroxide mixture (hydrogen peroxide:ammonia:water=5:2:2), or the like can be used. Alternatively, ITO07N (manufactured by Kanto Chemical Co., Inc) may be used.

The etching condition (etchant, etching time, temperature, or the like) is adjusted as appropriate, depending on a material used for the conductive layer 437, so that the films can be etched into desired shapes.

For example, in the case where an aluminum film or an aluminum alloy film is used for the conductive layer 437, wet etching using a mixed solution of phosphoric acid, acetic acid, and nitric acid can be performed. Further, in the case where a titanium film is used for the conductive layer 437, wet etching using an ammonia hydrogen peroxide mixture (hydrogen peroxide:ammonia:water=5:2:2) as the etchant can be performed.

For example, in the case where an aluminum film or an aluminum alloy film is used for the conductive layer 437, the first oxide semiconductor layer 435, the second oxide semiconductor layer 436, and the conductive layer 437 may be etched using a mixed solution of phosphoric acid, acetic acid, and nitric acid as the etchant of the second etching step.

In the second etching step, the conductive layer and the oxide semiconductor layers may be etched using different etchants.

For example, in the case where a titanium film is used for the conductive layer 437, the conductive layer 437 is etched using an ammonia hydrogen peroxide mixture (hydrogen peroxide:ammonia:water=5:2:2) as the etchant of the second etching step, and the first oxide semiconductor layer 435 and the second oxide semiconductor layer 436 may be etched using a mixed solution of phosphoric acid, acetic acid, and nitric acid.

In the second etching step, the first oxide semiconductor layer 435, the second oxide semiconductor layer 436, and the conductive layer 437 may be etched using an ammonia hydrogen peroxide mixture (hydrogen peroxide:ammonia:water=5:2:2) so that a depression of the semiconductor layer 403, the n⁺ layers 404a and 404b, and the source and drain electrode layers 405a and 405b can be formed.

Through the second etching step in which the first oxide semiconductor layer 435, the second oxide semiconductor layer 436, and the conductive layer 437 are wet-etched, the first oxide semiconductor layer 435, the second oxide semiconductor layer 436, and the conductive layer 437 are etched isotropically. In this manner, the end portions of the masks 438 are not aligned with end portions and the depression of the semiconductor layer 403 and end portions of the n⁺ layers 404a and 404b and the source and drain electrode layers 405a and 405b, and these end portions further recede, so that the shapes of the end portions have curvature.

In addition, since the etching rates of the end portions of the semiconductor layer 403, the n⁺ layers 404a and 404b, and the source and drain electrode layers 405a and 405b are different depending on the etching conditions or oxide semiconductor materials and conductive materials, the curvatures are different and the end portions are not continuous in some cases.

Furthermore, the etchant after the wet etching is removed together with the etched materials by cleaning. Waste liquid of the etchant containing the removed materials may be purified to recycle the materials contained in the waste liquid. Materials such as indium contained in the oxide semiconductor layer are collected from the waste liquid after the etching and recycled, so that resources can be effectively used and cost can be reduced.

After that, the masks 438 are removed.

The material of the source and drain electrode layers 405a and 405b preferably has a higher etching rate than that of the semiconductor layer 403. This is because, in the case of etching the source and drain electrode layers 405a and 405b and the semiconductor layer 403 in one time by etching, decreasing the etching rate of the semiconductor layer 403 so as to be lower than that of the source and drain electrode layers 405a and 405b can suppress the excessive etching of the semiconductor layer 403. As a result, the removal of the semiconductor layer 403 can be suppressed.

After that, thermal treatment at 200° C. to 600° C., typically 300° C. to 500° C. is preferably performed. Here, thermal treatment is performed at 350° C. for an hour in a nitrogen atmosphere. Through this thermal treatment, rearrangement at the atomic level of the In—Ga—Zn—O-based oxide semiconductor used for the semiconductor layer 403 and the n$^+$ layers 404a and 404b occurs. This thermal treatment (including photo-annealing or the like) is important in that the distortion that interrupts carrier transport in the semiconductor layer 403 and the n$^+$ layers 404a and 404b can be released. Note that there is no particular limitation on when to perform the thermal treatment, as long as it is performed after the first oxide semiconductor film 431 and the second oxide semiconductor film 432 are formed.

In addition, oxygen radical treatment may be performed on the exposed depression of the semiconductor layer 403. By the oxygen radical treatment, the thin film transistor in which the channel formation region is formed using the semiconductor layer 403 can serve as a normally-off transistor. Moreover, by the radical treatment, the damage of the semiconductor layer 403 due to the etching can be repaired. The radical treatment is preferably performed in an atmosphere of $O_2$, $N_2O$, or an atmosphere of oxygen containing $N_2$, He, Ar, or the like. Alternatively, an atmosphere obtained by adding $Cl_2$ or $CF_4$ to the above atmosphere may be used. Note that the radical treatment is preferably performed with no bias voltage applied to the substrate 100 side.

Figure 1E:
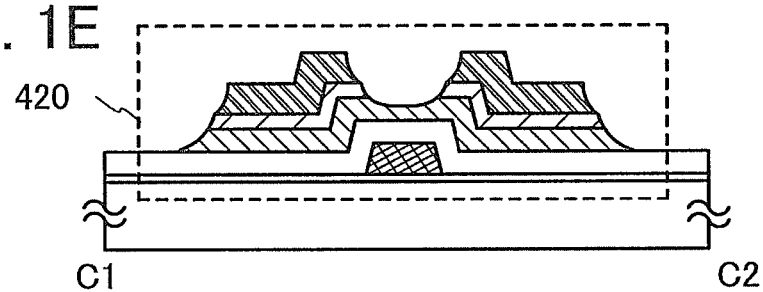

Through the above steps, the inverted staggered thin film transistor 420 shown in FIG. 1E can be completed.

With the use of the resist mask having regions with a plurality of (typically two kinds of) thicknesses, which is formed using the multi-tone mask, as in this embodiment, the number of resist masks can be reduced; therefore, the process can be simplified and cost reduction can be achieved. Accordingly, a reliable semiconductor device can be manufactured at low cost with high productivity.

Embodiment 2

Here, an example of a semiconductor device including a thin film transistor with a structure where the source and drain electrode layers are in contact with the semiconductor layer in Embodiment 1 is described with reference to FIGS. 3A to 3E and FIGS. 4A1 and 4A2.

FIG. 4A1 is a plan view of a thin film transistor 460 in a semiconductor device of this embodiment, and FIG. 4A2 is a cross-sectional view taken along D1-D2 of FIG. 4A1. The thin film transistor 460 is an inverted staggered thin film transistor and includes a gate electrode layer 451, a gate insulating layer 452, a semiconductor layer 453, and source and drain electrode layers 455a and 455b.

FIGS. 3A to 3E are cross-sectional views showing steps of manufacturing the thin film transistor 460.

Figure 3A:
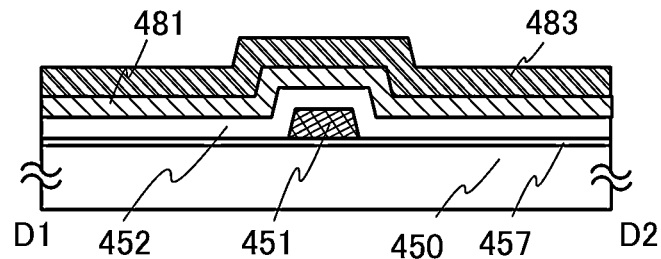
FIGS. 3A to 3E show a method for manufacturing a semiconductor device.

In FIG. 3A, an insulating film 457 serving as a base film is provided over a substrate 450 and the gate electrode layer 451 is provided over the insulating film 457. In this embodiment, a silicon oxide film (with a thickness of 100 nm) is used as the insulating film 457. The gate insulating layer 452, an oxide semiconductor film 481, and a conductive film 483 are stacked in that order over the gate electrode layer 451.

A region where the oxide semiconductor film 481 and the conductive film 483 are in contact with each other is preferably modified by plasma treatment. In this embodiment, plasma treatment is performed on the oxide semiconductor film 481 (an In—Ga—Zn—O-based non-single-crystal film in this embodiment) in an argon atmosphere before the conductive film 483 is formed.

The plasma treatment may be performed using nitrogen, helium, or the like instead of the argon atmosphere. Alternatively, an argon atmosphere to which oxygen, hydrogen, $N_2O$, or the like is added may be used. Further alternatively, an argon atmosphere to which $Cl_2$, $CF_4$, or the like is added may be used.

The gate insulating layer 452, the oxide semiconductor film 481, and the conductive film 483 can be formed successively without exposure to air. By the successive formation without exposure to air, the films can be stacked without the interface therebetween contaminated by an atmospheric component or a contaminant impurity element floating in air; therefore, variation in characteristics of a thin film transistor can be decreased.

A mask 484 is formed over the gate insulating layer 452, the oxide semiconductor film 481, and the conductive film 483.

In this embodiment, an example is described in which light-exposure is performed using a multi-tone (high-tone) mask in order to form the mask 484. The mask 484 can be formed in a manner similar to that of the mask 434 of Embodiment 1.

Figure 3B:
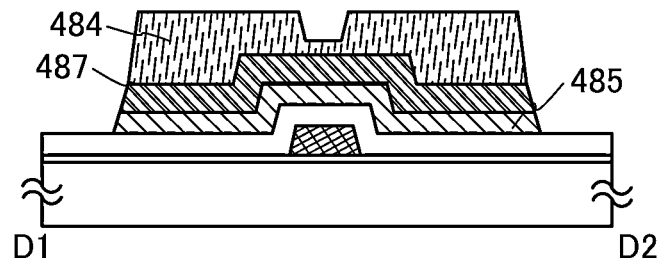
Figure 3C:
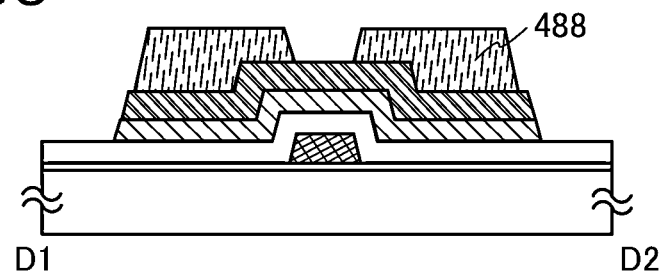

The light exposure is performed using the multi-tone mask through which light is transmitted so as to have a plurality of intensities, and then development is performed, whereby the mask 484 having regions with different thicknesses can be formed as shown in FIG. 3B. By using a multi-tone mask, the number of light-exposure masks can be reduced.

Next, a first etching step is performed using the mask 484; accordingly, the oxide semiconductor film 481 and the conductive film 483 are etched into island shapes. As a result, an oxide semiconductor layer 485 and a conductive layer 487 can be formed (see FIG. 3B).

In this embodiment, the first etching step is performed by dry etching in which an etching gas is used.

As the etching gas, a gas including chlorine (chlorine-based gas such as chlorine ($Cl_2$), boron chloride ($BCl_3$), silicon chloride ($SiCl_4$), or carbon tetrachloride ($CCl_4$)) is preferably used. With the use of the gas including chlorine in etching, in-plane variation in etching can be reduced as compared to the case of using a gas without chlorine.

Alternatively, a gas including fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. The etching condition (the amount of electric power applied to a coil-shaped electrode, the amount of electric power applied to an electrode on a substrate side, the temperature of the electrode on the substrate side, or the like) is adjusted as appropriate so that the films can be etched into desired shapes.

In this embodiment, an ICP etching method is employed and the etching condition is as follows: $Cl_2$ and $O_2$ are used; the amount of electric power applied to the coil-shaped electrode is 1500 W; the amount of electric power applied to the electrode on the substrate side is 200 W; a pressure is 1.5 Pa; and a substrate temperature is −10° C.

When the etching is performed using a chlorine-based gas ($Cl_2$) to which an oxygen gas ($O_2$) is added (preferably, the content of oxygen in the etching gas is set to be 15 vol % or more), in the case of using a silicon oxynitride film as the gate insulating layer 452, the selectivity ratio of the In—Ga—Zn—O-based non-single-crystal film used for the oxide semiconductor layer 485 with respect to the gate insulating layer 452 can be increased. Therefore, the oxide semiconductor film 481 can be etched more than the gate insulating layer 452.

Through the first etching step in which the oxide semiconductor film 481 and the conductive film 483 are dry-etched, the oxide semiconductor film 481 and the conductive film 483 are etched anisotropically. In this manner, the end portion of the mask 484 is aligned with end portions of the oxide semiconductor layer 485 and the conductive layer 487, and these end portions become continuous.

In addition, since the etching rates of the end portions of the oxide semiconductor layer 485 and the conductive layer 487 are different depending on the etching conditions or, oxide semiconductor materials and conductive materials, the tapered angles are different and the end portions are not continuous in some cases.

Next, the mask 484 is subjected to ashing. As a result, the mask is reduced in size and thickness. Through the ashing, a region of the resist mask, which has small thickness (a region overlapping with part of the gate electrode layer 451), is removed, so that divided masks 488 can be formed (see FIG. 3C).

Figure 3D:
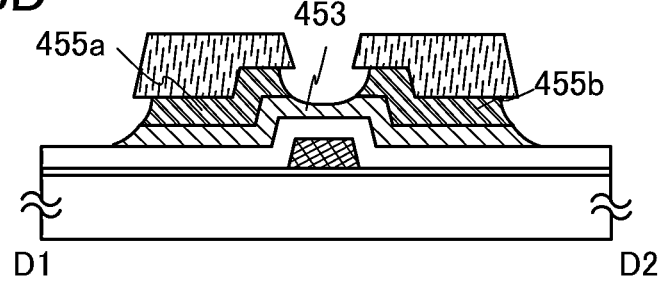

A second etching step is performed using the masks 488; accordingly, the oxide semiconductor layer 485 and the conductive layer 487 are etched into a semiconductor layer 453 and source and drain electrode layers 455a and 455b (see FIG. 3D). Note that the semiconductor layer 453 is partly etched to become a semiconductor layer having a groove (a depression) and also having an end portion which is partly etched and exposed.

In this embodiment, the second etching step is performed by wet etching in which an etchant is used.

As the etchant, a mixed solution of phosphoric acid, acetic acid, and nitric acid, an ammonia hydrogen peroxide mixture (hydrogen peroxide:ammonia:water=5:2:2), or the like can be used. Alternatively, ITO07N (manufactured by Kanto Chemical Co., Inc) may be used.

The etching condition (etchant, etching time, temperature, or the like) is adjusted as appropriate, depending on a material used for the conductive layer 487, so that the films can be etched into desired shapes.

For example, in the case where an aluminum film or an aluminum alloy film is used for the conductive layer 487, wet etching using a mixed solution of phosphoric acid, acetic acid, and nitric acid can be performed. Further, in the case where a titanium film is used for the conductive layer 487, wet etching using an ammonia hydrogen peroxide mixture (hydrogen peroxide:ammonia:water=5:2:2) as the etchant can be performed.

For example, in the case where an aluminum film or an aluminum alloy film is used for the conductive layer 487, the oxide semiconductor layer 485 and the conductive layer 487 may be etched using a mixed solution of phosphoric acid, acetic acid, and nitric acid as the etchant of the first etching step.

In the second etching step, the conductive layer and the oxide semiconductor layer may be etched using different etchants.

For example, in the case where a titanium film is used for the conductive layer 487, the conductive layer 487 is etched using an ammonia hydrogen peroxide mixture (hydrogen peroxide:ammonia:water=5:2:2) as the etchant of the second etching step, and the oxide semiconductor layer 485 may be etched using a mixed solution of phosphoric acid, acetic acid, and nitric acid.

In the second etching step, the oxide semiconductor layer 485 and the conductive layer 487 may be etched using an ammonia hydrogen peroxide mixture (hydrogen peroxide:ammonia:water=5:2:2) so that a depression of the semiconductor layer 453 and the source and drain electrode layers 455a and 455b can be formed.

In a manner similar to the above, through the second etching step in which the oxide semiconductor layer 485 and the conductive layer 487 are wet-etched, the oxide semiconductor layer 485 and the conductive layer 487 are etched isotropically. In this manner, the end portions of the masks 488 are not aligned with end portions and the depression of the semiconductor layer 453 and end portions of the source and drain electrode layers 455a and 455b, and these end portions further recede, so that the shapes of the end portions have curvature.

In addition, since the etching rates of the end portions of the semiconductor layer 453 and the source and drain electrode layers 455a and 455b are different depending on the etching conditions or, oxide semiconductor materials and conductive materials, the tapered angles are different and the end portions are not continuous in some cases.

Furthermore, the etchant after the wet etching is removed together with the etched materials by cleaning. Waste liquid of the etchant containing the removed materials may be purified to recycle the materials contained in the waste liquid. Materials such as indium contained in the oxide semiconductor layer are collected from the waste liquid after the etching and recycled, so that resources can be effectively used and cost can be reduced.

After that, the masks 488 are removed.

Figure 3E:
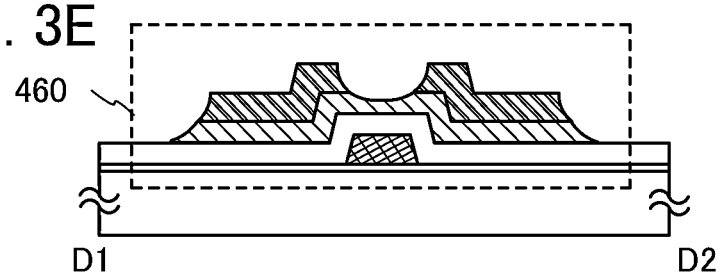
Figure 7:
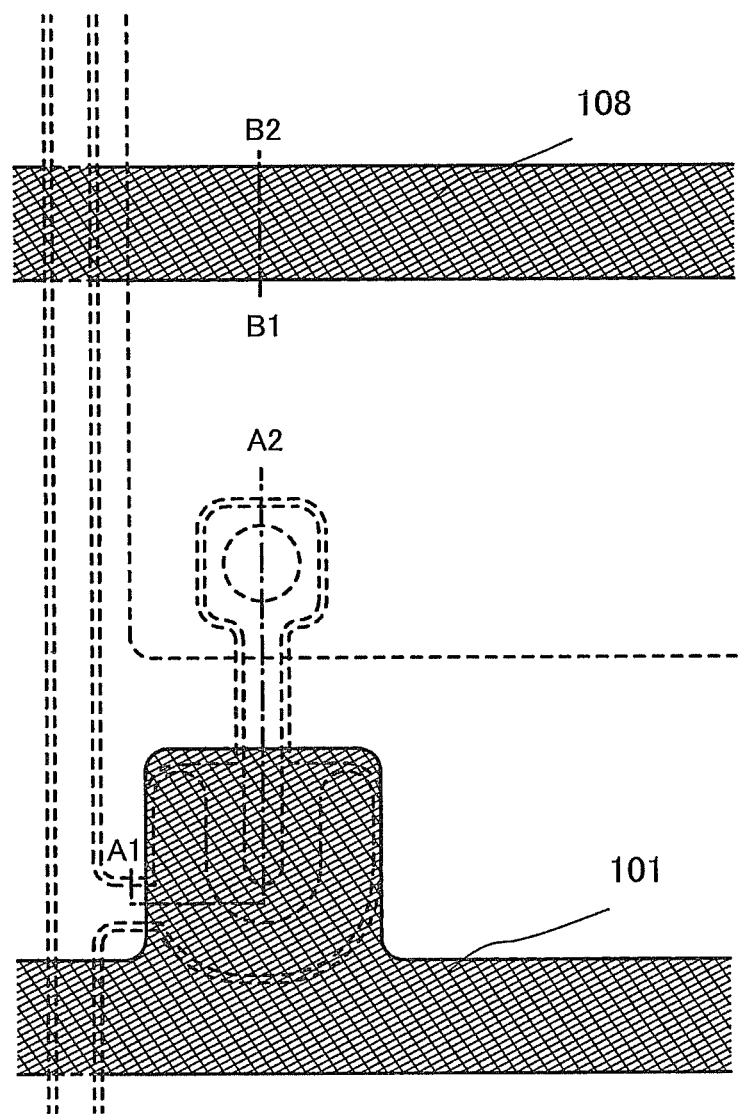
FIG. 7 shows a method for manufacturing a semiconductor device.

Through the above steps, the inverted staggered thin film transistor 460 shown in FIG. 3E can be completed.

With the use of the resist mask having a plurality of (typically two kinds of) thicknesses, which is formed using a multi-tone mask, as in this embodiment, the number of resist masks can be reduced; therefore, the process can be simplified and cost reduction can be achieved. Accordingly, a reliable semiconductor device can be manufactured at low cost with high productivity.

Embodiment 3

In this embodiment, a process for manufacturing a display device including a thin film transistor is described with reference to FIGS. 5A to 5C, FIGS. 6A to 6C, FIG. 7, FIG. 8, FIG. 9, FIG. 10, FIGS. 11A1, 11A2, 11B1, and 11B2, and FIG. 12.

As for a substrate 100 having a light-transmitting property shown in FIG. 5A, a glass substrate of barium borosilicate glass, aluminoborosilicate glass, or the like which is typified by #7059 glass, #1737 glass, or the like manufactured by Corning, Inc. can be used.

Next, a conductive layer is formed entirely over a surface of the substrate 100, and then a first photolithography process is performed to form a resist mask. Then, an unnecessary portion is removed by etching, so that wirings and electrodes (a gate wiring including a gate electrode layer 101, a capacitor wiring 108, and a first terminal 121) are formed. At this time, the etching is performed so that at least an end portion of the gate electrode layer 101 is tapered. FIG. 5A is a cross-sectional view showing this state. Note that FIG. 7 corresponds to a top view of this state.

Each of the gate wiring including the gate electrode layer 101, the capacitor wiring 108, and the first terminal 121 at a terminal portion is preferably formed using a heat-resistant conductive material such as an element selected from titanium (Ti), tantalum (Ta), tungsten (W), molybdenum (Mo), chromium (Cr), neodymium (Nd), or scandium (Sc); an alloy including any of these elements; an alloy film including any of these elements in combination; or a nitride including any of these elements. In the case of using a low-resistant conductive material such as aluminum (Al) or copper (Cu), the low-resistant conductive material is used in combination with the above heat-resistant conductive material because Al alone has problems of low heat resistance, tendency to corrode, and the like.

Next, a gate insulating layer 102 is formed entirely over the gate electrode layer 101. The gate insulating layer 102 is formed to a thickness of 50 nm to 250 nm by a sputtering method or the like.

For example, a silicon oxide film is formed to a thickness of 100 nm as the gate insulating layer 102 by a sputtering method. Needless to say, the gate insulating layer 102 is not limited to such a silicon oxide film and another insulating film such as a silicon oxynitride film, a silicon nitride film, an aluminum oxide film, or a tantalum oxide film may be formed to have a single-layer or stacked-layer structure.

Note that reverse sputtering in which an argon gas is introduced and plasma is generated is preferably performed before the formation of the oxide semiconductor film, in order to remove dust on the surface of the gate insulating layer. Nitrogen, helium, or the like may be used instead of the argon atmosphere. Alternatively, oxygen, hydrogen, $N_2O$, or the like may be added to the argon atmosphere. Further alternatively, $Cl_2$, $CF_4$, or the like may be added to the argon atmosphere.

Next, a first oxide semiconductor film 109 (a first In—Ga—Zn—O-based non-single-crystal film in this embodiment) is formed over the gate insulating layer 102. It is effective to deposit the first In—Ga—Zn—O-based non-single-crystal film without exposure to air after the plasma treatment because dust and moisture do not adhere to the interface between the gate insulating layer and the semiconductor film. Here, the first In—Ga—Zn—O-based non-single-crystal film is formed under the following condition: the target is an oxide semiconductor target including In, Ga, and Zn ($In_2O_3:Ga_2O_3:ZnO=1:1:1$) with a diameter of 8 inches; the distance between the substrate and the target is 170 mm; a pressure is 0.4 Pa; a direct current (DC) power supply is 0.5 kW; and an atmosphere is argon or oxygen. A pulse direct current (DC) power supply is preferable because dust can be reduced and film thickness becomes uniform. The thickness of the first In—Ga—Zn—O-based non-single-crystal film is set in the range of 5 nm to 200 nm. In this embodiment, the thickness of the first In—Ga—Zn—O-based non-single-crystal film is 100 nm.

Next, a second oxide semiconductor film 111 (a second In—Ga—Zn—O-based non-single-crystal film in this embodiment) is formed without exposure to air by a sputtering method. Here, sputtering deposition is performed under the following condition: the target is $In_2O_3:Ga_2O_3:ZnO=1:1:1$; a pressure is 0.4 Pa; the amount of electric power is 500 W; a deposition temperature is room temperature; and an argon gas flow rate is 40 sccm. Although the target of $In_2O_3:Ga_2O_3:ZnO=1:1:1$ is used intentionally, an In—Ga—Zn—O-based non-single-crystal film including a crystal grain which has a size of 1 nm to 10 nm just after the deposition is obtained in some cases. By adjusting a target composition ratio, a deposition pressure (0.1 Pa to 2.0 Pa), the amount of electric power (250 W to 3000 W: 8 inchesφ), a temperature (room temperature to 100° C.), a deposition condition of reactive sputtering, or the like as appropriate, the presence or absence of the crystal grains and the density of the crystal grains can be controlled and the diameter of the crystal grain can be adjusted within the range of 1 nm to 10 nm. The thickness of the second In—Ga—Zn—O-based non-single-crystal film is 5 nm to 20 nm. Needless to say, in the case where the film includes the crystal grain, the size of the crystal grain does not exceed the film thickness. In this embodiment, the thickness of the second In—Ga—Zn—O-based non-single-crystal film is 5 nm.

The first In—Ga—Zn—O-based non-single-crystal film and the second In—Ga—Zn—O-based non-single-crystal film are formed under different conditions from each other. For example, the flow rate ratio of an oxygen gas to an argon gas under the deposition conditions of the first In—Ga—Zn—O-based non-single-crystal film is higher than that under the deposition conditions of the second In—Ga—Zn—O-based non-single-crystal film. Specifically, the second In—Ga—Zn—O-based non-single-crystal film is formed in a rare gas (such as argon or helium) atmosphere (or an atmosphere including an oxygen gas for 10% or less and an argon gas for 90% or more), and the first In—Ga—Zn—O-based non-single-crystal film is formed in an oxygen atmosphere (or in an argon gas-to-oxygen gas flow ratio of 1 to 1 or higher).

The second In—Ga—Zn—O-based non-single-crystal film may be formed in the chamber where reverse sputtering has been performed previously, or in a different chamber from the chamber where reverse sputtering has been performed previously.

As the sputtering method, there are an RF sputtering method in which a high-frequency power source is used as a sputtering power source, a DC sputtering method, and a pulse DC sputtering method by which bias is applied in a pulsed manner. The RF sputtering method is used mainly in the case of forming an insulating film, and the DC sputtering method is used mainly in the case of forming a metal film.

Moreover, there is a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside a chamber and used for a magnetron sputtering method, or a sputtering apparatus used for an ECR sputtering method in which plasma generated with the use of microwaves is used without using glow discharge.

In addition, as a deposition method by a sputtering method, there are also a reactive sputtering method in which a target substance and a sputtering gas component are chemically reacted with each other during deposition to form a thin film of a compound thereof, and a bias sputtering method in which voltage is also applied to a substrate during film formation.

Next, a conductive film 132 is formed of a metal material over the first oxide semiconductor film 109 and the second oxide semiconductor film 111 by a sputtering method or a vacuum evaporation method. FIG. 5B is a cross-sectional view showing this state.

As the material of the conductive film 132, there are an element selected from Al, Cr, Ta, Ti, Mo, or W, an alloy including any of these elements, an alloy film including any of the above elements in combination, and the like. In the case of performing thermal treatment at 200° C. to 600° C., the conductive film 132 is preferably formed so as to resist such thermal treatment. In the case of using Al, Al is used in combination with a heat-resistant conductive material because Al alone has problems of low heat resistance, tendency to corrode, and the like. As the heat-resistant conductive material used in combination with Al, an element selected from titanium (Ti), tantalum (Ta), tungsten (W), molybdenum (Mo), chromium (Cr), neodymium (Nd), or scandium (Sc); an alloy including any of these elements; an alloy film including any of these elements in combination; or a nitride including any of these elements is used.

Here, the conductive film 132 is a titanium film of a single-layer structure. Alternatively, the conductive film 132 may have a two-layer structure; for example, a titanium film is stacked over an aluminum film. Further alternatively, the conductive film 132 may have a three-layer structure; for example, a Ti film is formed, an aluminum film including Nd (Al—Nd film) is stacked over the Ti film, and a Ti film is further formed thereover. The conductive film 132 may be an aluminum film including silicon of a single-layer structure.

Next, a second photolithography process is performed to form a mask 133 which is a resist mask. In this embodiment, an example is described in which light exposure is performed using a multi-tone (high-tone) mask for forming the mask 133. The mask 133 can be formed in a manner similar to that of the mask 434 of Embodiment 1.

The light exposure is performed using the multi-tone mask through which light is transmitted so as to have a plurality of intensities, and then development is performed, whereby the mask 133 including regions with different thicknesses can be formed as shown in FIG. 5C. Accordingly, with the use of a multi-tone mask, the number of light-exposure masks can be reduced.

Figure 8:
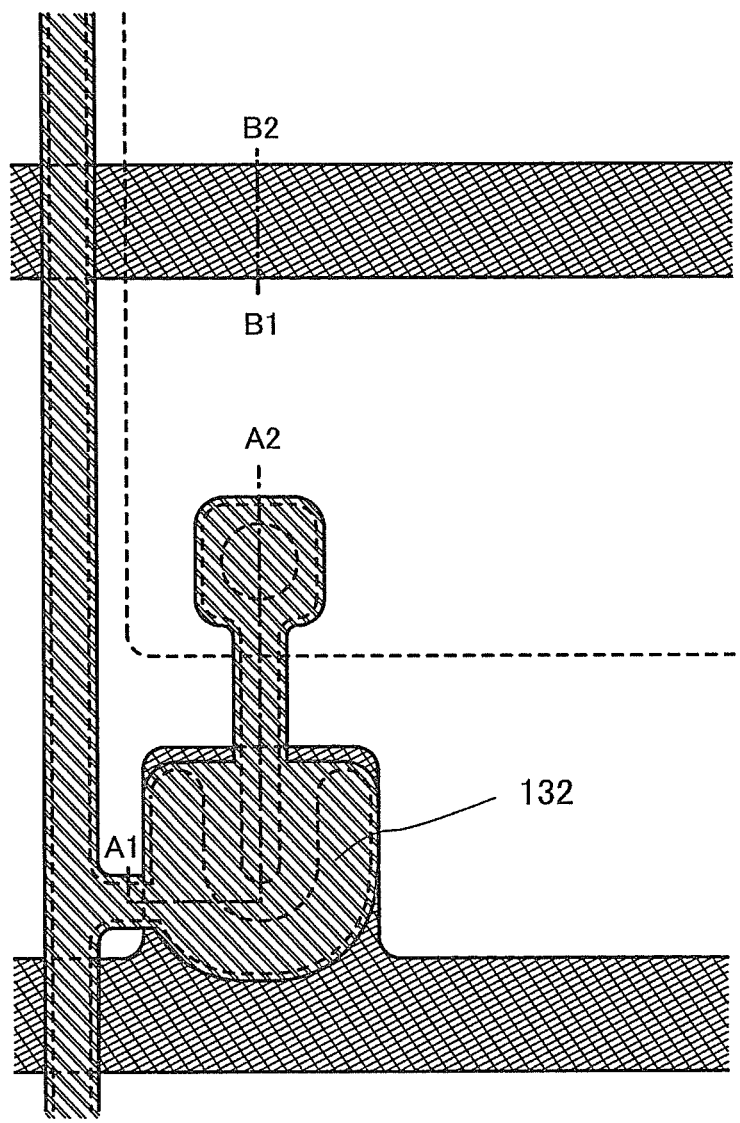
FIG. 8 shows a method for manufacturing a semiconductor device.
Figure 9:
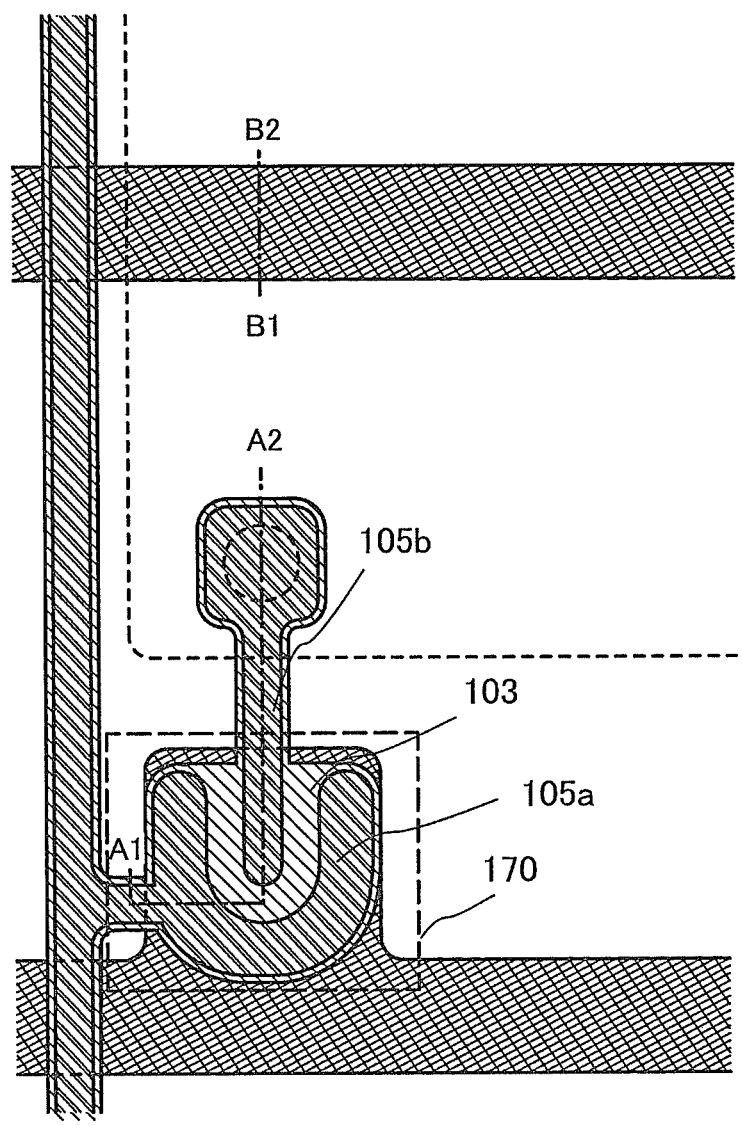
FIG. 9 shows a method for manufacturing a semiconductor device.

Next, a first etching step is performed using the mask 133; accordingly, the first oxide semiconductor film 109 which is the first In—Ga—Zn—O-based non-single-crystal film, the second oxide semiconductor film 111 which is the second In—Ga—Zn—O-based non-single-crystal film, and the conductive film 132 are etched into island shapes. Accordingly, a first oxide semiconductor layer 134, a second oxide semiconductor layer 135, and a conductive layer 136 can be formed (see FIG. 5C). FIG. 8 is a top view showing this state.

In this embodiment, the first etching step is performed by dry etching in which an etching gas is used.

As the etching gas, a gas including chlorine (chlorine-based gas such as chlorine ($Cl_2$), boron chloride ($BCl_3$), silicon chloride ($SiCl_4$), or carbon tetrachloride ($CCl_4$)) is preferably used. With the use of the gas including chlorine in etching, in-plane variation in etching can be reduced as compared to the case of using a gas without chlorine.

Alternatively, a gas including fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to be able to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

In this embodiment, an ICP etching method is employed and the etching condition is as follows: $Cl_2$ and $O_2$ are used; the amount of electric power applied to the coil-shaped electrode is 1500 W; the amount of electric power applied to the electrode on the substrate side is 200 W; a pressure is 1.5 Pa; and a substrate temperature is −10° C.

When the etching is performed using a chlorine-based gas ($Cl_2$) to which an oxygen gas ($O_2$) is added (preferably, the content of oxygen in the etching gas is set to be 15 vol % or more), in the case of using a silicon oxynitride film as the gate insulating layer 102, the selectivity ratio of the In—Ga—Zn—O-based non-single-crystal film used for the first oxide semiconductor layer 134 and the second oxide semiconductor layer 135 with respect to the gate insulating layer 102 can be increased. Therefore, the oxide semiconductor layers can be etched more than the gate insulating layer 102.

By the first etching step in which the first oxide semiconductor film 109, the second oxide semiconductor film 111, and the conductive film 132 are dry-etched, the first oxide semiconductor film 109, the second oxide semiconductor film 111, and the conductive film 132 are etched anisotropically. In this manner, the end portion of the mask 133 is aligned with end portions of the first oxide semiconductor layer 134, the second oxide semiconductor layer 135, and the conductive layer 136, and these end portions become continuous.

Next, the mask 133 is subjected to ashing. As a result, the mask is reduced in size and thickness. Through the ashing, the region of the resist mask, which has small thickness (region overlapping with part of the gate electrode layer 101), is removed, so that divided masks 131 can be formed (see FIG. 3C).

A second etching step is performed using the masks 131; accordingly, the first oxide semiconductor layer 134, the second oxide semiconductor layer 135, and the conductive layer 136 are etched into a semiconductor layer 103, $n^+$ layers 104a and 104b which are source and drain regions, and source and drain electrode layers 105a and 105b. Note that the semiconductor layer 103 is partly etched to become a semiconductor layer having a groove (a depression) and also having an end portion which is partly etched and exposed.

In this embodiment, the second etching step is performed by wet etching in which an etchant is used.

As the etchant, a mixed solution of phosphoric acid, acetic acid, and nitric acid, an ammonia hydrogen peroxide mixture (hydrogen peroxide:ammonia:water=5:2:2), or the like can be used.

The etching condition (etchant, etching time, temperature, or the like) is adjusted as appropriate, depending on a material used for the conductive film 132, so that the films can be etched into desired shapes.

For example, in the case where an aluminum film or an aluminum alloy film is used for the conductive layer 136, wet etching using a mixed solution of phosphoric acid, acetic acid, and nitric acid can be performed. Further, in the case where a titanium film is used for the conductive layer 136, wet etching using an ammonia hydrogen peroxide mixture (hydrogen peroxide:ammonia:water=5:2:2) as the etchant can be performed.

For example, in the case where an aluminum film or an aluminum alloy film is used for the conductive layer 136, the first oxide semiconductor layer 134, the second oxide semiconductor layer 135, and the conductive layer 136 may be etched using a mixed solution of phosphoric acid, acetic acid, and nitric acid as the etchant of the second etching step.

In the second etching step, the conductive layer and the oxide semiconductor layers may be etched using different etchants.

For example, in the case where a titanium film is used for the conductive layer 136, the conductive layer 136 is etched using an ammonia hydrogen peroxide mixture (hydrogen peroxide:ammonia:water=5:2:2) as the etchant of the second etching step, and the first oxide semiconductor layer 134 and the second oxide semiconductor layer 135 may be etched using a mixed solution of phosphoric acid, acetic acid, and nitric acid.

In the second etching step, the first oxide semiconductor layer 134, the second oxide semiconductor layer 135, and the conductive layer 136 may be etched using an ammonia hydrogen peroxide mixture (hydrogen peroxide:ammonia:water=5:2:2) so that a depression of the semiconductor layer 103, the n+ layers 104a and 104b, and the source and drain electrode layers 105a and 105b can be formed.

Through the second etching step in which the first oxide semiconductor layer 134, the second oxide semiconductor layer 135, and the conductive layer 136 are wet-etched, the first oxide semiconductor layer 134, the second oxide semiconductor layer 135, and the conductive layer 136 are etched isotropically. In this manner, the end portions and the depression of the semiconductor layer 103 and the end portions of the $n^+$ layers 104a and 104b and the source and drain electrode layers 105a and 105b are not aligned with the end portions of the masks 131 and further recede, so that the shapes of the end portions have curvature.

Furthermore, the etchant after the wet etching is removed together with the etched materials by cleaning. Waste liquid of the etchant containing the removed materials may be purified to recycle the materials contained in the waste liquid. Materials such as indium contained in the oxide semiconductor layer are collected from the waste liquid after the etching and recycled, so that resources can be effectively used and cost can be reduced.

Next, thermal treatment at 200° C. to 600° C., typically 300° C. to 500° C., is preferably performed. Here, thermal treatment is performed at 350° C. for an hour in a nitrogen atmosphere in a furnace. Through this thermal treatment, rearrangement at the atomic level of the In—Ga—Zn—O-based non-single-crystal film occurs. This thermal treatment (also including photo-annealing) is important in that the distortion that interrupts carrier transport can be released. Note that there is no particular limitation on the timing of the thermal treatment, as long as it is performed after the second In—Ga—Zn—O-based non-single-crystal film is formed. For example, the thermal treatment may be performed after a pixel electrode is formed.

Further, oxygen radical treatment may be performed on the exposed channel formation region of the semiconductor layer 103. By the oxygen radical treatment, the thin film transistor can serve as a normally-off transistor. Moreover, by the radical treatment, the damage of the semiconductor layer 103 due to the etching can be repaired. The radical treatment is preferably performed in an atmosphere of $O_2$, $N_2O$, or an atmosphere of $N_2$, He, Ar, or the like which contains oxygen. Alternatively, an atmosphere obtained by adding $Cl_2$ or $CF_4$ to the above atmosphere may be used. Note that the radical treatment is preferably performed with no bias applied.

Through the above steps, a thin film transistor 170, the channel formation region of which is formed using the semiconductor layer 103, can be completed. FIG. 6A is a cross-sectional view showing this state. Note that FIG. 9 corresponds to the top view of this state.

The second etching step is performed so that a terminal layer 124 formed using the same material as the semiconductor layer 103, a terminal 123 formed using the same material as the $n^+$ layers 104a and 104b, and a second terminal 122 formed using the same material as the source and drain electrode layers 105a and 105b are left in a terminal portion. Note that the second terminal 122 is electrically connected to a source wiring (a source wiring including the source and drain electrode layers 105a and 105b).

With the use of the resist mask having a plurality of (typically two kinds of) thicknesses, which is formed using a multi-tone mask, the number of resist masks can be reduced; therefore, the process can be simplified and cost reduction can be achieved.

Next, the mask 131 is removed, and a protective insulating layer 107 is formed so as to cover the thin film transistor 170. The protective insulating layer 107 can be formed using a silicon nitride film, a silicon oxide film, a silicon oxynitride film, an aluminum oxide film, a tantalum oxide film, or the like which is obtained by a sputtering method or the like.

Next, a third photolithography process is performed to form a resist mask. The gate insulating layer 102 and the protective insulating layer 107 are etched to form a contact hole 125 that reaches the drain electrode layer 105b. Moreover, by this etching, a contact hole 127 that reaches the second terminal 122 and a contact hole 126 that reaches the first terminal 121 are also formed. FIG. 6B is a cross-sectional view showing this state.

Next, the resist mask is removed and then a transparent conductive film is formed. The transparent conductive film is formed using indium oxide ($In_2O_3$), indium oxide-tin oxide alloy ($In_2O_3$—$SnO_2$, abbreviated as ITO), or the like by a sputtering method, a vacuum evaporation method, or the like. Films of these materials are etched using a solution including hydrochloric acid. However, since etching of ITO particularly tends to leave residue, indium oxide-zinc oxide alloy ($In_2O_3$—ZnO) may be used in order to improve etching processability.

Next, a fourth photolithography process is performed to form a resist mask. An unnecessary portion is removed by etching, whereby a pixel electrode layer 110 is formed.

Moreover, by this fourth photolithography process, the capacitor wiring 108 and the pixel electrode layer 110 together form a storage capacitor by using, as a dielectric, the gate insulating layer 102 and the protective insulating layer 107 in a capacitor portion.

Furthermore, in the fourth photolithography process, the first terminal and the second terminal are covered with the resist mask. Accordingly, transparent conductive films 128 and 129 formed in the terminal portions are left. The transparent conductive films 128 and 129 each serve as an electrode or a wiring used for connection to an FPC. The transparent conductive film 128 formed over the first terminal 121 is used for a terminal electrode used for connection which serves as an input terminal of the gate wiring. The transparent conductive film 129 formed over the second terminal 122 is used for a terminal electrode used for connection which serves as an input terminal of the source wiring.

Next, the resist mask is removed. FIG. 6C is a cross-sectional view showing this state. Note that FIG. 10 corresponds to a top view of this state.

FIGS. 11A1 and 11A2, respectively, are a cross-sectional view and a top view and show the gate wiring terminal portion in this state. FIG. 11A1 corresponds to a cross-sectional view taken along E1-E2 of FIG. 11A2. In FIG. 11A1, a transparent conductive film 155 formed over the protective insulating film 154 is used for a terminal electrode for connection which serves as an input terminal. In the terminal portion of FIG. 11A1, a first terminal 151 formed using the same material as the gate wiring overlaps with a connection electrode layer 153 formed using the same material as the source wiring with a gate insulating layer 152, a semiconductor layer 157, and an n+ layer 158 interposed therebetween, and the first terminal 151 and the connection electrode layer 153 are brought into conduction via the transparent conductive film 155. Note that the portion where the transparent conductive film 128 is in contact with the first terminal 121 in FIG. 6C corresponds to a portion where the transparent conductive film 155 is in contact with the first terminal 151 in FIG. 11A1.

FIGS. 11B1 and 11B2, respectively, are a cross-sectional view and a top view and show a source wiring terminal portion which is different from the source wiring terminal portion of FIG. 6C. Moreover, FIG. 11B1 corresponds to a cross-sectional view taken along D1-D2 of FIG. 11B2. In FIG. 11B1, the transparent conductive film 155 formed over the protective insulating film 154 is used for a terminal electrode for connection which serves as an input terminal. In the terminal portion of FIG. 11B1, an electrode layer 156 formed using the same material as the gate wiring is disposed under a second terminal 150 with the gate insulating layer 152 interposed therebetween. The electrode layer 156 is not electrically connected to the second terminal 150, and a capacitor as a counter measure against noise or static electricity can be formed by setting the potential of the electrode layer 156 so as to be different from that of the second terminal 150, for example, floating, GND, 0 V, or the like. The second terminal 150 is electrically connected to the transparent conductive film 155 via the protective insulating film 154.

A plurality of gate wirings, source wirings, and capacitor wirings are provided in accordance with the pixel density. In the terminal portion, a plurality of terminals are arranged: the first terminal having the same potential as the gate wiring; the second terminal having the same potential as the source wiring; a third terminal having the same potential as the capacitor wiring; and the like. The numbers of respective terminals may be determined as appropriate by a practitioner.

Through the four photolithography processes performed in this manner, the storage capacitor and the pixel thin film transistor portion including the thin film transistor 170 which is a bottom-gate n-channel thin film transistor can be completed by using four photomasks. Then, they are arranged in matrix corresponding to pixels, so that a pixel portion is formed; thus, one substrate for use in manufacturing an active matrix display device is obtained. In this specification, such a substrate is called an active matrix substrate for convenience.

In the case of manufacturing an active matrix liquid crystal display device, a liquid crystal layer is provided between an active matrix substrate and a counter substrate which is provided with a counter electrode and then the active matrix substrate and the counter substrate are fixed to each other. Note that a common electrode which is electrically connected to the counter electrode of the counter substrate is provided over the active matrix substrate and a fourth terminal which is electrically connected to the common electrode is provided in the terminal portion. The fourth terminal is used for setting the potential of the common electrode to be fixed, for example GND, 0 V, or the like.

Figure 10:
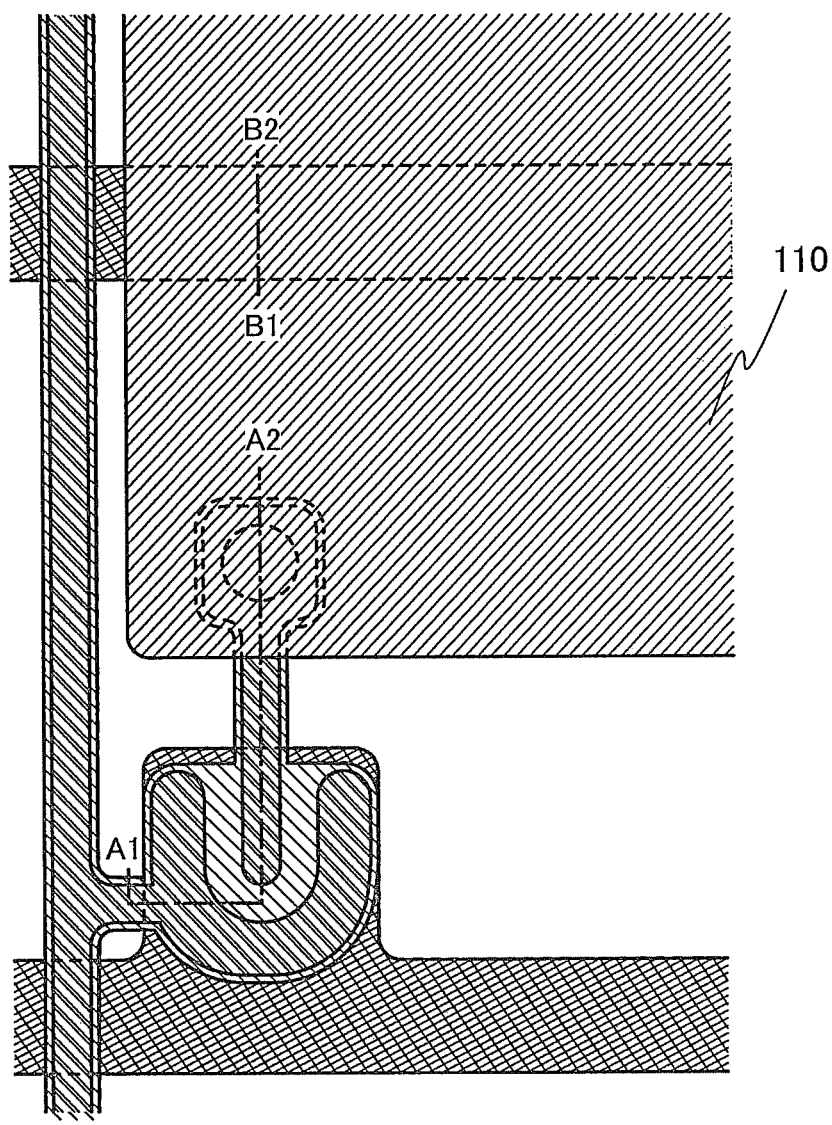
FIG. 10 shows a semiconductor device.
Figure 12:
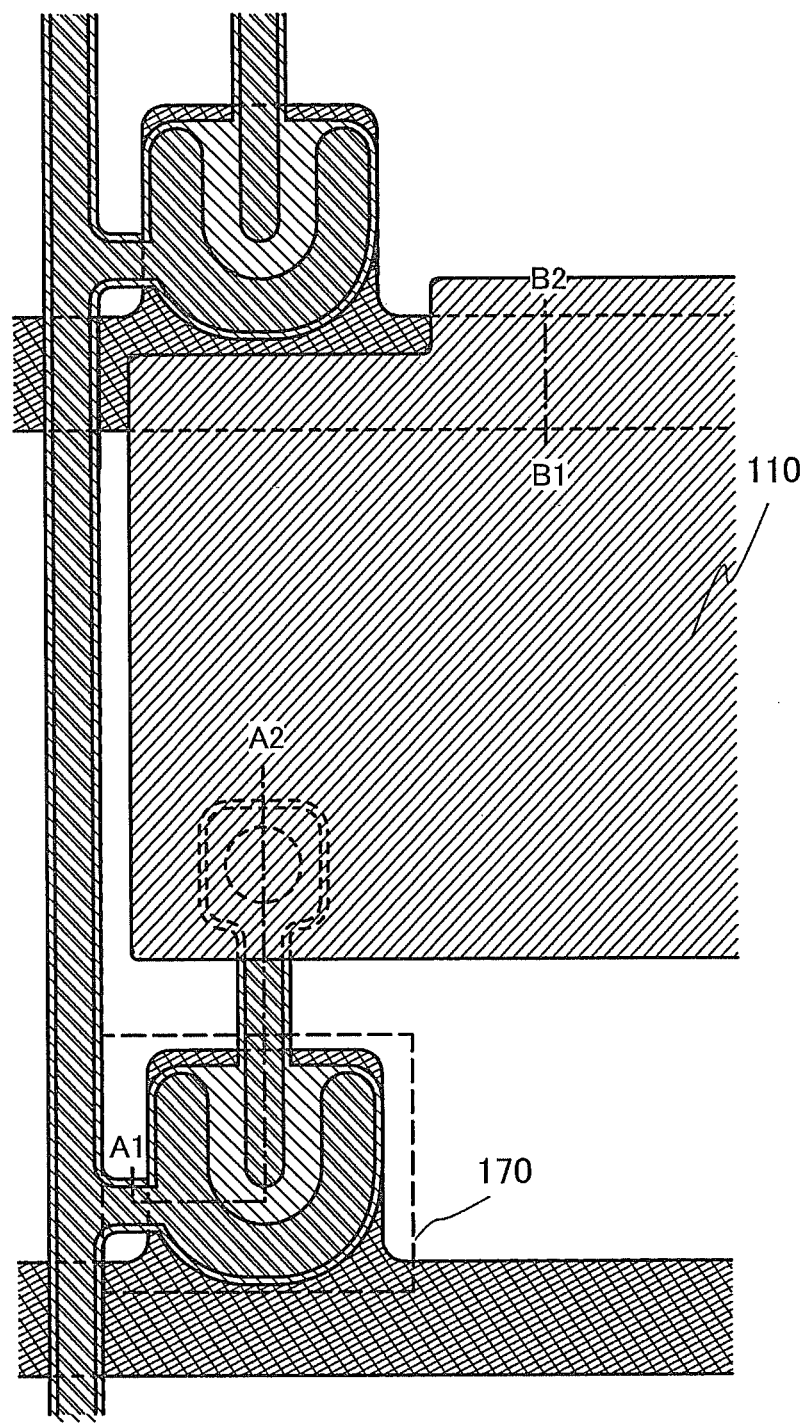
FIG. 12 shows a semiconductor device.

The pixel structure is not limited to the pixel structure shown in FIG. 10. FIG. 12 shows an example of a top view which is different from that in FIG. 10. In the example shown in FIG. 12, the capacitor wiring is not provided and a storage capacitor is formed in such a manner that the pixel electrode overlaps with the gate wiring of the adjacent pixel with the protective insulating film and the gate insulating layer interposed therebetween; in this case, the capacitor wiring and the third terminal connected to the capacitor wiring can be omitted. Note that in FIG. 12, the same portion as in FIG. 10 is denoted by the same reference numeral.

In an active matrix liquid crystal display device, a display pattern is formed on a screen by driving the pixel electrodes arranged in matrix. Specifically, the liquid crystal layer provided between the pixel electrode and the counter electrode is optically modulated by applying voltage between the selected pixel electrode and the counter electrode corresponding to the selected pixel electrode, and this optical modulation is recognized as a display pattern by an observer.

In the display of motion pictures by a liquid crystal display device, the response speed of a liquid crystal molecule itself is slow. Therefore, there are problems of afterimages or blur of motion pictures. In order to improve the characteristics of a liquid crystal display device regarding motion pictures, there is a driving technique by which black display on the entire screen is performed every one frame, which is so-called black insertion.

Moreover, there is a driving technique by which the normal vertical cycle is increased 1.5 times or 2 times or more in order to improve the response speed and the grayscale to be written is selected for every plural fields which have been divided in each frame, which is so-called double frame rate driving.

Moreover, in order to improve the characteristics of a liquid crystal display device regarding motion pictures, there is a driving technique by which a plane light source is formed using a plurality of LEDs (light-emitting diodes), a plurality of EL light sources, or the like and each light source of the plane light source is used independently to perform intermittent lighting driving within one frame period. As the plane light source, three or more kinds of LEDs may be used or an LED that emits white light may be used. Since the plurality of LEDs can be controlled independently, the light emission timing of the LEDs can be synchronized with the timing at which the optical modulation of the liquid crystal layer is switched. By this driving technique, the LED can be partly turned off; therefore, particularly in the case of displaying an image having a large part black display regions in one screen, reduction in power consumption is achieved.

With the use of any of these driving techniques in combination, the display characteristics of a liquid crystal display device, such as the characteristic in displaying motion pictures, can be improved as compared to those of conventional liquid crystal display devices.

In the n-channel transistor obtained in this embodiment, the channel formation region is formed using the In—Ga—Zn—O-based non-single-crystal film and this transistor has favorable operating characteristics. Therefore, these driving techniques can be used in combination.

In the case of manufacturing a light-emitting display device, the potential of one electrode of an organic light-emitting element (also called a cathode) is set to a low power supply potential, for example to GND, 0 V, or the like. Therefore, a terminal portion is provided with a fourth terminal for setting the potential of the cathode to a low power supply potential, for example to GND, 0 V, or the like. Moreover, in the case of manufacturing a light-emitting display device, a power supply line is provided in addition to the source wiring and the gate wiring. Therefore, the terminal portion is provided with a fifth terminal electrically connected to the power supply line.

As described in this embodiment, the use of the oxide semiconductor for the thin film transistor leads to reduction in manufacturing cost.

As in this embodiment, with the use of the resist mask having a plurality of (typically two kinds of) thicknesses, which is formed using a multi-tone mask, the number of resist masks can be reduced; therefore, the process can be simplified and cost reduction can be achieved. Accordingly, a reliable semiconductor device can be manufactured at low cost with high productivity.

This embodiment can be implemented in combination with any of the structures disclosed in the other embodiments, as appropriate.

Embodiment 4

In this embodiment, an example of manufacturing at least part of a driver circuit and a thin film transistor of a pixel portion over one substrate in a display device which is an example of a semiconductor device will be described below.

The thin film transistor in the pixel portion is formed in accordance with any of Embodiments 1 to 3. The thin film transistor described in any of Embodiments 1 to 3 is an n-channel TFT; therefore, part of a driver circuit which can be formed using an n-channel TFT is formed over the same substrate as the thin film transistor of the pixel portion.

Figure 14A:
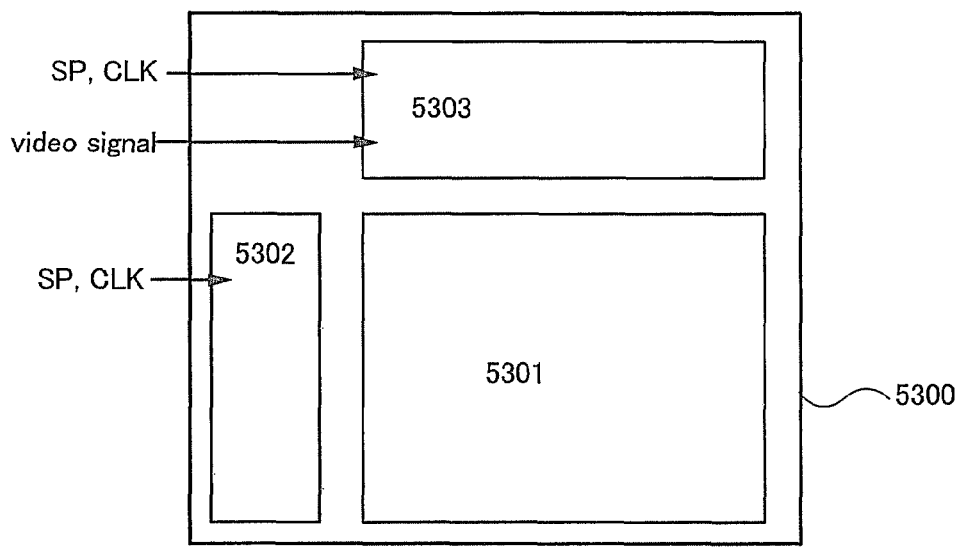
FIGS. 14A and 14B each show a block diagram of a semiconductor device.

FIG. 14A shows an example of a block diagram of an active matrix liquid crystal display device which is an example of a semiconductor device. The display device shown in FIG. 14A includes, over a substrate 5300, a pixel portion 5301 having a plurality of pixels that is each provided with a display element; a scanning-line driver circuit 5302 that selects each pixel; and a signal-line driver circuit 5303 that controls a video signal input to a selected pixel.

The pixel portion 5301 is connected to the signal-line driver circuit 5303 with a plurality of signal lines S1 to Sm (not shown) extending in a column direction from the signal-line driver circuit 5303 and connected to the scanning-line driver circuit 5302 with a plurality of scanning lines G1 to Gn (not shown) extending in a row direction from the scanning-line driver circuit 5302. The pixel portion 5301 includes a plurality of pixels (not shown) arranged in matrix corresponding to the signal lines S1 to Sm and the scanning lines G1 to Gn. In addition, each of the pixels is connected to a signal line Sj (any one of the signal lines S1 to Sm) and a scanning line Gi (any one of the scanning lines G1 to Gn).

The thin film transistor described in any of Embodiments 1 to 3 is an n-channel TFT, and a signal-line driver circuit including an n-channel TFT is described with reference to FIG. 15.

Figure 15:
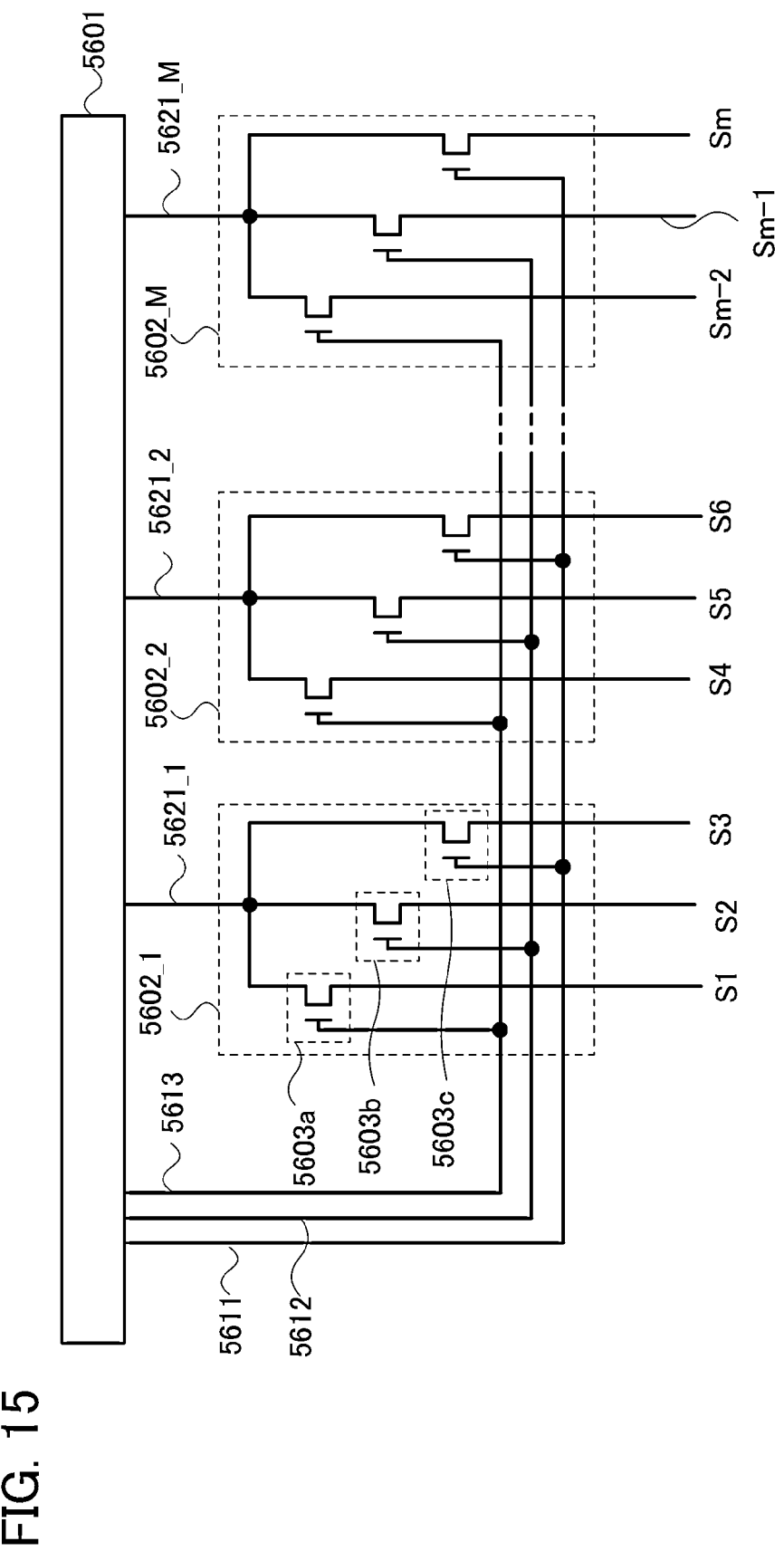
FIG. 15 shows a structure of a signal-line driver circuit.

The signal-line driver circuit shown in FIG. 15 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, the third wiring 5613, and one of the wirings 5621_1 to 5621_M corresponding to the switch groups 5602_1 to 5602_M, respectively. Each of the wirings 5621_1 to 5621_M is connected to three signal lines through the first thin film transistor 5603a, the second thin film transistor 5603b, and the third thin film transistor 5603c. For example, a wiring 5621_J of the J-th column (any one of the wirings 5621_1 to 5621_M) is connected to a signal line Sj−1, a signal line Sj, and a signal line Sj+1 through the first thin film transistor 5603a, the second thin film transistor 5603b, and the third thin film transistor 5603c of a switch group 5602_J.

Note that a signal is inputted to each of the first wiring 5611, the second wiring 5612, and the third wiring 5613.

Note that the driver IC 5601 is preferably formed on a single crystal substrate. Further, the switch groups 5602_1 to 5602_M are preferably formed over the same substrate as the pixel portion. Therefore, the driver IC 5601 is preferably connected to the switch groups 5602_1 to 5602_M through an FPC or the like.

Figure 16:
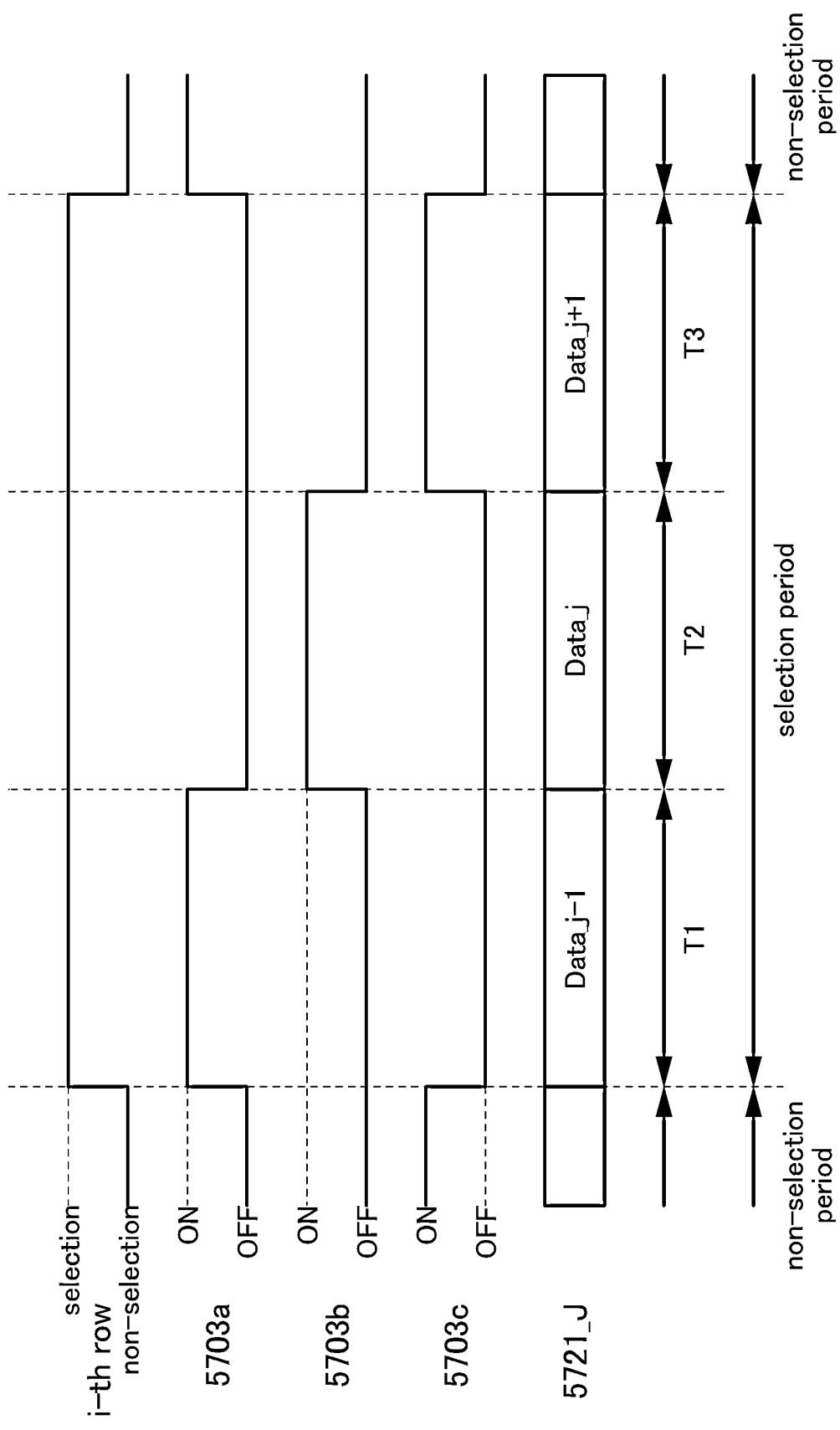
FIG. 16 is a timing chart illustrating operation of the signal-line driver circuit.

Next, operation of the signal-line driver circuit shown in FIG. 15 is described with reference to a timing chart of FIG. 16. FIG. 16 shows the timing chart where the scanning line Gi in the i-th row is selected. Further, a selection period of the scanning line Gi in the i-th row is divided into a first sub-selection period T1, a second sub-selection period T2, and a third sub-selection period T3. Furthermore, the signal-line driver circuit in FIG. 15 operates similarly to that in FIG. 16 even when a scanning line of another row is selected.

Note that the timing chart of FIG. 16 shows the case where the wiring 5621_J in the J-th column is connected to the signal line Sj−1, the signal line Sj, and the signal line Sj+1 through the first thin film transistor 5603a, the second thin film transistor 5603b, and the third thin film transistor 5603c.

The timing chart of FIG. 16 shows timing when the scanning line Gi in the i-th row is selected, timing 5703a of on/off of the first thin film transistor 5603a, timing 5703b of on/off of the second thin film transistor 5603b, timing 5703c of on/off of the third thin film transistor 5603c, and a signal 5721_J inputted to the wiring 5621_J in the J-th column.

In the first sub-selection period T1, the second sub-selection period T2, and the third sub-selection period T3, different video signals are inputted to the wirings 5621_1 to 5621_M. For example, a video signal inputted to the wiring 5621_J in the first sub-selection period T1 is inputted to the signal line Sj−1, a video signal inputted to the wiring 5621_J in the second sub-selection period T2 is inputted to the signal line Sj, and a video signal inputted to the wiring 5621_J in the third sub-selection period T3 is inputted to the signal line Sj+1. The video signals inputted to the wiring 5621_J in the first sub-selection period T1, the second sub-selection period T2, and the third sub-selection period T3 are denoted by Data_j−1, Data_j, and Data_j+1, respectively.

As shown in FIG. 16, in the first sub-selection period T1, the first thin film transistor 5603a is turned on, and the second thin film transistor 5603b and the third thin film transistor 5603c are turned off. At this time, Data_j−1 inputted to the wiring 5621_J is inputted to the signal line Sj−1 through the first thin film transistor 5603a. In the second sub-selection period T2, the second thin film transistor 5603b is turned on, and the first thin film transistor 5603a and the third thin film transistor 5603c are turned off. At this time, Data_j inputted to the wiring 5621J is inputted to the signal line Sj through the second thin film transistor 5603b. In the third sub-selection period T3, the third thin film transistor 5603c is turned on, and the first thin film transistor 5603a and the second thin film transistor 5603b are turned off. At this time, Data_j+1 inputted to the wiring 5621_J is inputted to the signal line Sj+1 through the third thin film transistor 5603c.

As described above, in the signal-line driver circuit of FIG. 15, one gate selection period is divided into three; thus, video signals can be inputted to three signal lines through one wiring 5621 in one gate selection period. Therefore, in the signal-line driver circuit of FIG. 15, the number of connections between the substrate provided with the driver IC 5601 and the substrate provided with the pixel portion can be reduced to approximately one third of the number of signal lines. When the number of connections is reduced to approximately one third of the number of signal lines, the reliability, yield, and the like of the signal-line driver circuit of FIG. 15 can be improved.

Note that there is no particular limitation on the arrangement, number, driving method, and the like of the thin film transistor as long as one gate selection period is divided into a plurality of sub-selection periods and video signals are inputted to a plurality of signal lines from one wiring in each of the plurality of sub-selection periods, as shown in FIG. 15.

For example, when video signals are inputted to three or more signal lines from one wiring in each of three or more sub-selection periods, a thin film transistor and a wiring for controlling the thin film transistor may be added. Note that when one gate selection period is divided into four or more sub-selection periods, one sub-selection period becomes shorter. Therefore, one gate selection period is preferably divided into two or three sub-selection periods.

Figure 17:
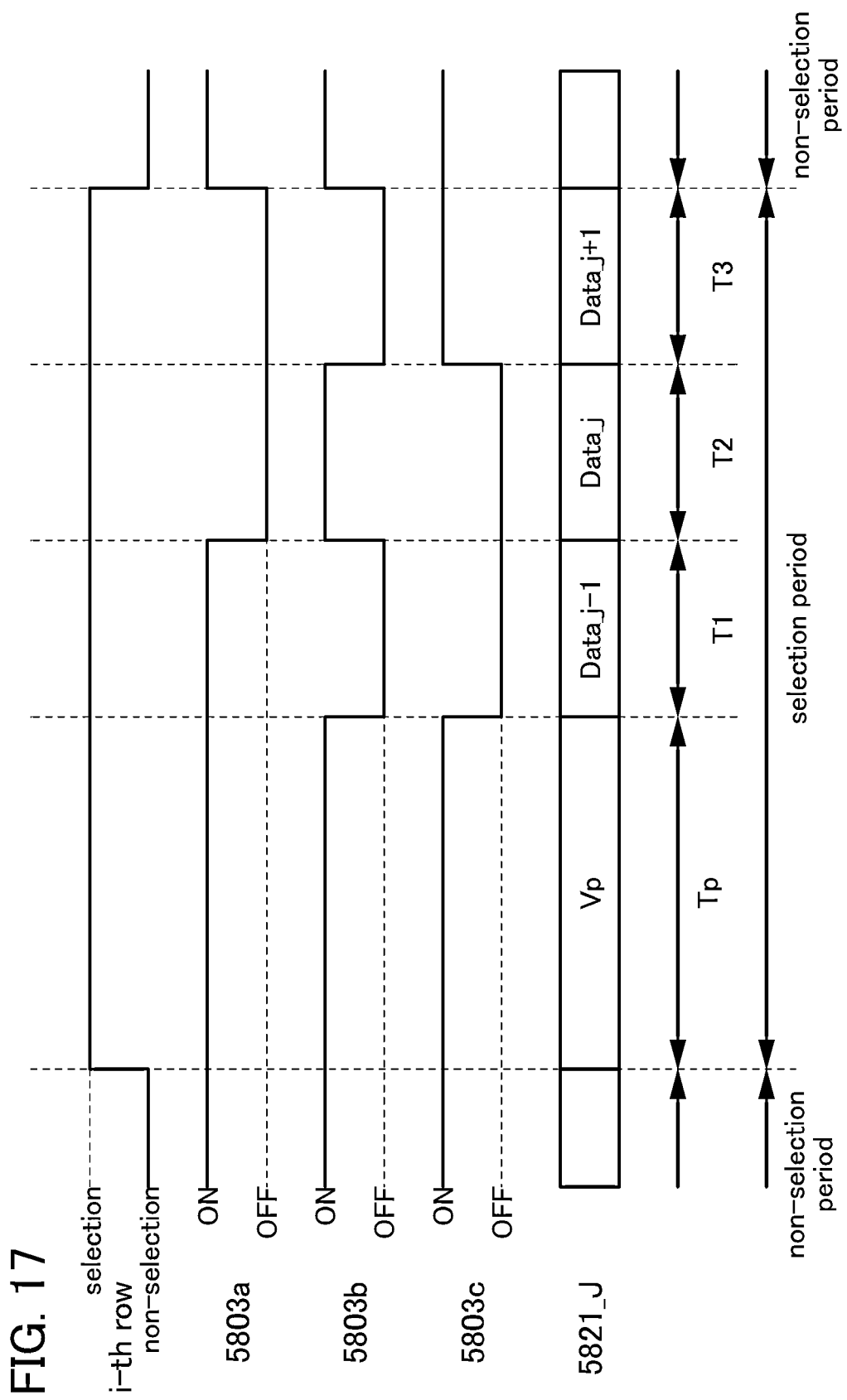
FIG. 17 is a timing chart illustrating operation of the signal-line driver circuit.

As another example, as shown in a timing chart of FIG. 17, one selection period may be divided into a pre-charge period Tp, the first sub-selection period T1, the second sub-selection period T2, and the third sub-selection period T3. Further, the timing chart of FIG. 17 shows timing when the scanning line Gi in the i-th row is selected, timing 5803a of on/off of the first thin film transistor 5603a, timing 5803b of on/off of the second thin film transistor 5603b, timing 5803c of on/off of the third thin film transistor 5603c, and a signal 5821_J inputted to the wiring 5621_J in the J-th column. As shown in FIG. 17, the first thin film transistor 5603a, the second thin film transistor 5603b, and the third thin film transistor 5603c are turned on in the pre-charge period Tp. At this time, a pre-charge voltage $V_p$ inputted to the wiring 5621_J is inputted to the signal line Sj−1, the signal line Sj, and the signal line Sj+1 through the first thin film transistor 5603a, the second thin film transistor 5603b, and the third thin film transistor 5603c, respectively. In the first sub-selection period T1, the first thin film transistor 5603a is turned on, and the second thin film transistor 5603b and the third thin film transistor 5603c are turned off. At this time, Data_j−1 inputted to the wiring 5621_J is inputted to the signal line Sj−1 through the first thin film transistor 5603a. In the second sub-selection period T2, the second thin film transistor 5603b is turned on, and the first thin film transistor 5603a and the third thin film transistor 5603c are turned off. At this time, Data_j inputted to the wiring 5621J is inputted to the signal line Sj through the second thin film transistor 5603b. In the third sub-selection period T3, the third thin film transistor 5603c is turned on, and the first thin film transistor 5603a and the second thin film transistor 5603b are turned off. At this time, Data_j+1 inputted to the wiring 5621_J is inputted to the signal line Sj+1 through the third thin film transistor 5603c.

As described above, in the signal-line driver circuit of FIG. 15, to which the timing chart of FIG. 17 is applied, a signal line can be pre-charged by providing a pre-charge selection period before sub-selection periods. Thus, a video signal can be written to a pixel at high speed. Note that portions in FIG. 17 similar to those in FIG. 16 are denoted by the same reference numerals, and detailed description of the same portions and portions having similar functions is omitted.

In addition, a configuration of the scanning-line driver circuit is described. The scanning-line driver circuit includes a shift register and a buffer. Moreover, a level shifter may be included in some cases. In the scanning-line driver circuit, when a clock signal (CLK) and a start pulse signal (SP) are inputted to the shift register, a selection signal is generated. The generated selection signal is buffered and amplified by the buffer, and the resulting signal is supplied to a corresponding scanning line. Gate electrodes of transistors in pixels corresponding to one line are connected to the scanning line. Further, since the transistors in the pixels of one line have to be turned on at the same time, a buffer which can feed a large amount of current is used for the buffer.

One mode of the shift register used for part of the scanning-line driver circuit is described with reference to FIG. 18 and FIG. 19.

Figure 18:
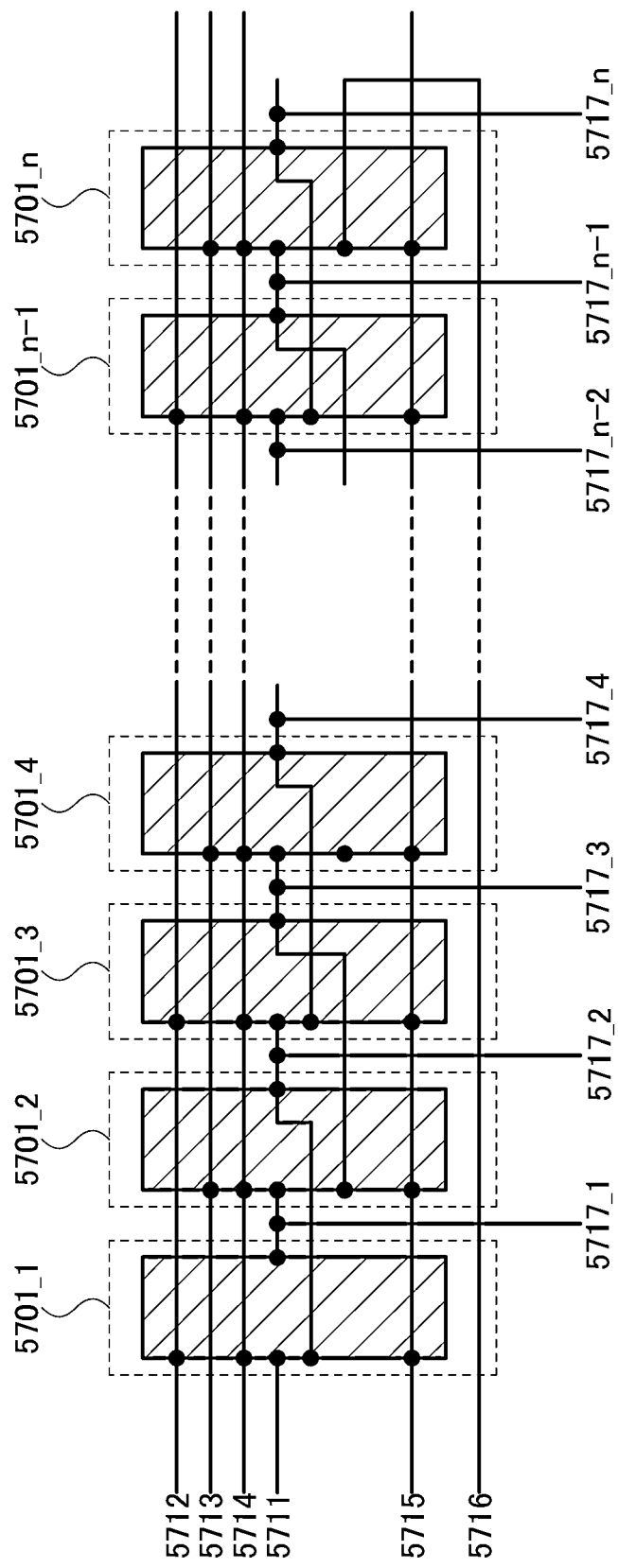
FIG. 18 shows a structure of a shift register.

FIG. 18 shows a circuit configuration of the shift register. The shift register shown in FIG. 18 includes a plurality of flip-flops, flip-flops 5701_1 to 5701_n. Further, the shift register operates by inputting a first clock signal, a second clock signal, a start pulse signal, and a reset signal.

Connection relationships of the shift register in FIG. 18 are described. In a flip-flop 5701_i (any one of the flip-flops 5701_1 to 5701_n) in an i-th stage of the shift register in FIG. 18, a first wiring 5501 shown in FIG. 19 is connected to a seventh wiring 5717_i−1; a second wiring 5502 shown in FIG. 19 is connected to a seventh wiring 5717_i+1; a third wiring 5503 shown in FIG. 19 is connected to a seventh wiring 5717_i; and a sixth wiring 5506 shown in FIG. 19 is connected to a fifth wiring 5715.

Figure 19:
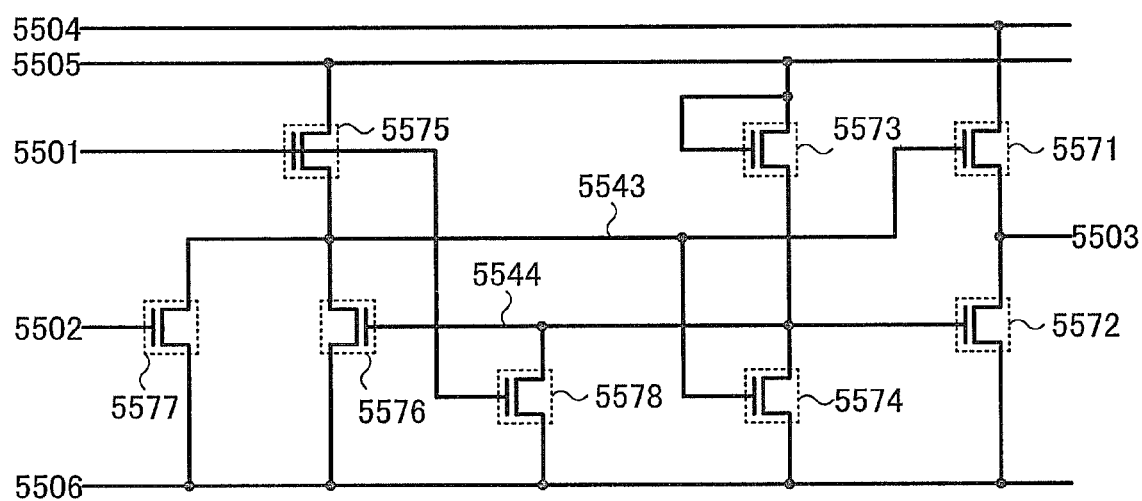
FIG. 19 shows a connection structure of a flip-flop of FIG. 18.

Further, a fourth wiring 5504 shown in FIG. 19 is connected to a second wiring 5712 in a flip-flop in an odd-numbered stage, and is connected to a third wiring 5713 in a flip-flop of an even-numbered stage. A fifth wiring 5505 shown in FIG. 19 is connected to a fourth wiring 5714.

Note that the first wiring 5501 shown in FIG. 19 of the flip-flop 5701_1 of a first stage is connected to a first wiring 5711, and the second wiring 5502 shown in FIG. 19 of the flip-flop 5701_n of an n-th stage is connected to a sixth wiring 5716.

The first wiring 5711, the second wiring 5712, the third wiring 5713, and the sixth wiring 5716 may be called a first signal line, a second signal line, a third signal line, and a fourth signal line, respectively. Further, the fourth wiring 5714 and the fifth wiring 5715 may be called a first power supply line and a second power supply line, respectively.

Next, FIG. 19 shows details of the flip-flop shown in FIG. 18. The flip-flop shown in FIG. 19 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Note that the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 are n-channel transistors, and are brought into an on state when a voltage between a gate and a source ($V_{gs}$) exceeds a threshold voltage ($V_{th}$).

Next, a connection structure of the flip-flop shown in FIG. 19 is described below.

A first electrode (one of a source electrode and a drain electrode) of the first thin film transistor 5571 is connected to the fourth wiring 5504, and a second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505. A second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to the gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the point at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected is referred to as a node 5543. Further, the point at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected is referred to as a node 5544.

The first wiring 5501, the second wiring 5502, the third wiring 5503, and the fourth wiring 5504 may be called a first signal line, a second signal line, a third signal line, and a fourth signal line, respectively. The fifth wiring 5505 and the sixth wiring 5506 may be called a first power supply line and a second power supply line, respectively.

Alternatively, the signal-line driver circuit and the scanning-line driver circuit can be manufactured using only the n-channel TFTs described in Embodiment 1. Since the n-channel TFTs described in Embodiment 1 have high mobility, the driving frequency of the driver circuits can be increased. In addition, parasitic capacitance of the n-channel TFTs described in Embodiment 1 is reduced because of source and drain regions which are formed using an In—Ga—Zn—O-based non-single-crystal film; therefore, the frequency characteristics (which are called f characteristics) of the n-channel TFTs are high. For example, the scanning-line driver circuit including the n-channel TFTs described in Embodiment 1 can operate at high speed; therefore, it is possible to increase the frame frequency or to achieve insertion of a black screen, for example.

In addition, when the channel width of the transistor in the scanning-line driver circuit is increased or a plurality of scanning-line driver circuits are provided, for example, much higher frame frequency can be realized. When a plurality of scanning-line driver circuits are provided, a scanning-line driver circuit for driving even-numbered scanning lines is provided on one side and a scanning-line driver circuit for driving odd-numbered scan lines is provided on the opposite side; thus, increase in frame frequency can be realized. In addition, it is advantageous for increase in size of a display device to output a signal to the same scanning line from the plurality of scanning-line driver circuits.

In the case of manufacturing an active matrix light-emitting display device which is an example of a semiconductor device, a plurality of scanning-line driver circuits are preferably arranged because a plurality of thin film transistors are arranged in at least one pixel. An example of a block diagram of an active matrix light-emitting display device is shown in FIG. 14B.

Figure 14B:
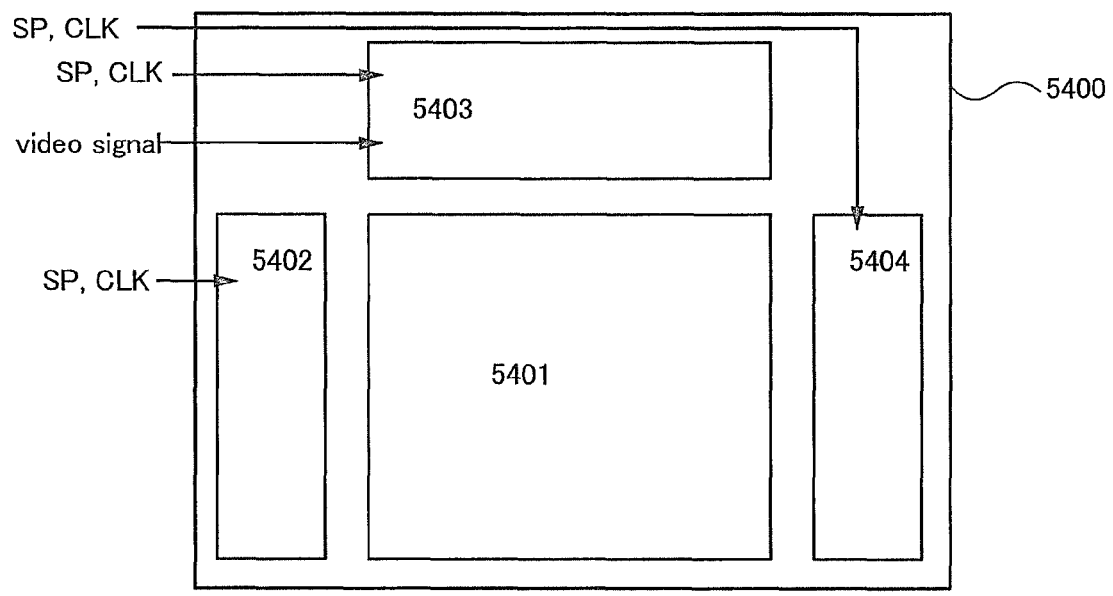

The light-emitting display device shown in FIG. 14B includes, over a substrate 5400, a pixel portion 5401 having a plurality of pixels each provided with a display element; a first scanning-line driver circuit 5402 and a second scanning-line driver circuit 5404 that select each pixel; and a signal-line driver circuit 5403 that controls a video signal input to a selected pixel.

In the case of inputting a digital video signal to the pixel of the light-emitting display device shown in FIG. 14B, the pixel is put in a light-emitting state or a non-light-emitting state by switching on/off of a transistor. Thus, grayscale can be displayed using an area-ratio grayscale method or a time-ratio grayscale method. An area-ratio grayscale method refers to a driving method by which one pixel is divided into a plurality of sub-pixels and the respective sub-pixels are driven separately based on video signals so that grayscale is displayed. Further, a time-ratio grayscale method refers to a driving method by which a period during which a pixel is in a light-emitting state is controlled so that grayscale is displayed.

Since the response time of light-emitting elements is shorter than that of liquid crystal elements or the like, the light-emitting elements are suitable for a time-ratio grayscale method. Specifically, in the case of displaying with a time gray scale method, one frame period is divided into a plurality of sub-frame periods. Then, in accordance with video signals, the light-emitting element in the pixel is put in a light-emitting state or a non-light-emitting state in each sub-frame period. By dividing a frame into a plurality of sub-frames, the total length of time, in which pixels actually emit light in one frame period, can be controlled with video signals to display gray scales.

Note that in the light-emitting display device shown in FIG. 14B, in the case where one pixel includes two switching TFTs, a signal which is inputted to a first scanning line serving as a gate wiring of one of the switching TFTs is generated from the first scanning-line driver circuit 5402 and a signal which is inputted to a second scanning line serving as a gate wiring of the other of the switching TFTs is generated from the second scanning-line driver circuit 5404. However, the signal which is inputted to the first scanning line and the signal which is inputted to the second scanning line may be generated together from one scanning-line driver circuit. In addition, for example, there is a possibility that a plurality of the scanning lines used for controlling the operation of the switching element be provided in each pixel depending on the number of switching TFTs included in one pixel. In this case, the signals which are inputted to the plurality of scanning lines may be generated all from one scanning-line driver circuit or may be generated from a plurality of scanning-line driver circuits.

Even in the light-emitting display device, part of the driver circuit which can be formed using the n-channel TFTs can be provided over the same substrate as the thin film transistors of the pixel portion. Moreover, the signal-line driver circuit and the scanning-line driver circuit can be manufactured using only the n-channel TFTs described in any of Embodiments 1 to 3.

The aforementioned driver circuits may be used for not only a liquid crystal display device or a light-emitting display device but also electronic paper in which electronic ink is driven by utilizing an element electrically connected to a switching element. The electronic paper is also called an electrophoretic display device (electrophoretic display) and has advantages in that it has the same level of readability as regular paper, it has less power consumption than other display devices, and it can be set to have a thin and light form.

There is a variety of modes of electrophoretic displays. The electrophoretic display is a device in which a plurality of microcapsules each including first particles having positive charge and second particles having negative charge are dispersed in a solvent or a solute, and an electrical field is applied to the microcapsules so that the particles in the microcapsules move in opposite directions from each other, and only a color of the particles gathered on one side is displayed. Note that the first particles or the second particles include a colorant, and does not move when there is no electric field. In addition, a color of the first particles is different from a color of the second particles (the particles may also be colorless).

Thus, the electrophoretic display utilizes a so-called dielectrophoretic effect in which a substance with high dielectric constant moves to a region with high electric field. The electrophoretic display does not require a polarizing plate and a counter substrate, which are necessary for a liquid crystal display device, so that the thickness and weight thereof are about half.

That which the microcapsules are dispersed in a solvent is called electronic ink, and this electronic ink can be printed on a surface of glass, plastic, fabric, paper, or the like. Color display is also possible with the use of a color filter or particles including a coloring matter.

In addition, an active matrix display device can be completed by providing, as appropriate, a plurality of the microcapsules over an active matrix substrate so as to be interposed between two electrodes, and can perform display by application of electric field to the microcapsules. For example, the active matrix substrate obtained using the thin film transistor of any of Embodiments 1 to 3 can be used.

Note that the first particles and the second particles in the microcapsule may be formed from one of a conductive material, an insulating material, a semiconductor material, a magnetic material, a liquid crystal material, a ferroelectric material, an electroluminescent material, an electrochromic material, and a magnetophoretic material, or a composite material thereof.

Through the above process, a highly reliable light-emitting display device as a semiconductor device can be manufactured.

This embodiment can be implemented in combination with any of the structures described in the other embodiments, as appropriate.

Embodiment 5

A thin film transistor can be manufactured, and the thin film transistor can be used for a pixel portion and further for a driver circuit, so that a semiconductor device having a display function (also referred to as a display device) can be manufactured. Moreover, a thin film transistor can be used for part of a driver circuit or an entire driver circuit formed over the same substrate as a pixel portion, so that a system-on-panel can be formed.

The display device includes a display element. As the display element, a liquid crystal element (also referred to as a liquid crystal display element) or a light-emitting element (also referred to as a light-emitting display element) can be used. A light-emitting element includes, in its scope, an element whose luminance is controlled by current or voltage, and specifically includes an inorganic electroluminescent (EL) element, an organic EL element, and the like. Further, a display medium whose contrast is changed by an electric effect, such as electronic ink, can be used.

In addition, the display device includes a panel in which a display element is sealed, and a module in which an IC and the like including a controller are mounted on the panel. Regarding one mode of an element substrate before the display element is completed in a process for manufacturing the display device, the element substrate is provided with a unit which can supply current to the display element in each of a plurality of pixels. Specifically, the element substrate may be in a state provided with only a pixel electrode of the display element, a state after a conductive film to be a pixel electrode is formed and before the conductive film is etched to form the pixel electrode, or any other states.

A display device in this specification refers to an image display device, a display device, or a light source (including a lighting device). Further, the display device includes any of the following modules in its category: a module including a connector such as an flexible printed circuit (FPC), a tape automated bonding (TAB) tape, or a tape carrier package (TCP); a module having a TAB tape or a TCP which is provided with a printed wiring board at the end thereof; and a module having an integrated circuit (IC) which is directly mounted on a display element by a chip-on-glass (COG) method.

The appearance and a cross section of a liquid crystal display panel which is one mode of a semiconductor device will be described in this embodiment with reference to FIGS. 22A1 and 22A2, and FIG. 22B. FIGS. 22A1 and 22A2 are top views of a panel in each of which highly reliable thin film transistors 4010 and 4011 that include semiconductor layers of the In—Ga—Zn—O-based non-single-crystal films described in Embodiment 1 and a liquid crystal element 4013, which are formed over a first substrate 4001, are sealed with a sealant 4005 between the first substrate 4001 and a second substrate 4006. FIG. 22B corresponds to a cross-sectional view of FIGS. 22A1 and 22A2 along line M-N.

The sealant 4005 is provided so as to surround a pixel portion 4002 and a scanning-line driver circuit 4004 which are provided over the first substrate 4001. The second substrate 4006 is provided over the pixel portion 4002 and the scanning-line driver circuit 4004. Thus, the pixel portion 4002 and the scanning-line driver circuit 4004 as well as a liquid crystal layer 4008 are sealed with the sealant 4005 between the first substrate 4001 and the second substrate 4006. A signal-line driver circuit 4003 which is formed using a single crystal semiconductor film or a polycrystalline semiconductor film over a substrate which is prepared separately is mounted in a region that is different from the region surrounded by the sealant 4005 over the first substrate 4001.

Note that there is no particular limitation on a connection method of the driver circuit which is separately formed, and a COG method, a wire bonding method, a TAB method, or the like can be used. FIG. 22A1 shows an example in which the signal-line driver circuit 4003 is mounted by a COG method, and FIG. 22A2 shows an example in which the signal-line driver circuit 4003 is mounted by a TAB method.

Each of the pixel portion 4002 and the scanning-line driver circuit 4004 which are provided over the first substrate 4001 includes a plurality of thin film transistors. FIG. 22B shows the thin film transistor 4010 included in the pixel portion 4002 and the thin film transistor 4011 included in the scanning-line driver circuit 4004. Insulating layers 4020 and 4021 are provided over the thin film transistors 4010 and 4011.

As each of the thin film transistors 4010 and 4011, the highly reliable thin film transistor shown in Embodiment 3 including the In—Ga—Zn—O-based non-single-crystal film as the semiconductor layer can be used. Alternatively, the thin film transistor described in Embodiment 1 or 2 may be applied. In this embodiment, the thin film transistors 4010 and 4011 are each an n-channel thin film transistor.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with each other corresponds to the liquid crystal element 4013. Note that the pixel electrode layer 4030 and the counter electrode layer 4031 are provided with an insulating layer 4032 and an insulating layer 4033 serving as orientation films, respectively, and the liquid crystal layer 4008 is interposed between the insulating layers 4032 and 4033.

Note that the first substrate 4001 and the second substrate 4006 can be formed from glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films can be used.

A columnar spacer 4035 which is formed by etching an insulating film selectively is provided to control a distance (a cell gap) between the pixel electrode layer 4030 and the counter electrode layer 4031. Alternatively, a spherical spacer may be used. In addition, the counter electrode layer 4031 is electrically connected to a common potential line provided over the same substrate as the thin film transistor 4010. The counter electrode layer 4031 and the common potential line are electrically connected to each other through conductive particles which are arranged between the pair of substrates using a common connection portion. Note that the conductive particles are contained in the sealant 4005.

Alternatively, a blue phase liquid crystal without an orientation film may be used. A blue phase is a type of liquid crystal phase which appears just before a cholesteric liquid crystal changes into an isotropic phase when the temperature of the cholesteric liquid crystal is increased. A blue phase appears only within narrow temperature range; therefore, the liquid crystal layer 4008 is formed using a liquid crystal composition in which a chiral agent of 5 wt. % or more is mixed in order to expand the temperature range. The liquid crystal composition including a blue phase liquid crystal and a chiral agent has a short response time of 10 µs to 100 µs and is optically isotropic; therefore, orientation treatment is not necessary and viewing angle dependence is small.

Note that this embodiment describes an example of a transmissive liquid crystal display device; however, the present invention can be applied to a reflective liquid crystal display device or a semi-transmissive liquid crystal display device.

Although a liquid crystal display device of this embodiment has a polarizer provided outer than the substrate (the viewer side) and a color layer and an electrode layer of a display element provided inner than the substrate, which are arranged in that order, the polarizer may be inner than the substrate. The stacked structure of the polarizer and the color layer is not limited to that shown in this embodiment and may be set as appropriate in accordance with the materials of the polarizer and the color layer and the condition of the manufacturing process. Further, a light-blocking film serving as a black matrix may be provided.

In this embodiment, in order to reduce the unevenness of the surface of the thin film transistors and to improve the reliability of the thin film transistors, the thin film transistors which are obtained in Embodiment 3 are covered with protective films or insulating layers (the insulating layers 4020 and 4021) serving as planarizing insulating films. Note that the protective film is provided to prevent entry of a contaminant impurity such as an organic substance, a metal substance, or moisture floating in the atmosphere, and therefore a dense film is preferable. The protective film may be formed using a single layer or a stack of layers of a silicon oxide film, a silicon nitride film, a silicon oxynitride film, a silicon nitride oxide film, an aluminum oxide film, an aluminum nitride film, an aluminum oxynitride film, or an aluminum nitride oxide film. Although the protective film is formed by a sputtering method in this embodiment, the method is not particularly limited and may be selected from a variety of methods.

Here, the insulating layer 4020 is formed to have a stacked structure as the protective film. Here, a silicon oxide film is formed by a sputtering method as a first layer of the insulating layer 4020. The use of a silicon oxide film for the protective film provides an advantageous effect of preventing hillock of an aluminum film used for a source electrode layer and a drain electrode layer.

Moreover, an insulating layer is formed as a second layer of the protective film. Here, a silicon nitride film is formed by a sputtering method as a second layer of the insulating layer 4020. When a silicon nitride film is used for the protective film, it is possible to prevent movable ions such as sodium from entering a semiconductor region to vary the electrical characteristics of the TFT.

Further, after the protective film is formed, the semiconductor layer may be annealed (at 300° C. to 400° C.).

Further, the insulating layer 4021 is formed as the planarizing insulating film. The insulating layer 4021 can be formed from an organic material having heat resistance, such as polyimide, acrylic, benzocyclobutene, polyamide, or epoxy. As an alternative to such organic materials, it is possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

Note that a siloxane-based resin is a resin formed from a siloxane-based material as a starting material and having the bond of Si—O—Si. The siloxane-based resin may include as a substituent an organic group (for example, an alkyl group or an aryl group) or a fluoro group. Alternatively, the organic group may include a fluoro group.

The method for the formation of the insulating layer 4021 is not particularly limited and any of the following methods can be used depending on the material of the insulating layer 4021: a sputtering method, an SOG method, spin coating, dip coating, spray coating, a droplet discharge method (e.g., an inkjet method, screen printing, or offset printing), a doctor knife, a roll coater, a curtain coater, a knife coater, or the like. In the case of forming the insulating layer 4021 with the use of a material solution, annealing (300° C. to 400° C.) may be performed on the semiconductor layer at the same time as a baking step. When the baking of the insulating layer 4021 and the annealing of the semiconductor layer are performed at the same time, a semiconductor device can be manufactured efficiently.

The pixel electrode layer 4030 and the counter electrode layer 4031 can be formed from a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition including a conductive macromolecule (also referred to as a conductive polymer) can be used for the pixel electrode layer 4030 and the counter electrode layer 4031. The pixel electrode formed using the conductive composition has preferably a sheet resistance of 10000 ohm/square or less and a transmittance of 70% or more at a wavelength of 550 nm. Further, the resistivity of the conductive high molecule included in the conductive composition is preferably 0.1 Ω·cm or less.

As the conductive macromolecule, a so-called π-electron conjugated conductive macromolecule can be used. As examples thereof, polyaniline or a derivative thereof, polypyrrole or a derivative thereof, polythiophene or a derivative thereof, a copolymer of two or more kinds of them, and the like can be given.

Further, a variety of signals and potentials are supplied from an FPC 4018 to the signal-line driver circuit 4003 which is formed separately, the scanning-line driver circuit 4004, and the pixel portion 4002.

In this embodiment, a connecting terminal electrode 4015 is formed using the same conductive film as the pixel electrode layer 4030 included in the liquid crystal element 4013. A terminal electrode 4016 is formed using the same conductive film as the source and drain electrode layers included in the thin film transistors 4010 and 4011. Note that the connection terminal electrode 4015 and the terminal electrode 4016 are formed over an n+ layer 4025 and a semiconductor layer 4026.

The connecting terminal electrode 4015 is electrically connected to a terminal of the FPC 4018 through an anisotropic conductive film 4019.

Although FIGS. 22A1, 22A2, and 22B show an example in which the signal-line driver circuit 4003 is formed separately and mounted on the first substrate 4001, this embodiment is not limited to this structure. The scanning-line driver circuit may be separately formed and then mounted, or only part of the signal-line driver circuit or part of the scanning-line driver circuit may be separately formed and then mounted.

Figure 23:
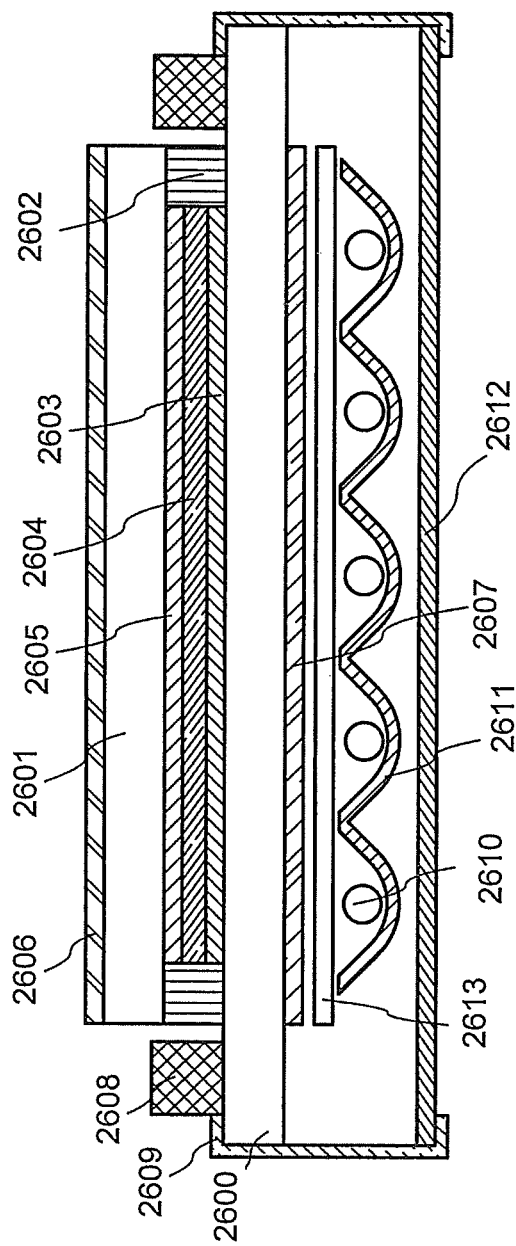
FIG. 23 shows a semiconductor device.

FIG. 23 shows an example in which a liquid crystal display module is formed as a semiconductor device using a TFT substrate 2600 which is manufactured according to the manufacturing method disclosed in this specification.

FIG. 23 shows an example of a liquid crystal display module, in which the TFT substrate 2600 and a counter substrate 2601 are fixed to each other with a sealant 2602, and a pixel portion 2603 including a TFT and the like, a display element 2604 including a liquid crystal layer, and a color layer 2605 are provided between the substrates to form a display region. The color layer 2605 is necessary to perform color display. In the case of the RGB system, respective colored layers corresponding to colors of red, green, and blue are provided for respective pixels. Polarizing plates 2606 and 2607 and a diffuser plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609 and includes an external circuit such as a control circuit and a power source circuit. The polarizing plate and the liquid crystal layer may be stacked with a retardation plate interposed therebetween.

For the liquid crystal display module, a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Fenoelectric Liquid Crystal) mode, an AFLC (Anti-Ferroelectric Liquid Crystal) mode, or the like can be used.

Through the above process, a highly reliable liquid crystal display panel as a semiconductor device can be manufactured.

This embodiment can be implemented in combination with any of the structures described in the other embodiments, as appropriate.

Embodiment 6

In this embodiment, an example of electronic paper is shown as a semiconductor device.

Figure 13:
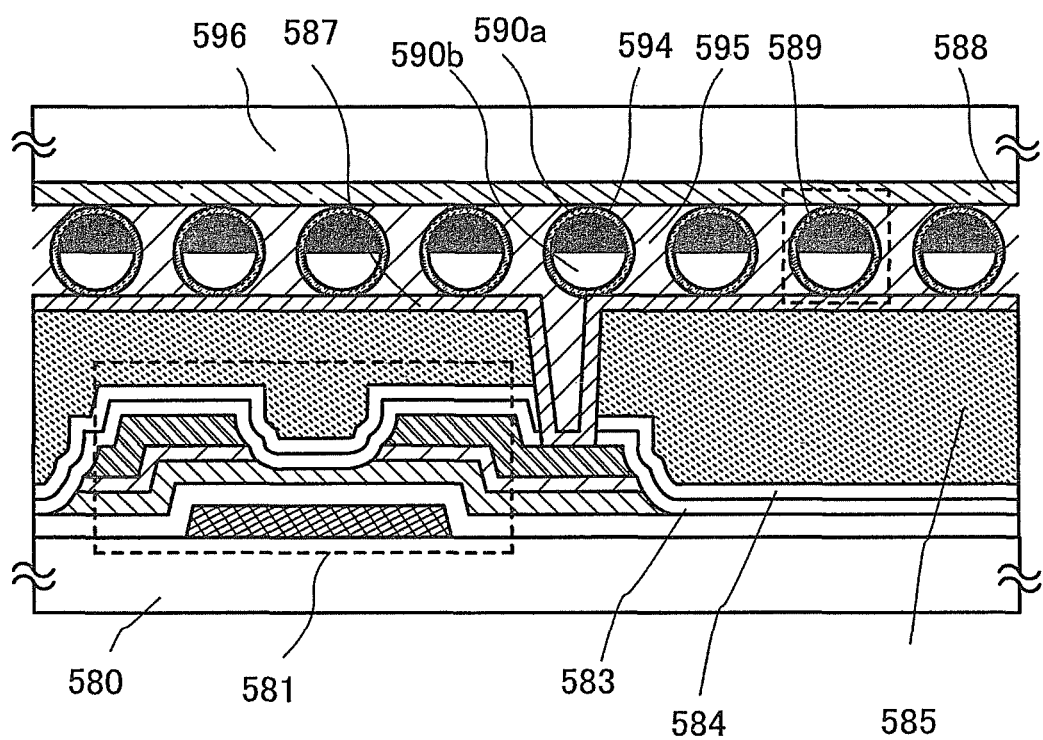
FIG. 13 shows a semiconductor device.

FIG. 13 shows active matrix electronic paper as an example of a semiconductor device. A thin film transistor 581 used for a semiconductor device, which can be manufactured in a manner similar to that of the thin film transistor described in Embodiment 3, is a highly reliable thin film transistor including an In—Ga—Zn—O-based non-single-crystal film as a semiconductor layer. Alternatively, the thin film transistor described in Embodiment 1 or 2 can be employed as the thin film transistor 581 described in this embodiment.

The electronic paper in FIG. 13 is an example of a display device in which a twisting ball display system is employed. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over a substrate 580 has a bottom-gate structure in which the source and drain electrode layer is electrically connected to a first electrode layer 587 through an opening formed in an insulating layer 583, an insulating layer 584, and an insulating layer 585. Between the first electrode layer 587 and a second electrode layer 588, spherical particles 589 are provided. Each spherical particle 589 includes a black region 590a and a white region 590b, and a cavity 594 filled with liquid around the black region 590a and the white region 590b. The circumference of the spherical particle 589 is filled with filler 595 such as a resin (see FIG. 13). In this embodiment, the first electrode layer 587 corresponds to a pixel electrode, and the second electrode layer 588 corresponds to a common electrode. The second electrode layer 588 is electrically connected to a common potential line provided over the same substrate 580 as the thin film transistor 581. The second electrode layer 588 and the common potential line are electrically connected through conductive particles arranged between a pair of substrates using the common connection portion.

Further, instead of the twisting ball, an electrophoretic element can be used. A microcapsule having a diameter of approximately 10 μm to 200 μm, which is filled with transparent liquid, positively-charged white microparticles, and negatively-charged black microparticles, is used. In the microcapsule which is provided between the first electrode layer and the second electrode layer, when an electric field is applied by the first electrode layer and the second electrode layer, the white microparticles and the black microparticles move to opposite sides to each other, so that white or black can be displayed. A display element using this principle is an electrophoretic display element, and is called electronic paper in general. The electrophoretic display element has higher reflectance than a liquid crystal display element, and thus an assistant light is unnecessary. Moreover, power consumption is low and a display portion can be recognized even in a dusky place. Furthermore, an image which is displayed once can be retained even when power is not supplied to the display portion. Accordingly, a displayed image can be stored even though a semiconductor device having a display function (which is also simply referred to as a display device or a semiconductor device provided with a display device) is distanced from an electric wave source.

Through the above process, highly reliable electronic paper as a semiconductor device can be manufactured.

This embodiment can be implemented in combination with any of the structures described in the other embodiments, as appropriate.

Embodiment 7

This embodiment describes an example of a light-emitting display device as a semiconductor device. As an example of a display element of the display device, here, a light-emitting element utilizing electroluminescence is used. Light-emitting elements utilizing electroluminescence are classified according to whether a light-emitting material is an organic compound or an inorganic compound. In general, the former is referred to as an organic EL element and the latter is referred to as an inorganic EL element.

In an organic EL element, by application of voltage to a light-emitting element, electrons and holes are separately injected from a pair of electrodes into a layer containing a light-emitting organic compound, and thus current flows. Then, those carriers (electrons and holes) are recombined, and thus the light-emitting organic compound is excited. When the light-emitting organic compound returns to a ground state from the excited state, light is emitted. Owing to such a mechanism, such a light-emitting element is referred to as a current-excitation light-emitting element.

Inorganic EL elements are classified according to their element structures into a dispersion type inorganic EL element and a thin-film type inorganic EL element. A dispersion type inorganic EL element has a light-emitting layer where particles of a light-emitting material are dispersed in a binder, and its light emission mechanism is donor-acceptor recombination type light emission that utilizes a donor level and an acceptor level. A thin-film type inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made using an organic EL element as a light-emitting element.

Figure 20:
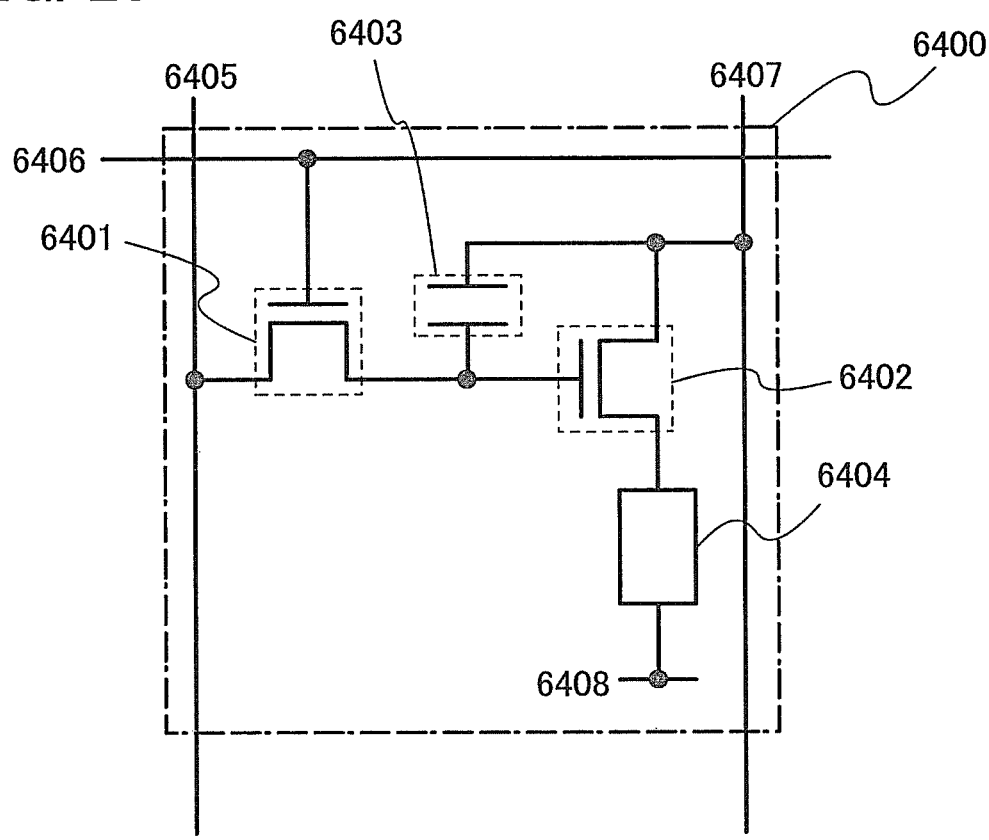
FIG. 20 shows an equivalent circuit of a pixel in a semiconductor device.

FIG. 20 shows an example of a pixel structure to which digital time grayscale driving can be applied, as an example of a semiconductor device.

A structure and operation of a pixel to which digital time grayscale driving can be applied are described. In this example, one pixel includes two n-channel transistors in each of which a channel formation region includes an oxide semiconductor layer (In—Ga—Zn—O-based non-single-crystal film).

A pixel 6400 includes a switching transistor 6401, a driver transistor 6402, a light-emitting element 6404, and a capacitor 6403. A gate of the switching transistor 6401 is connected to a scanning line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 through the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line formed over one substrate.

The second electrode (common electrode 6408) of the light-emitting element 6404 is set to a low power supply potential. The low power supply potential is a potential satisfying the low power supply potential <a high power supply potential when the high power supply potential set to the power supply line 6407 is a reference. As the low power supply potential, for example, GND, 0 V, or the like may be employed. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is greater than or equal to forward threshold voltage of the light-emitting element 6404.

Note that gate capacitor of the driver transistor 6402 may be used as a substitute for the capacitor 6403, so that the capacitor 6403 can be omitted. The gate capacitance of the driver transistor 6402 may be formed between the channel region and the gate electrode.

In the case of a voltage-input voltage driving method, a video signal is inputted to the gate of the driver transistor 6402 so that the driver transistor 6402 is in either of two states of being sufficiently turned on and turned off. That is, the driver transistor 6402 operates in a linear region. In order for the driver transistor 6402 to operate in a linear region, a voltage higher than the voltage of the power supply line 6407 is applied to the gate of the driver transistor 6402. Note that a voltage higher than or equal to voltage of the power supply line+$V_{th}$ of the driver transistor 6402 is applied to the signal line 6405.

In the case of performing analog grayscale driving instead of digital time grayscale driving, the same pixel structure as that in FIG. 20 can be used by changing signal input.

In the case of performing analog grayscale driving, a voltage higher than or equal to forward voltage of the light-emitting element 6404+$V_{th}$ of the driver transistor 6402 is applied to the gate of the driver transistor 6402. The forward voltage of the light-emitting element 6404 indicates a voltage at which a desired luminance is obtained, and includes at least forward threshold voltage. The video signal by which the driver transistor 6402 operates in a saturation region is inputted, so that current can be supplied to the light-emitting element 6404. In order for the driver transistor 6402 to operate in a saturation region, the potential of the power supply line 6407 is set higher than the gate potential of the driver transistor 6402. When an analog video signal is used, it is possible to supply current to the light-emitting element 6404 in accordance with the video signal and perform analog grayscale driving.

Note that the pixel structure shown in FIG. 20 is not limited thereto. For example, a switch, a resistor, a capacitor, a transistor, a logic circuit, or the like may be added to the pixel shown in FIG. 20.

Figure 21A:
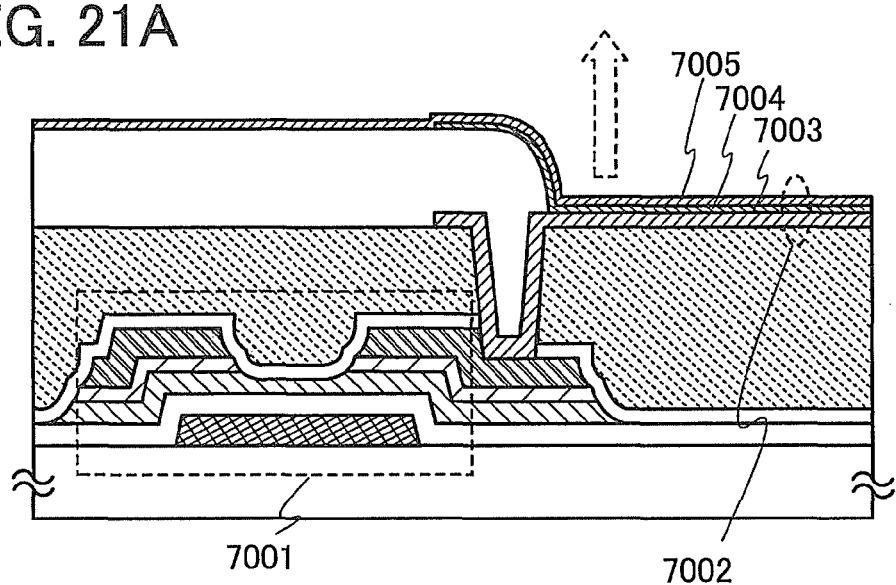
FIGS. 21A to 21C each show a semiconductor device.
Figure 21B:
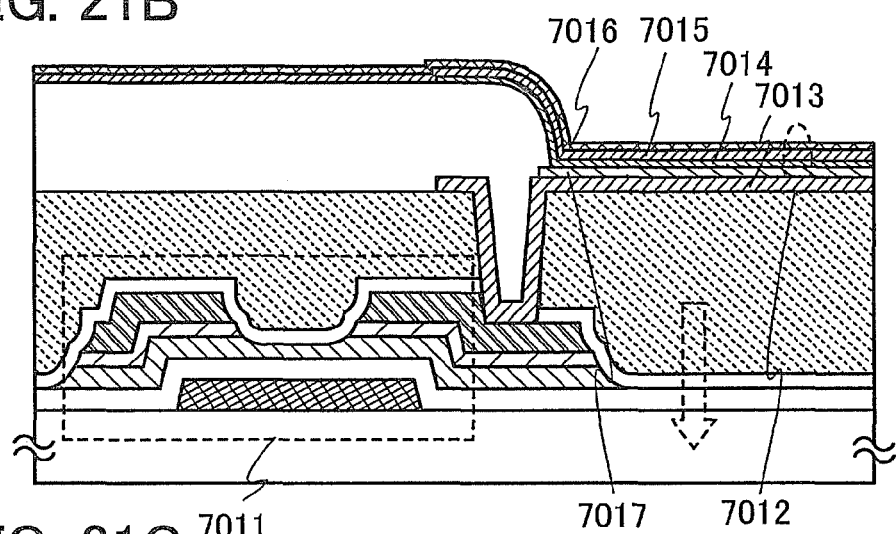
Figure 21C:
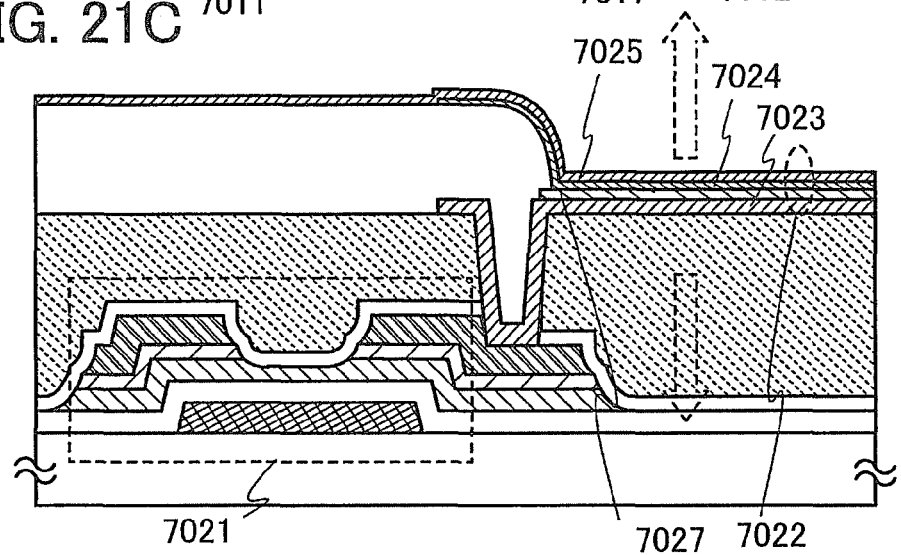

Next, structures of a light-emitting element are described with reference to FIGS. 21A to 21C. A cross-sectional structure of a pixel is described here by taking an n-channel driver TFT as an example. TFTs 7001, 7011, and 7021 serving as driver TFTs used for a semiconductor device, which are shown in FIGS. 21A, 21B, and 21C, can be manufactured in a manner similar to that of the thin film transistor described in Embodiment 3. The TFTs 7001, 7011, and 7021 are highly reliable thin film transistors each including an In—Ga—Zn—O-based non-single-crystal film as a semiconductor layer. Alternatively, the thin film transistors described in Embodiment 1 or 2 can be employed as the TFTs 7001, 7011, and 7021.

In order to extract light emitted from the light-emitting element, at least one of an anode and a cathode may be transparent. A thin film transistor and a light-emitting element are formed over a substrate. A light-emitting element can have a top-emission structure in which light emission is extracted through the surface opposite to the substrate; a bottom-emission structure in which light emission is extracted through the surface on the substrate side; or a dual-emission structure in which light emission is extracted through the surface opposite to the substrate and the surface on the substrate side. The pixel structure can be applied to a light-emitting element having any of these emission structures.

A light-emitting element having a top-emission structure is described with reference to FIG. 21A.

FIG. 21A is a cross-sectional view of a pixel in the case where the TFT 7001 serving as a driver TFT is an n-channel TFT and light generated in a light-emitting element 7002 is emitted to pass through an anode 7005. In FIG. 21A, a cathode 7003 of the light-emitting element 7002 is electrically connected to the TFT 7001 serving as a driver TFT, and a light-emitting layer 7004 and the anode 7005 are stacked in this order over the cathode 7003. The cathode 7003 can be formed using any of a variety of conductive materials as long as it has a low work function and reflects light. For example, Ca, Al, CaF, MgAg, AlLi, or the like is preferably used. The light-emitting layer 7004 may be formed using a single layer or by stacking a plurality of layers. When the light-emitting layer 7004 is formed by stacking a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive material, for example, a light-transmitting conductive film such as a film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added may be used.

The light-emitting element 7002 corresponds to a region where the cathode 7003 and the anode 7005 sandwich the light-emitting layer 7004. In the case of the pixel shown in FIG. 21A, light is emitted from the light-emitting element 7002 to the anode 7005 side as indicated by an arrow.

Next, a light-emitting element having a bottom-emission structure is described with reference to FIG. 21B. FIG. 21B is a cross-sectional view of a pixel in the case where the driver TFT 7011 is an n-channel TFT, and light generated in a light-emitting element 7012 is emitted to a cathode 7013 side. In FIG. 21B, the cathode 7013 of the light-emitting element 7012 is formed over a light-transmitting conductive film 7017 which is electrically connected to the driver TFT 7011, and a light-emitting layer 7014 and an anode 7015 are stacked in this order over the cathode 7013. When the anode 7015 has a light-transmitting property, a light-blocking film 7016 for reflecting or blocking light may be formed so as to cover the anode 7015. As in the case of FIG. 21A, the cathode 7013 can be formed using any of a variety of conductive materials as long as it has a low work function. Note that the cathode 7013 is formed to have a thickness that can transmit light (preferably, approximately 5 nm to 30 nm). For example, an aluminum film with a thickness of 20 nm can be used as the cathode 7013. As in the case of FIG. 21A, the light-emitting layer 7014 may be formed using a single layer or by stacking a plurality of layers. As in the case of FIG. 21A, the anode 7015 is not required to transmit light, but can be formed using a light-transmitting conductive material. For the light-blocking film 7016, for example, metal or the like that reflects light can be used; however, the light-blocking film 7016 is not limited to a metal film. For example, a resin or the like to which black pigment is added can be used.

The light-emitting element 7012 corresponds to a region where the cathode 7013 and the anode 7015 sandwich the light-emitting layer 7014. In the case of the pixel shown in FIG. 21B, light is emitted from the light-emitting element 7012 to the cathode 7013 side as indicated by an arrow.

Next, a light-emitting element having a dual-emission structure is described with reference to FIG. 21C. In FIG. 21C, a cathode 7023 of a light-emitting element 7022 is formed over a light-transmitting conductive film 7027 which is electrically connected to the driver TFT 7021, and a light-emitting layer 7024 and an anode 7025 are stacked in this order over the cathode 7023. As in the case of FIG. 21A, the cathode 7023 can be formed using any of a variety of conductive materials as long as it has a low work function. Note that the cathode 7023 is formed to have a thickness that can transmit light. For example, an Al film with a thickness of 20 nm can be used as the cathode 7023. As in the case of FIG. 21A, the light-emitting layer 7024 may be formed using a single layer or by stacking a plurality of layers. As in the case of FIG. 21A, the anode 7025 can be formed using a light-transmitting conductive material.

The light-emitting element 7022 corresponds to a region where the cathode 7023, the light-emitting layer 7024, and the anode 7025 overlap with each other. In the pixel shown in FIG. 21C, light is emitted from the light-emitting element 7022 to both the anode 7025 side and the cathode 7023 side as indicated by arrows.

Although an organic EL element is described here as a light-emitting element, an inorganic EL element can be alternatively provided as a light-emitting element.

Note that this embodiment describes the example in which a thin film transistor (a driver TFT) which controls the driving of a light-emitting element is electrically connected to the light-emitting element; however, a structure may be employed in which a current control TFT is connected between the driver TFT and the light-emitting element.

The semiconductor device described in this embodiment is not limited to the structures shown in FIGS. 21A to 21C, and can be modified in various ways based on the spirit of techniques disclosed in this specification.

Figure 24A:
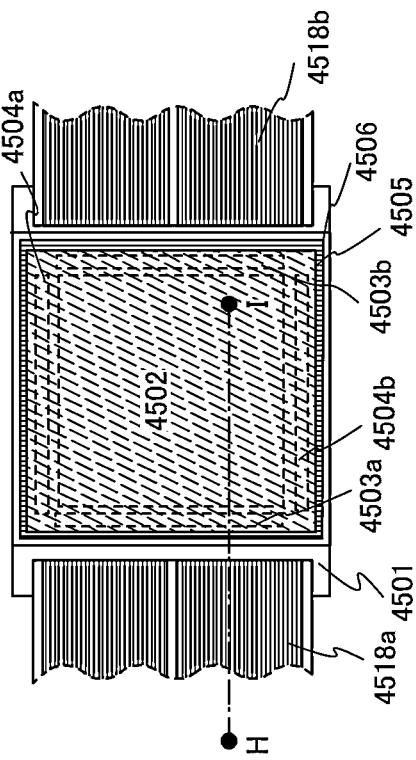
FIGS. 24A and 24B show a semiconductor device.

Next, the appearance and cross section of a light-emitting display panel (also referred to as a light-emitting panel) which corresponds to one embodiment of a semiconductor device is described with reference to FIGS. 24A and 24B. FIG. 24A is a top view of a panel in which a thin film transistor and a light-emitting element formed over a first substrate are sealed between the first substrate and a second substrate with a sealant, and FIG. 24B is a cross-sectional view taken along H-I of FIG. 24A.

A sealant 4505 is provided so as to surround a pixel portion 4502, signal-line driver circuits 4503a and 4503b, and scanning-line driver circuits 4504a and 4504b, which are provided over a first substrate 4501. In addition, a second substrate 4506 is provided over the pixel portion 4502, the signal-line driver circuits 4503a and 4503b, and the scanning-line driver circuits 4504a and 4504b. Accordingly, the pixel portion 4502, the signal-line driver circuits 4503a and 4503b, and the scanning-line driver circuits 4504a and 4504b are sealed together with filler 4507 by the first substrate 4501, the sealant 4505, and the second substrate 4506. In this manner, it is preferable that the pixel portion 4502, the signal-line driver circuits 4503a and 4503b, and the scanning-line driver circuits 4504a and 4504b be packaged (sealed) with a protective film (such as an attachment film or an ultraviolet curable resin film) or a cover material with high air-tightness and little degasification so that the pixel portion 4502, the signal-line driver circuits 4503a and 4503b, and the scanning-line driver circuits 4504a and 4504b are not exposed to external air.

Figure 24B:
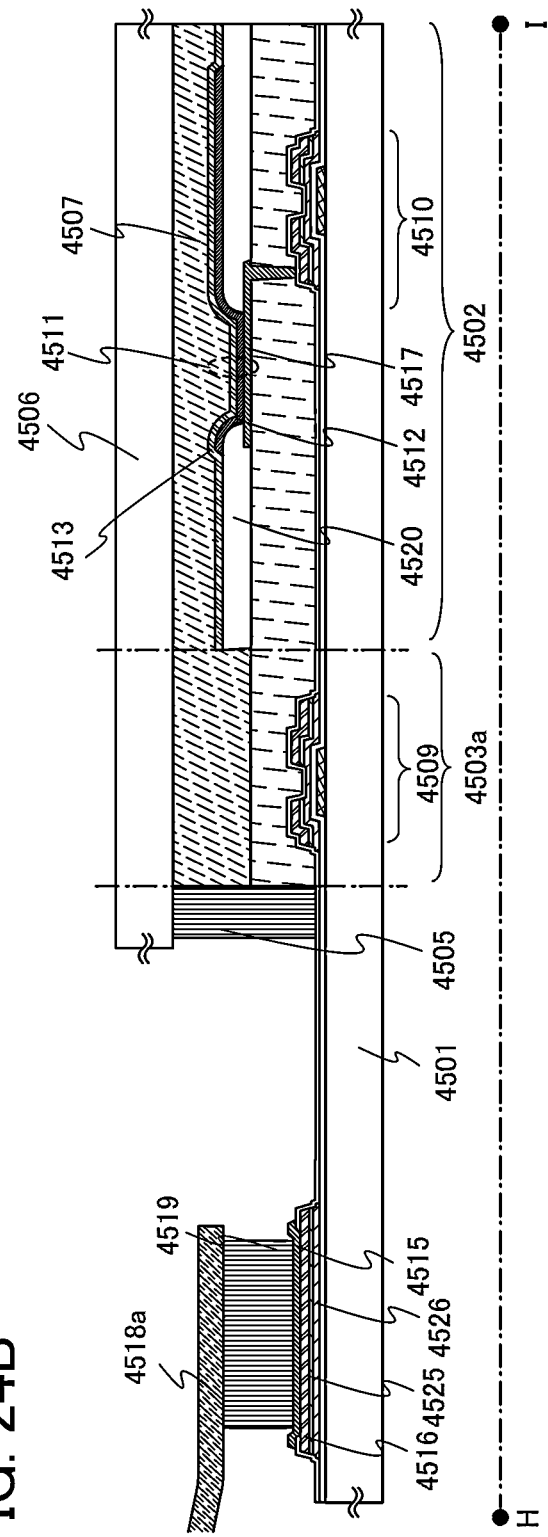

The pixel portion 4502, the signal-line driver circuits 4503a and 4503b, and the scanning-line driver circuits 4504a and 4504b provided over the first substrate 4501 each include a plurality of thin film transistors, and a thin film transistor 4510 included in the pixel portion 4502 and a thin film transistor 4509 included in the signal-line driver circuit 4503a are shown as an example in FIG. 24B.

As the thin film transistors 4509 and 4510, highly reliable thin film transistors described in Embodiment 3 including the In—Ga—Zn—O-based non-single-crystal films as semiconductor layers can be employed. Alternatively, the thin film transistors described in Embodiment 1 or 2 may be employed as the thin film transistors 4509 and 4510. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to source and drain electrode layers of the thin film transistor 4510. Note that although the light-emitting element 4511 has a stacked structure of the first electrode layer 4517, an electroluminescent layer 4512, and a second electrode layer 4513, the structure of the light-emitting element 4511 is not limited to the structure described in this embodiment. The structure of the light-emitting element 4511 can be changed as appropriate depending on a direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material to have an opening on the first electrode layer 4517 so that a sidewall of the opening is formed as a tilted surface with continuous curvature.

The electroluminescent layer 4512 may be formed using a single layer or by stacking a plurality of layers.

In order to prevent entry of oxygen, hydrogen, moisture, carbon dioxide, or the like into the light-emitting element 4511, a protective film may be formed over the second electrode layer 4513 and the partition 4520. As the protective film, a silicon nitride film, a silicon nitride oxide film, a DLC film, or the like can be formed.

In addition, a variety of signals and potentials are supplied from FPCs 4518a and 4518b to the signal-line driver circuits 4503a and 4503b, the scanning-line driver circuits 4504a and 4504b, or the pixel portion 4502.

In this embodiment, a connecting terminal electrode 4515 is formed using the same conductive film as the first electrode layer 4517 included in the light-emitting element 4511. A terminal electrode 4516 is formed using the same conductive film as the source and drain electrode layers included in the thin film transistors 4509 and 4510. Note that the connection terminal electrode 4515 and the terminal electrode 4516 are formed over an $n^+$ layer 4525 and a semiconductor layer 4526.

The connecting terminal electrode 4515 is electrically connected to a terminal included in the FPC 4518a through an anisotropic conductive film 4519.

The substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin as well as inert gas such as nitrogen or argon can be used. For example, polyvinyl chloride (PVC), acrylic, polyimide, an epoxy resin, a silicone resin, polyvinyl butyral (PVB), or ethylene vinyl acetate (EVA) can be used. In this embodiment, nitrogen is used for the filler 4507.

In addition, if needed, an optical film such as a polarizing plate, a circularly polarizing plate (including an elliptically polarizing plate), a retarder plate (a quarter-wave plate, a half-wave plate), or a color filter may be provided on an emission surface of the light-emitting element, as appropriate. Further, the polarizing plate or the circularly polarizing plate may be provided with an anti-reflection film. For example, anti-glare treatment can be performed by which reflected light is diffused in the depression/projection of the surface and glare can be reduced.

As the signal-line driver circuits 4503a and 4503b and the scanning-line driver circuits 4504a and 4504b, driver circuits formed using a single crystal semiconductor film or polycrystalline semiconductor film over a substrate separately prepared may be mounted. In addition, only the signal-line driver circuit or only part thereof, or only the scanning-line driver circuit or only part thereof may be separately formed and mounted. This embodiment is not limited to the structure shown in FIGS. 24A and 24B.

Through the above process, a highly reliable light-emitting display device (display panel) as a semiconductor device can be manufactured.

This embodiment can be implemented in combination with any of the structures described in the other embodiments, as appropriate.

Embodiment 8

A semiconductor device disclosed in this specification can be applied as electronic paper. Electronic paper can be used for electronic appliances of every field for displaying information. For example, electronic paper can be used for electronic book (e-book), posters, advertisements in vehicles such as trains, display in a variety of cards such as credit cards, and so on. Examples of such electronic appliances are shown in FIGS. 25A and 25B and FIG. 26.

Figure 25A:
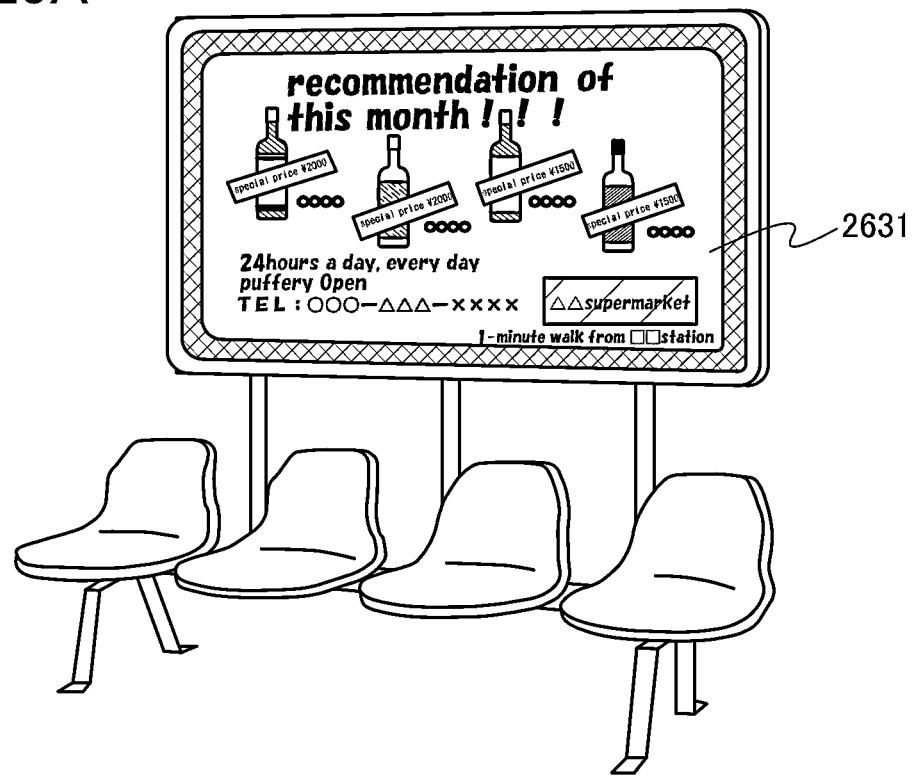
FIGS. 25A and 25B each show an example of application of electronic paper.

FIG. 25A shows a poster 2631 formed using electronic paper. If the advertizing medium is printed paper, the advertisement is replaced by manpower; however, when electronic paper disclosed in this specification is used, the advertisement display can be changed in a short time. Moreover, a stable image can be obtained without display deterioration. Note that the poster may send and receive information wirelessly.

Figure 25B:
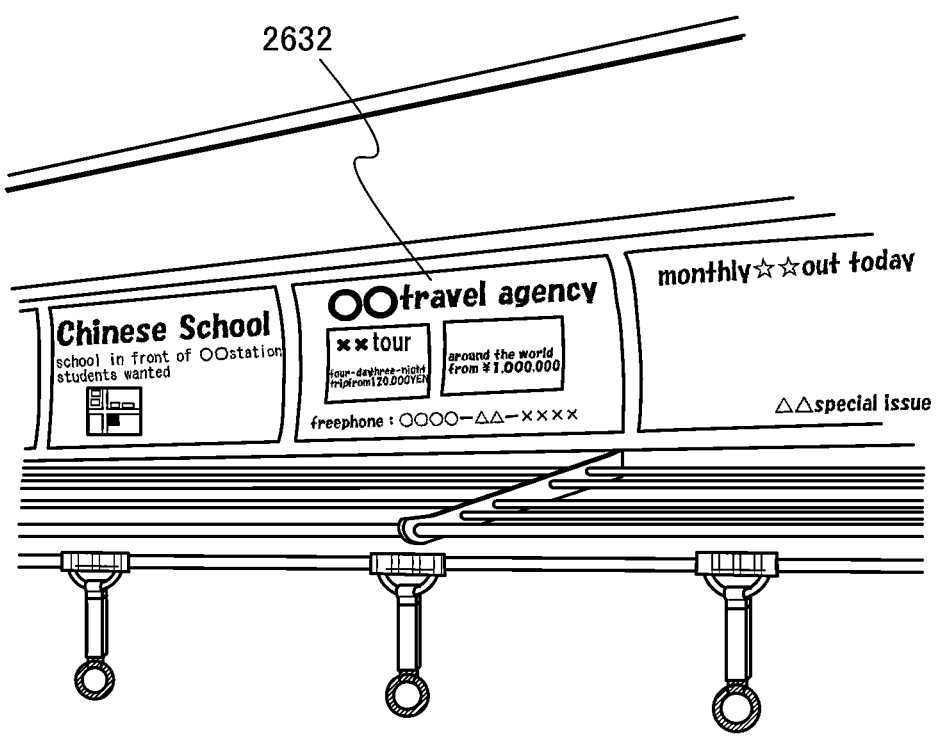

FIG. 25B shows an advertisement 2632 in a vehicle such as a train. If the advertizing medium is printed paper, the advertisement is replaced by manpower; however, when electronic paper disclosed in this specification is used, the advertisement display can be changed in a short time without much manpower. Moreover, a stable image can be obtained without display deterioration. Note that the advertisement may send and receive information wirelessly.

Figure 26:
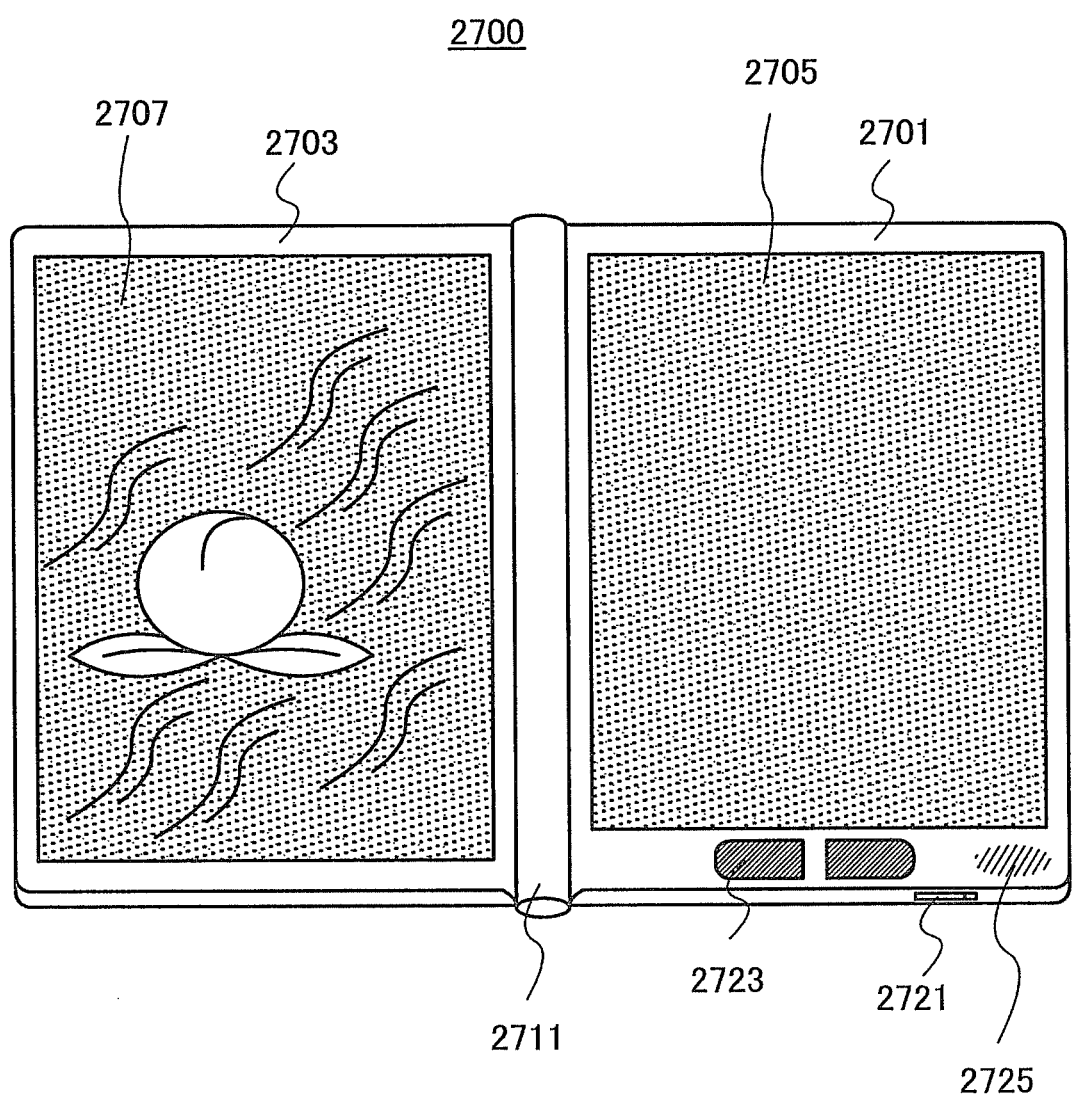
FIG. 26 is an external view showing an example of an electronic book.

FIG. 26 shows an example of an electronic book 2700. For example, the electronic book 2700 includes two chassis of a chassis 2701 and a chassis 2703. The chassis 2701 and 2703 are bound with each other by an axis portion 2711, along which the electronic book 2700 can be opened and closed. With such a structure, operation as a paper book is achieved.

A display portion 2705 is incorporated in the chassis 2701, and a display portion 2707 is incorporated in the chassis 2703. The display portions 2705 and 2707 may display a series of images, or may display different images. With the structure where different images are displayed in different display portions, for example, the right display portion (the display portion 2705 in FIG. 26) can display text, and the left display portion (the display portion 2707 in FIG. 26) can display images.

FIG. 26 shows an example in which the chassis 2701 is provided with an operation portion and the like. For example, the chassis 2701 is provided with a power supply 2721, an operation key 2723, a speaker 2725, and the like. The page can be turned with the operation key 2723. Note that a keyboard, a pointing device, and the like may be provided on the same plane as the display portion of the chassis. Further, a rear surface or a side surface of the chassis may be provided with an external connection terminal (an earphone terminal, a USB terminal, a terminal which can be connected with a variety of cables such as an AC adopter or a USB cable, and the like), a storage medium inserting portion, or the like. Moreover, the electronic book 2700 may have a function of an electronic dictionary.

Further, the electronic book 2700 may send and receive information wirelessly. Desired book data or the like can be purchased and downloaded from an electronic book server wirelessly.

Embodiment 9

A semiconductor device disclosed in this specification can be applied to a variety of electronic appliances (including game machines). As the electronic appliances, for example, there are a television device (also referred to as TV or a television receiver), a monitor for a computer or the like, a digital camera, a digital video camera, a digital photo frame, a cellular phone (also referred to as a mobile phone or a portable telephone device), a portable game machine, a portable information terminal, an audio playback device, a large game machine such as a pachinko machine, and the like.

Figure 27A:
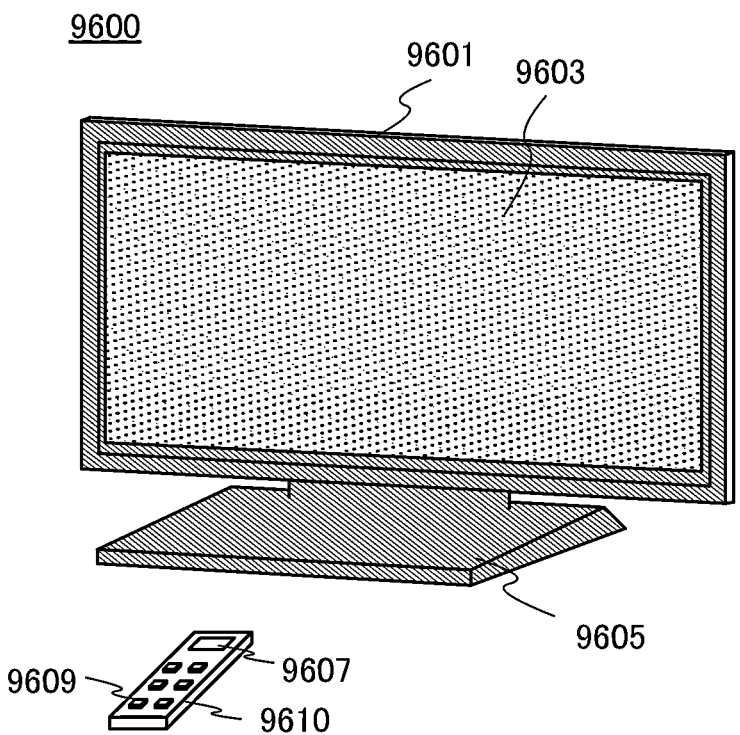
FIGS. 27A and 27B are external views showing examples of a television device and a digital photo frame, respectively.

FIG. 27A shows an example of a television device 9600. A display portion 9603 is incorporated in a chassis 9601 of the television device 9600. The display portion 9603 can display images. Here, the chassis 9601 is supported on a stand 9605.

The television device 9600 can be operated by an operation switch of the chassis 9601 or a separate remote controller 9610. The channel and volume can be controlled with operation keys 9609 of the remote controller 9610, and the images displayed in the display portion 9603 can be controlled. Moreover, the remote controller 9610 may have a display portion 9607 in which the information outgoing from the remote controller 9610 is displayed.

Note that the television device 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver, between receivers, or the like) information communication can be performed.

Figure 27B:
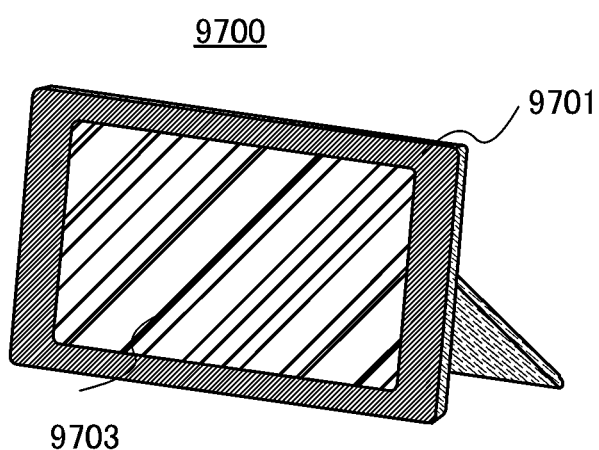

FIG. 27B shows an example of a digital photo frame 9700. For example, a display portion 9703 is incorporated in a chassis 9701 of the digital photo frame 9700. The display portion 9703 can display a variety of images. For example, image data taken by a digital camera or the like is displayed, so that the digital photo frame can function in a manner similar to that of a general picture frame.

Note that the digital photo frame 9700 is provided with an operation portion, an external connection terminal (such as a USB terminal, a terminal which can be connected to a variety of cables including a USB cable, or the like), a storage medium inserting portion, and the like. These structures may be incorporated on the same plane as the display portion; however, they are preferably provided on the side surface or rear surface of the display portion because the design is improved. For example, a memory including image data taken by a digital camera is inserted into the storage medium inserting portion of the digital photo frame and the image data is imported. Then, the imported image data can be displayed in the display portion 9703.

The digital photo frame 9700 may send and receive information wirelessly. In this case, desired image data can be wirelessly imported into the digital photo frame 9700 and can be displayed therein.

Figure 28A:
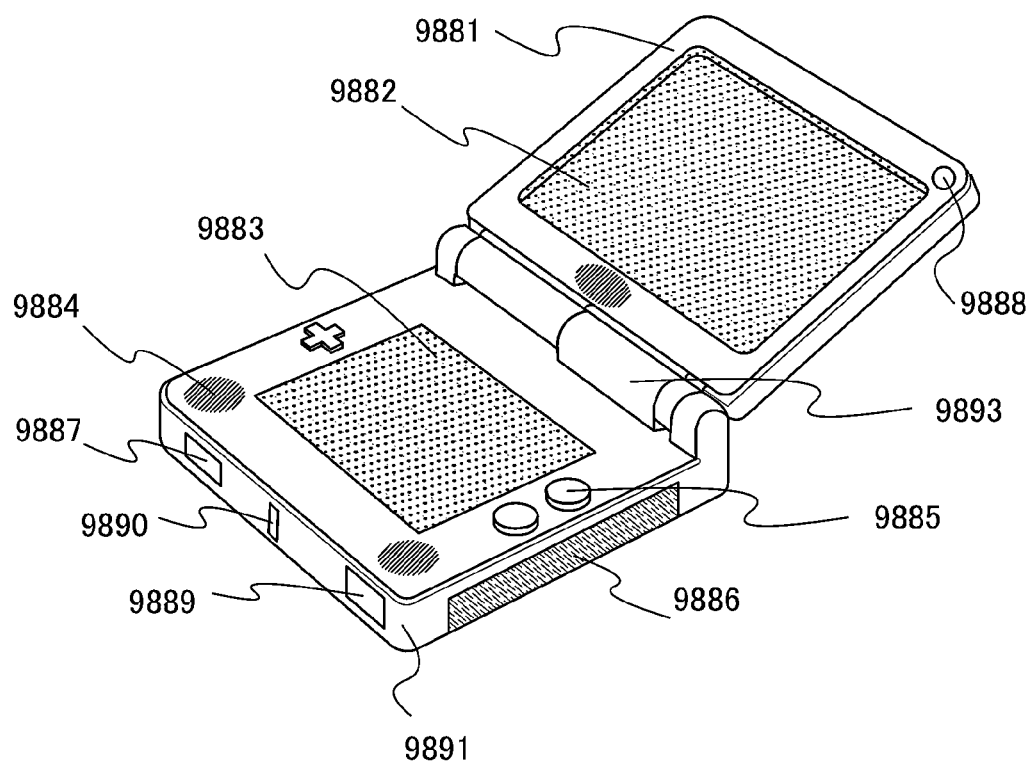
FIGS. 28A and 28B are external views showing examples of game machines.

FIG. 28A shows a portable game machine including a chassis 9881 and a chassis 9891 which are jointed with a connector 9893 so as to be able to open and close. A display portion 9882 is incorporated in the chassis 9881, and a display portion 9883 is incorporated in the chassis 9891. The portable game machine shown in FIG. 28A additionally includes a speaker portion 9884, a storage medium inserting portion 9886, an LED lamp 9890, an input means (operation keys 9885, a connection terminal 9887, a sensor 9888 (including a function of measuring force, displacement, position, speed, acceleration, angular speed, the number of rotations, distance, light, liquid, magnetism, temperature, chemical substance, sound, time, hardness, electric field, current, voltage, electric power, radiation, flow rate, humidity, tilt angle, vibration, smell, or infrared ray), and a microphone 9889), and the like. Needless to say, the structure of the portable game machine is not limited to the above, and may be any structure as long as at least a semiconductor device disclosed in this specification is provided. Moreover, another accessory may be provided as appropriate. The portable game machine shown in FIG. 28A has a function of reading out a program or data stored in a storage medium to display it on the display portion and a function of sharing information with another portable game machine by wireless communication. The functions of the portable game machine shown in FIG. 28A are not limited to these, and the portable game machine can have a variety of functions.

Figure 28B:
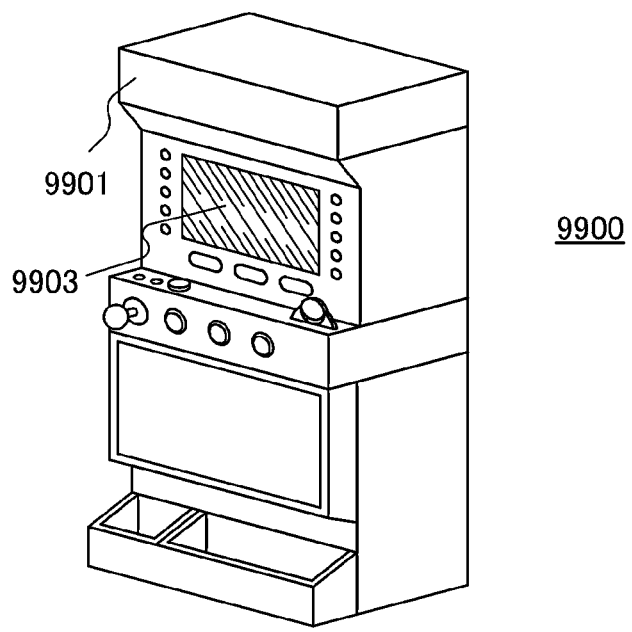

FIG. 28B shows an example of a slot machine 9900 which is a large game machine. A display portion 9903 is incorporated in a chassis 9901 of the slot machine 9900. The slot machine 9900 additionally includes an operation means such as a start lever or a stop switch, a coin slot, a speaker, and the like. Needless to say, the structure of the slot machine 9900 is not limited to the above, and may be any structure as long as at least a semiconductor device disclosed in this specification is provided. Moreover, another accessory may be provided as appropriate.

Figure 29A:
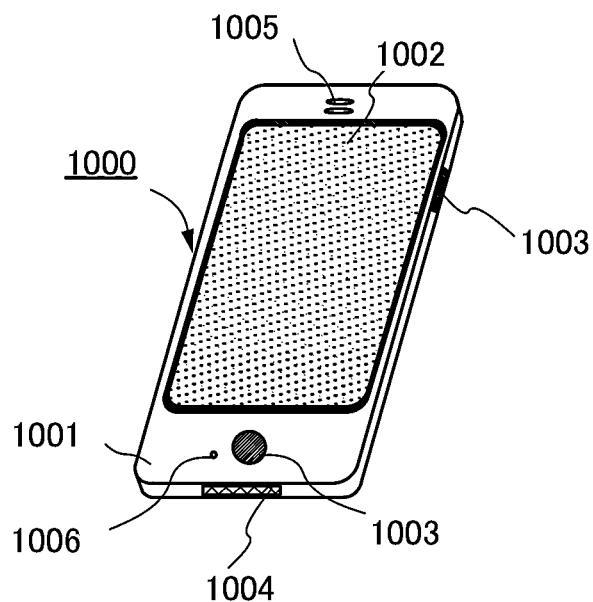
FIGS. 29A and 29B are external views showing examples of cellular phones.

FIG. 29A shows an example of a cellular phone 1000. The cellular phone 1000 includes a chassis 1001 in which a display portion 1002 is incorporated, and moreover includes an operation button 1003, an external connection port 1004, a speaker 1005, a microphone 1006, and the like.

Information can be inputted to the cellular phone 1000 shown in FIG. 29A by touching the display portion 1002 with a finger or the like. Moreover, operations such as making a phone call or texting message can be performed by touching the display portion 1002 with a finger or the like.

There are mainly three screen modes of the display portion 1002. The first mode is a display mode mainly for displaying an image. The second mode is an input mode mainly for inputting information such as text. The third mode is a display-and-input mode in which two modes of the display mode and the input mode are mixed.

For example, in the case of making a phone call or texting message, the display portion 1002 is set to a text input mode where text input is mainly performed, and text input operation can be performed on a screen. In this case, it is preferable to display a keyboard or number buttons on almost the entire screen of the display portion 1002.

When a detection device including a sensor for detecting inclination, such as a gyroscope or an acceleration sensor, is provided inside the cellular phone 1000, display in the screen of the display portion 1002 can be automatically switched by judging the direction of the cellular phone 1000 (whether the cellular phone 1000 is placed horizontally or vertically for a landscape mode or a portrait mode).

Further, the screen modes are switched by touching the display portion 1002 or operating the operation button 1003 of the chassis 1001. Alternatively, the screen modes can be switched depending on kinds of image displayed in the display portion 1002. For example, when a signal for an image displayed in the display portion is data of moving images, the screen mode is switched to the display mode. When the signal is text data, the screen mode is switched to the input mode.

Moreover, in the input mode, when input by touching the display portion 1002 is not performed within a specified period while a signal detected by an optical sensor in the display portion 1002 is detected, the screen mode may be controlled so as to be switched from the input mode to the display mode.

The display portion 1002 can also function as an image sensor. For example, an image of a palm print, a fingerprint, or the like is taken by touching the display portion 1002 with the palm or the finger, whereby personal authentication can be performed. Moreover, when a backlight which emits near-infrared light or a sensing light source which emits near-infrared light is provided in the display portion, a finger vein, a palm vein, or the like can be taken.

Figure 29B:
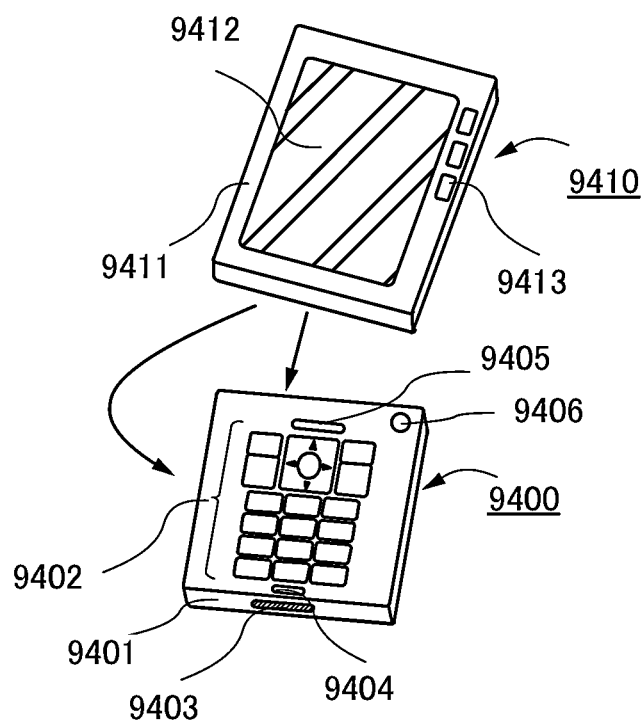

FIG. 29B shows an example of a cellular phone as well. The cellular phone in FIG. 29B includes a display device 9410 having, in a chassis 9411, a display portion 9412 and operation buttons 9413, and a communication device 9400 having, in a chassis 9401, operation buttons 9402, an external input terminal 9403, a microphone 9404, a speaker 9405, and a light-emitting portion 9406 which emits light when a phone call is received. The display device 9410 having a display function can be detached from or attached to the communication device 9400 having a phone function in the two directions indicated by arrows. Accordingly, the display device 9410 and the communication device 9400 can be attached to each other along respective short axes or long axes. Alternatively, in the case where only the display function is needed, the display device 9410 is detached from the communication device 9400, and then the display device 9410 can be used alone. Images or input information can be transmitted and received by wireless or wire communication between the communication device 9400 and the display device 9410, each of which includes a chargeable battery.

This application is based on Japanese Patent Application serial No. 2008-274520 filed with Japan Patent Office on Oct. 24, 2008, the entire contents of which are hereby incorporated by reference.

What is claimed is:

1. A method for manufacturing a semiconductor device, comprising:

forming a gate electrode layer over a substrate having an insulating surface;

stacking a gate insulating layer, an oxide semiconductor film, and a conductive film over the gate electrode layer;

forming a first mask layer over the gate insulating layer, the oxide semiconductor film, and the conductive film;

performing a first etching with the first mask layer to etch the oxide semiconductor film and the conductive film so that an oxide semiconductor layer and a conductive layer are formed;

forming a second mask layer by ashing the first mask layer; and performing a second etching with the second mask layer to etch the oxide semiconductor layer and the conductive layer so that an oxide semiconductor layer having a depression, a source electrode layer, and a drain electrode layer are formed, wherein the first mask layer is formed using a light-exposure mask, wherein the first etching is dry etching with use of an etching gas, wherein the second etching is wet etching with use of an etchant, wherein the oxide semiconductor layer having the depression includes a region with a smaller thickness than a region overlapping with the source electrode layer or the drain electrode layer, wherein each of the source electrode layer and the drain electrode layer including an inner edge opposed to each other, wherein the oxide semiconductor layer having the depression comprises a first region overlapping with the inner edge of the source electrode layer, a second region overlapping with the inner edge of the drain electrode layer, and a third region between the first region and the second region, wherein the third region comprises a slanted surface adjacent to one of the inner edges of the source electrode layer and the drain electrode layer, and wherein a taper angle of the slanted surface is smaller than one of taper angles of the inner edges of the source electrode layer and the drain electrode layer.

2. The method for manufacturing a semiconductor device according to claim 1, wherein the oxide semiconductor film includes indium, gallium, and zinc.

3. The method for manufacturing a semiconductor device according to claim 1, wherein the etching gas includes chlorine.

4. The method for manufacturing a semiconductor device according to claim 3, wherein the etching gas further includes oxygen.

5. The method for manufacturing a semiconductor device according to claim 1, wherein an ammonia hydrogen peroxide mixture is used as the etchant in the second etching.

6. The method for manufacturing a semiconductor device according to claim 1, wherein a half-tone mask or a gray-tone mask is used as the light-exposure mask.

7. A method for manufacturing a semiconductor device, comprising:

forming a gate electrode layer over a substrate having an insulating surface;

stacking a gate insulating layer, a first oxide semiconductor film, a second oxide semiconductor film, and a conductive film over the gate electrode layer;

forming a first mask layer over the gate insulating layer, the first oxide semiconductor film, the second oxide semiconductor film, and the conductive film;

performing a first etching with the first mask layer to etch the first oxide semiconductor film, the second oxide semiconductor film, and the conductive film so that a first oxide semiconductor layer, a second oxide semiconductor layer, and a conductive layer are formed;

forming a second mask layer by ashing the first mask layer; and performing a second etching with the second mask layer to etch the first oxide semiconductor layer, the second oxide semiconductor layer, and the conductive layer so that an oxide semiconductor layer having a depression, a source region, a drain region, a source electrode layer, and a drain electrode layer are formed, wherein the first mask layer is formed using a light-exposure mask, wherein the first etching is dry etching with use of an etching gas, wherein the second etching is wet etching with use of an etchant, wherein the oxide semiconductor layer having the depression includes a region with a smaller thickness than a region overlapping with the source region or the drain region, wherein each of the source electrode layer and the drain electrode layer including an inner edge opposed to each other, wherein the oxide semiconductor layer having the depression comprises a first region overlapping with the inner edge of the source electrode layer, a second region overlapping with the inner edge of the drain electrode layer, and a third region between the first region and the second region, wherein the third region comprises a slanted surface adjacent to one of the inner edges of the source electrode layer and the drain electrode layer, and wherein a taper angle of the slanted surface is smaller than one of taper angles of the inner edges of the source electrode layer and the drain electrode layer.

8. The method for manufacturing a semiconductor device according to claim 7, wherein each of the first oxide semiconductor film and the second oxide semiconductor film includes indium, gallium, and zinc.

9. The method for manufacturing a semiconductor device according to claim 7, wherein the first oxide semiconductor film has lower electrical conductivity than the second oxide semiconductor film.

10. The method for manufacturing a semiconductor device according to claim 7, wherein the etching gas includes chlorine.

11. The method for manufacturing a semiconductor device according to claim 10, wherein the etching gas further includes oxygen.

12. The method for manufacturing a semiconductor device according to claim 7, wherein an ammonia hydrogen peroxide mixture is used as the etchant in the second etching.

13. The method for manufacturing a semiconductor device according to claim 7, wherein the conductive layer is etched using an ammonia hydrogen peroxide mixture as the etchant and the first oxide semiconductor layer and the second oxide semiconductor layer are etched using a mixed solution of phosphoric acid, acetic acid, and nitric acid as the etchant in the second etching.

14. The method for manufacturing a semiconductor device according to claim 7, wherein a half-tone mask or a gray-tone mask is used as the light-exposure mask.

* * * * *